US 6,555,422 B1

(12) United States Patent
Yamazaki et al.

(10) Patent No.: US 6,555,422 B1
(45) Date of Patent: Apr. 29, 2003

(54) THIN FILM TRANSISTOR AND METHOD OF MANUFACTURING THE SAME

(75) Inventors: Shunpei Yamazaki, Tokyo (JP); Jun Koyama, Kanagawa (JP); Keisuke Hayashi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/347,820

(22) Filed: Jul. 2, 1999

(30) Foreign Application Priority Data

Jul. 7, 1998 (JP) .......................... 10-192116
Jul. 31, 1998 (JP) .......................... 10-218380

(51) Int. Cl.[7] ............................ H01L 21/00
(52) U.S. Cl. ...................... 438/166; 438/487
(58) Field of Search ................. 438/166, 486, 438/487, 482, 662, FOR 333, FOR 334, 795

(56) References Cited

U.S. PATENT DOCUMENTS

| 5,619,044 A | * | 4/1997 | Makita .................. 257/64 |
| 5,648,277 A | | 7/1997 | Zhang et al. ............ 437/21 |
| 5,869,803 A | * | 2/1999 | Noguchi ............ 219/121.62 |
| 5,946,562 A | * | 8/1999 | Kuo .................... 438/166 |
| 5,970,369 A | * | 10/1999 | Hara ................... 438/488 |
| 6,071,765 A | * | 6/2000 | Noguchi .............. 438/166 |
| 6,204,099 B1 | * | 3/2001 | Kusumoto ............. 438/151 |

FOREIGN PATENT DOCUMENTS

JP        7-135318        5/1995

OTHER PUBLICATIONS

Marc Stehl, "Excimer laser treatment for large surface", Journal of Non-Crystalline Solids, vol. 218, 1997, pp. 218-222.

* cited by examiner

Primary Examiner—Mary Wilczewski
(74) Attorney, Agent, or Firm—Eric J. Robinson; Robinson Intellectual Property Law Office, P.C.

(57) ABSTRACT

A semiconductor film having a uniform film quality is formed through: the first step of forming a semiconductor film on a substrate; the second step of irradiating onto a part of the semiconductor film one shot or plural shots of laser light of 5 J or more in total energy and 100 nsec or more in pulse width to form a highly crystallized semiconductor film; and the third step of repeatedly performing the second step on a part of the semiconductor film different from the part of the second step while shifting relative positions of the semiconductor film and the laser light to each other. A thin film transistor using this semiconductor film as an active layer has an enhanced characteristic without variations.

60 Claims, 38 Drawing Sheets

Laser Light Irradiation 3012  3014  3011  3015  3013

3017      3018     3016            3019

3020        3021            3022

TFT          Gate-contacted portion

THIN FILM TRANSISTOR AND METHOD OF MANUFACTURING THE SAME

BACKGROUND OF THE INVENTION

1. Field of the Invention

The present invention relates to a method of polycrystallizing an amorphous silicon film by using a laser light, and to a method of improving crystallinity of polycrystalline silicon film by using a laser light. Also, the present invention relates to a thin film transistor using as an active layer the polycrystalline silicon film obtained by these methods, and to a semiconductor device using the thin film transistor.

2. Description of Related Art

In recent years, researches have been enthusiastically promoted on lowering temperature in manufacturing process of a semiconductor device, in particular, a thin film transistor (hereinafter, referred to as TFT). The main reason for this is that a need for forming a TFT on an insulating substrate such as glass which is inexpensive and is rich in processibility has been arisen. Also from the view point of aiming at a further minute device and a further multi-layered device, the lowering temperature in manufacturing process of a TFT is required.

In a manufacturing process of a high-performance TFT, a step is necessary of crystallizing an amorphous component in a semiconductor material, or an amorphous semiconductor material. For such a purpose, thermal annealing has conventionally been employed. When silicon is used as a semiconductor material, an amorphous component is crystallized by annealing at a temperature of 600° C. to 1100° C. for 0.1 to 48 hours, or for more than 48 hours.

Such thermal annealing as the above takes shorter processing time as the temperature rises higher. However, it is almost utterly ineffective when the temperature is 500° C. or lower. Accordingly, from the view point of lowering temperature in manufacturing process, it is necessary to replace the thermal annealing step with other measures. When a glass substrate is used as a substrate in particular, since the heat resistant temperature of the glass substrate is about 600° C., measures comparable to the above thermal annealing has been required when the temperature is lower than the heat resistant temperature.

As a way to fulfill the requirement mentioned above, polycrystallization of an amorphous component through irradiation of a semiconductor material with a laser light has recently attracted attention. Thermal annealing by irradiation of laser light can apply high energy comparable to the thermal annealing restrictedly to a desired portion, and hence has an advantage that not an entire substrate needs to be subjected to the heat of high temperature.

As to irradiation of laser light, approximately two methods have been proposed.

The first method uses continuous-wave laser and is a method of irradiating a beam like a spotlight to a semiconductor material. This is a method of polycrystallizing the semiconductor material utilizing the fact that the semiconductor material are slowly solidified after it is melted owing to difference in energy distribution within a beam and moving of the beam.

The second method is one that utilizes the fact that a crystal growth proceeds when a semiconductor material is instantaneously melted and is solidified by irradiating a laser pulse of large energy onto the semiconductor substrate using a pulse-generating laser apparatus such as an excimer laser apparatus.

A problem in the first method is that the process takes much time. This is because the size of the beam spot is several mm square at most, for having limitations in the maximum energy of the continuous-wave laser.

The second method makes a trial for employing a way to "scan" relatively to the substrate with a laser light the shape of which is changed into a linear one and which has a length longer than the substrate to be processed. With employment of such a way, the throughput can be significantly improved. The term "scan" here means to irradiate linear laser lights so as to overlap a little with one another.

However, the above technique of irradiating linear pulse laser lights so as to overlap a little with one another will generate linear stripes on the surface of the semiconductor material irradiated with laser. These stripes considerably affects a device formed on the semiconductor material, or a device to be formed later. Particularly, when a plurality of elements are formed on the substrate and every element has to have a uniform characteristic, the stripes become a serious problem. In such a case, the characteristic is uniform in each stripe pattern, but varies between the stripes that are different from each other.

In this way, uniformity in irradiation effect matters even in the annealing method using linear laser lights. High uniformity here designates that similar device characteristics is observed in a device formed in any portion on the substrate. To enhance uniformity means that crystallinity of a semiconductor material is unified.

Then, an excimer laser of large output has been developed lately, which is capable of annealing a large area with a single shot. When using this excimer laser of large output, amorphous silicon in a large area may be polycrystallized all at once. It has been proved that also the film quality of the polycrystallized silicon film is uniform to a certain degree within the plane.

Here, as a conventional example, a schematic top view illustrating a case where this excimer laser of large output is used in manufacturing an active matrix type liquid crystal display device is shown in FIG. 39.

In FIG. 39, reference numeral 3500 denotes a substrate; 3501 and 3505, active matrix circuits; 3502 and 3506, source driver circuits; 3503, 3504, 3507 and 3508, gate driver circuits. Reference numerals 3509 to 3512 denote irradiated regions with excimer laser light of large output, and an amorphous silicon film in the respective regions is polycrystallized with one shot or plural shots of the laser light. Thus, in this conventional example, the laser light is irradiated onto all the amorphous silicon films on the entire substrate by three times shifting, relatively to the substrate, of the laser light. It should be noted that although laser light irradiation regions 3509 to 3512 are shown in a pattern different from each other, for convenience's sake in description, the same laser light is irradiated onto these regions.

It is readily understood here that irradiation of the laser light is carried out plural times onto repeatedly laser light irradiation regions, which are denoted by reference numerals 3513 to 3517. For instance, laser light is irradiated twice or more onto the region 3513, and four or more times onto the region 3517. It has been found that characteristic of polycrystalline silicon film is different when the number of irradiation time of the laser light is different, and therefore in such a conventional example, variation in characteristic of the polycrystalline silicon film is generated within the substrate surface. In this conventional example, the uniformity within the plane of the polycrystalline silicon film is thus cannot be obtained even when using the excimer laser of large output. As a result, though the throughput may be increased as compared to the case using a linear laser, problems are still remained as to the uniformity within the plane of polycrystalline silicon.

SUMMARY OF THE INVENTION

The present invention has been made in view of the above, and therefore an object of the invention is to provide a method of manufacturing a thin film transistor, in which when polycrystallizing an amorphous semiconductor film using a laser light, or when crystallinity of a semiconductor film is improved using a laser light, uniformity in the polycrystalline silicon film used for a thin film transistor in the substrate surface is realized to prevent variations in characteristic of the thin film transistor that uses the polycrystalline silicon film as an active layer and to enhance the throughput. Also, it is an object of the present invention to provide a high-performance semiconductor device using a thin film transistor fabricated by the manufacturing method.

In order to attain the above objects, reference is made to FIG. 1. FIG. 1 shows laser light irradiation regions when polycrystallizing an amorphous semiconductor film using excimer laser of large output in accordance with the present invention. In FIG. 1, as an example of a semiconductor device using a thin film transistor fabricated by a method of the present invention, a liquid crystal display device of active matrix is shown. It is to be noted that in this specification, although description is made of a case where silicon is used as an amorphous semiconductor film, the amorphous semiconductor film to be used is not limited to this but a film of an amorphous silicon germanium or the like may be used.

Reference numeral 100 denotes a substrate; 101 and 105, active matrix circuits; 102 and 106, source driver circuits; 103, 104, 107 and 108, gate driver circuits. In the method shown in FIG. 1, two active matrix substrates for an active matrix type liquid crystal display device can be obtained.

Reference numeral 109 to 112 denote laser light irradiation regions, and an amorphous silicon film in the respective regions is polycrystallized with one shot or plural shots of the laser light. Distances (gaps) denoted by "$A_1$" and "$B_1$" are distances (gaps) between the adjacent laser light irradiation regions, respectively. Also, reference numeral 113 denotes a laser light non-irradiation region to which the laser light is not irradiated.

As a process, the amorphous silicon film is irradiated with a laser light to be polycrystallized and is patterned, and, thereafter, the active matrix circuits, source driver circuits and gate driver circuits are formed. However, here for convenience's sake in description, the laser light irradiation regions, and the active matrix circuits, source driver circuits and gate driver circuits which are to be formed later are shown in the same drawing.

In the method of polycrystallizing an amorphous silicon film according to the present invention, as shown in FIG. 1, laser light irradiation regions of large output do not overlap with one another. Different distances (gaps) "$A_1$" and "$B_1$" between different laser light irradiation regions are determined depending on a pixel pitch of the active matrix circuit or dimension of a TFT, dimension of a TFT of the driver circuit or the like, respectively. The circuits are designed so that regions defined by different distances (gaps) "$A_1$" and "$B_1$" between different laser light irradiation regions, in other words, regions to which the laser light is not irradiated (the laser light non-irradiation region 113) do not form active layers of thin film transistors constituting the active matrix circuit, driver circuit and other peripheral circuits.

In FIG. 1, portions denoted by $\alpha_1$ and $\beta_1$ are the active matrix circuit and source driver circuit, respectively, and $\alpha_1$ and $\beta_1$ represent portions including boundaries between a laser light irradiation region and laser light non-irradiation region. FIG. 10 is an enlarged view of the portion $\alpha_1$ and FIG. 11 is an enlarged view of the portion $\beta_1$.

In FIG. 10, reference numeral 1001 denotes an active layer of a pixel TFT made of polycrystalline silicon, 1002 denotes first wirings and 1003 denotes second wirings. The first wirings 1002 function as the gate electrodes of the active layers in thin film transistors. It is to be noted that for convenience's sake in description, pixel electrodes, interlayer insulating films or the like are omitted. $P_X$ is a pixel pitch in a direction of the X axis (row) and $P_Y$ is a pixel pitch in a direction of the Y axis (column). $S_X$ is the length of the active layer in a direction of the X axis and $S_Y$ is the length of the active layer in a direction of the Y axis. It is to be noted that in FIG. 10, triple gate type TFTs are used for the pixel TFTs, but single gate TFTs, double gate TFTs or TFTs other than these may be used. In any case, the length of the active layer in a direction of the X axis is designated by $S_X$, and the length of the active layer in a direction of the Y axis is designated by $S_Y$. Portions painted out with black in the drawing illustrate portions in each of which the active layers and the second wiring layers, or the first wirings and the second wiring layers are brought into contact (are connected) with each other. What denoted by 1004 which are parts of the first wirings 1002 are formed to ensure the flatness between the wirings and the active layers.

It can be understood from FIG. 10 that the active layer of the thin film transistor does not enter into the laser light non-irradiation region 113. In other words, the active layer does not present in the laser light non-irradiation region 113 which is defined by distance (gap) "$A_1$" (and distance "$B_1$") between the laser light irradiation region 111 and the laser light irradiation region 112. Therefore, it can be understood that the laser light non-irradiation region 113, i.e., a region that is not polycrystallized is not used as the active layer of the thin film transistor. When expressing this condition with $P_X$, $S_X$ and $A_1$, the following is established:

$$P_X - S_X > A_1$$

Next, reference is made to FIG. 11. In the enlarged view of the portion $\beta_1$ in FIG. 11, there is shown an inverter circuit within the source driver circuit 106. Reference numerals 1101 and 1102 denote the active layers of the thin film transistors made of polycrystalline silicon, and to the source region and drain region of each active layer, N type impurities and P type impurities are added. Reference numerals 1103 and 1104 denote first wirings and the wiring 1103 functions as a gate electrode of the active layer in the thin film transistor. A second wiring is denoted by 1105. Also in here, an interlayer insulating film or the like is omitted for convenience's sake in description. Portions painted out with black in the drawing illustrate portions in each of which the active layer and the second wiring layer, or the first wiring and the second wiring layer are brought into contact (are connected) with each other.

It can be understood from FIG. 11 that the active layers 1101 and 1102 do not enter into the laser light non-irradiation region 113. In other words, the active layers 1101 and 1102 do not present in the laser light non-irradiation region 113 which is defined by distance (gap) "$A_1$" (and distance "$B_1$") between the laser light irradiation region 111 and the laser light irradiation region 112. Therefore, it can be understood that the laser light non-irradiation region 113, i.e., a region that is not polycrystallized is not used again here as the active layers 1101 and 1102.

With employment of the above method using the laser light, improving crystallinity of a semiconductor film may also be possible. In this case also, film quality of a semiconductor film after irradiation with laser light is different between the laser light irradiation region and the laser light non-irradiation region. This is because crystallinity of the semiconductor film is improved by irradiating a laser light to the semiconductor film, thereby improving film quality. It is to be noted that all the methods using laser light which will be described hereinbelow may be adapted for improving crystallinity of this semiconductor film. Also, another method of the present invention to be described below can be adapted for improving crystallinity.

In this specification, a semiconductor film that is the subject of the irradiation with laser light may sometimes called an "initial semiconductor film". This "initial semiconductor film" refers to as an "amorphous semiconductor film or amorphous semiconductor film partially including a crystalline component", if it is before crystallization, and if before improving crystallinity, as a "crystalline semiconductor film or crystalline semiconductor film partially including an amorphous component". Further, the term "highly crystallized semiconductor film" may be used in this specification. This "highly crystallized semiconductor film" designates a "film with improved crystallinity or semiconductor film with reduced defect in grain".

Next, reference is made to FIG. 2. FIG. 2 shows laser light irradiation regions when polycrystallizing an amorphous silicon film using excimer laser of large output in accordance with the present invention. FIG. 2 shows a liquid crystal display device of active matrix type as an example of a semiconductor device having a thin film transistor that uses a polycrystalline silicon film manufactured by the method of the present invention.

Reference numeral 200 denotes a substrate; 201, an active matrix circuit; 202 and 203, source driver circuits; 204 and 205, gate driver circuits. Reference numerals 206 to 209 denote laser light irradiation regions, and an amorphous silicon film in the respective regions is polycrystallized with one shot or plural shots of the laser light. Distances denoted by "$A_2$" and "$B_2$" are distances between the adjacent laser light irradiation regions, respectively. Reference numeral 210 denotes a laser light non-irradiation region to which the laser light is not irradiated. In FIG. 2, one active matrix circuit of an active matrix type liquid crystal display device is manufactured from the substrate 200.

As a process, the amorphous silicon film is irradiated with a laser light to be polycrystallized and is patterned, and, thereafter, the active matrix circuit, source driver circuits and gate driver circuits are formed. However in FIG. 2, for convenience's sake in description as in FIG. 1, the laser light irradiation regions, and the active matrix circuit, source driver circuits and gate driver circuits are shown in the same drawing.

In the method of polycrystallizing an amorphous silicon film according to the present invention, as shown in FIG. 2, laser light irradiation regions of large output do not overlap with one another. Distances (gaps) "$A_2$" and "$B_2$" between laser light irradiation regions are determined depending on a pixel pitch of the active matrix circuit or dimension of a pixel TFT, dimension of a TFT of the driver circuit or the like, respectively. The circuit is designed so that regions defined by distances (gaps) "$A_2$" and "$B_2$" between laser light irradiation regions, in other words, regions to which the laser light is not irradiated (the laser light non-irradiation region 210) do not form an active layer of thin film transistor.

In FIG. 2, portions denoted by $\alpha_2$, $\beta_2$ and $\gamma_2$ are the active matrix circuit, source driver circuit and gate driver circuit, respectively, and $\alpha_2$, $\beta_2$ and $\gamma_2$ represent portions including boundaries between a laser light irradiation region and laser light non-irradiation region. FIG. 12 is an enlarged view of the portion $\gamma_2$. As to the portions denoted by $\alpha_2$ and $\beta_2$, since they are the same as the portions $\alpha_1$ and $\beta_1$ mentioned above, please refer the description on those.

Reference is made to FIG. 12. Shown in FIG. 12 is a buffer circuit in a gate driver circuit 204. Reference numerals 1201 and 1202 denote the active layers of the thin film transistors made of polycrystalline silicon, and to the source region and drain region of each of the active layers 1201 and 1202, impurities for giving P type and impurities for giving N type are added. Reference numerals 1203 and 1204 denote first wirings and 1205 denotes second wirings. The first wirings 1203 function as the gate electrodes of the thin film transistors. Also in here, an interlayer insulating film or the like is omitted for convenience's sake in description. Portions painted out with black in the drawing illustrate, as in FIGS. 9 and 10, portions in each of which the active layers and the second wirings, or the first wirings and the second wirings are brought into contact (are connected) with each other.

It can be understood from FIG. 12 that the active layers 1201 and 1202 do not enter into the laser light non-irradiation region 210. In other words, the active layers 1201 and 1202 do not present in the not-irradiated region 210 with laser light which is defined by the interval "$B_2$" (and interval "$A_2$") between the laser light irradiation region 206 and the laser light irradiation region 208. Therefore, it can be understood that the laser light non-irradiation region 210, i.e., a region that is not polycrystallized is not used as the active layer.

Now, supplementary description will be made on the portion $\alpha_2$ in FIG. 2. In the active matrix circuit shown in FIG. 2, a pixel pitch in a direction of the X axis (row) is given as $P_X$; a pixel pitch in a direction of the Y axis (column) as $P_Y$; the length of the active layer in a direction of the X axis as $S_X$; and the length of the active layer in a direction of the Y axis as $S_Y$. In this case, when expressing conditions that fulfill the method of the present invention with $P_X$, $S_X$, $A_2$ and $B_2$, the following are established:

$$P_X - S_X > A_2$$

$$P_Y - S_Y > B_2$$

Therefore, in the method of polycrystallizing an amorphous silicon film in accordance with present invention, a laser light non-irradiation region is not used for the active layer of a thin film transistor that constitutes an active matrix circuit, source driver circuit, gate driver circuit or other peripheral circuit. Accordingly, only a semiconductor film that has a uniform characteristic is used for the active layer of a thin film transistor.

Next, reference is made to FIG. 3. FIG. 3 illustrates one of systems for polycrystallizing an amorphous silicon film of the present invention shown in FIG. 1. As to parts in FIG. 3 which uses the same reference numerals as that of FIG. 1, please refer the description of FIG. 1.

In FIG. 3, reference numeral 301 denotes an amorphous silicon film formed on a substrate. Reference numeral 302 denotes a laser light of large output, and a laser body and an optical system are omitted for convenience's sake in description of the drawing. An excimer laser of large output is suitable for the laser body. Reference numeral 303 denotes a polycrystalline silicon film and the drawing illustrates a state in which an amorphous silicon in the region irradiated with the laser light is polycrystallized. Reference numeral 304 denotes a stage, on which the substrate 100 is set. The stage 304 is moved by a control device 305 for stage X position and a control device 306 for stage Y position. A margin for error of stop position of the stage 304 is about 0.04 µm. By moving the stage 304, laser light irradiation region 302 may be controlled with high accuracy.

Alternatively, laser light irradiation position may be arranged to be movable and the X position and Y position of laser light may be controlled since it is sufficient that the laser light 302 and the substrate 100 are moved relatively to each other. Further, both laser light and substrate (i.e., stage) may be movable in position.

In the case shown in FIG. 3, the stage 304 shifts its position three times to polycrystallize substantially the entire surface of the amorphous silicon film 301 formed on the substrate 100. As mentioned in the description of FIG. 1, laser light is irradiated while spacing out the film by the distances (gaps) "$A_1$" and "$B_1$", which causes a region that is not irradiated with laser light.

Subsequently, reference is made to FIG. 4. FIG. 4 illustrates one of systems for polycrystallizing an amorphous silicon film of the present invention shown in FIG. 1. Difference between this system and the system shown in FIG. 3 resides in a point that the area of a laser light 401 introduced by a laser optical system is widened toward traveling direction of the laser light. In this case also, a polycrystalline silicon film where inequality within the plane is suppressed as possible can be obtained by controlling with high accuracy the relative positions of the stage and the laser light.

Reference is then made to FIG. 5. FIG. 5 illustrates one of systems for polycrystallizing an amorphous silicon film of the present invention shown in FIG. 1. Difference between this system and the system shown in FIG. 4 resides in a point that the area of a laser light 501 introduced by a laser optical system is narrowed toward traveling direction of the laser light. In this case also, a polycrystalline silicon film where inequality within the plane is suppressed as possible can be obtained by controlling with high accuracy the relative positions of the stage and the laser light.

Next, reference is made to FIG. 6. FIG. 6 illustrates one of systems for polycrystallizing an amorphous silicon film of the present invention shown in FIG. 1. Difference between this system and the system shown in FIG. 1 resides in to control the area of the laser light irradiated to an amorphous silicon film by guiding through a slit 602 a laser light 601 introduced by a laser optical system. In this case also, a polycrystalline silicon film where inequality within the plane is suppressed as possible can be obtained by controlling with high accuracy the relative positions of the stage and the laser light.

Reference is subsequently made to FIG. 7. FIG. 7 illustrates one of systems for polycrystallizing an amorphous silicon film of the present invention shown in FIG. 1. Difference between this system and the system shown in FIG. 6 resides in a point that the area of a laser light 701 introduced by a laser optical system is narrowed toward traveling direction of the laser light. It is possible to control the area of the laser light irradiated to an amorphous silicon film by guiding through a slit 702 the laser light 701 introduced by a laser optical system. In this case also, a polycrystalline silicon film where inequality within the plane is suppressed as possible can be obtained by controlling with high accuracy the relative positions of the stage and the laser light.

Incidentally, also in the system shown in FIG. 4, the area of the laser light may be controlled by using a slit as illustrated in FIGS. 6 and 7.

Further, systems shown in FIGS. 3 to 7 are for polycrystallizing an amorphous silicon film of the present invention shown in FIG. 1, but, needless to say, may be utilized also as systems for polycrystallizing an amorphous silicon film of the present invention shown in FIG. 2.

Next, reference is made to FIG. 8. FIG. 8 illustrates a method of polycrystallizing an amorphous silicon film of the present invention in the case that larger substrate is employed. Shown in FIG. 8 is a liquid crystal display device of active matrix type as an example of a semiconductor device having a thin film transistor that uses a polycrystalline silicon film manufactured by a method of the present invention. Reference numeral 800 denotes a substrate; 801, an active matrix circuit; 802, source driver circuit; 803 and 804, gate driver circuits. Reference numerals 805 and 816 denote laser light irradiation regions, and an amorphous silicon film in the respective regions is polycrystallized with one shot or plural shots of the laser light. In the drawing, distances (gaps) denoted by "$A_3$", "$A_4$" and "$A_5$", and "$B_3$" and "$B_4$" are distances (gaps) between the adjacent laser light irradiation regions, respectively. To a portion denoted by 817, the laser light is not irradiated. Also in the case that such a relatively large substrate is handled, distances (gaps) denoted by "$A_3$", "$A_4$" and "$A_5$", and "$B_3$" and "$B_4$" are determined depending on a pixel pitch of the active matrix circuit or dimension of a pixel TFT, dimension of a TFT of the driver circuit or the like, respectively. The circuit is designed so that the laser light non-irradiation region does not form the active layer of the thin film transistor. See FIGS. 10, 11 and 12, respectively, as to the positional relationship between the laser light non-irradiation region and the active matrix circuit, between the laser light non-irradiation region and the source driver circuit, and between the laser light non-irradiation region and the gate driver circuit.

Subsequently, reference is made to FIG. 9. FIG. 9 shows one of systems for polycrystallizing an amorphous silicon film of the present invention in the case that the substrate shown in FIG. 8 is used. In FIG. 9, reference numeral 901 denotes an amorphous silicon film formed on a substrate. Reference numeral 902 denotes a laser light of large output, and a laser body and an optical system are omitted for convenience's sake in description of the drawing. An excimer laser of large output is suitable for the laser body. Reference numeral 903 denotes a polycrystalline silicon film and the drawing illustrates a state in which an amorphous silicon in the region irradiated with the laser light is polycrystallized. Reference numeral 904 denotes a stage, on which a substrate 800 is set. The stage 904 is moved by a control device 905 for stage X position and a control device 906 for stage Y position. A margin for error of step position of the stage 904 is about 0.04 µm. By moving the stage 904, laser light irradiation region 902 may be controlled with high accuracy.

Alternatively, laser light irradiation position with laser light may be arranged to be movable and the X position and Y position of laser light may be controlled since it is sufficient that the laser light 902 and the substrate 800 are moved relatively to each other. Further, both laser light and substrate (i.e., stage) may be movable in position.

In the case shown in FIG. 9, the stage 904 shifts its position eleven times to polycrystallize substantially the entire surface of the amorphous silicon film 901 formed on the substrate 800. As mentioned in the description of FIG. 1, laser light is irradiated while spacing out the film by the distances (gaps) "$A_3$", "$A_4$" and "$A_5$", and "$B_3$" and "$B_4$", which causes a region 817 that is not irradiated with laser light. The circuit is designed so that the this laser light non-irradiation region 817 is not used for the active layer of the thin film transistor. That is already described above.

The laser lights shown in FIGS. 4 to 7 may be used for the laser light 902.

Next, FIG. 13 illustrates another method of polycrystallizing an amorphous silicon film using excimer laser of large output in accordance with the present invention. FIG. 13 shows regions irradiated with laser light when polycrystallizing an amorphous silicon film in accordance with the present invention. Shown in FIG. 13 is an active matrix type liquid crystal display device as an example of a semiconductor device having a thin film transistor that uses a polycrystalline silicon film manufactured by a method of the present invention.

Reference numeral 1300 denotes a substrate; 1301 and 1305, active matrix circuits; 1302 and 1306, source driver circuits; 1303, 1304, 1307 and 1308, gate driver circuits. Reference numerals 1309 to 1312 denote laser light irradiation regions, and an amorphous silicon film in the respective regions is polycrystallized with one shot or plural shots of the laser light. In the method shown in FIG. 13, there partially exist end portions of adjacent irradiated regions, to which laser light is irradiated, overlap with each other (overlapping laser light irradiation regions 1313 to 1317). Lengths denoted by "$C_1$" and "$D_1$" in FIG. 13 are respectively lengths of regions where adjacent regions irradiated with laser light overlap with each other.

As a process, the amorphous silicon film is irradiated with a laser light to be polycrystallized and is patterned, and, thereafter, the active matrix circuits, source driver circuits and gate driver circuits are formed. However, here for convenience's sake in description, the laser light irradiation regions, and the active matrix circuits, source driver circuits and gate driver circuits are shown in the same drawing. Though the irradiated regions 1309 to 1312 with laser light are shown in hatching patterns different from one another, equal laser light is irradiated onto each region.

In the method shown in FIG. 13, there are overlapping laser light irradiation regions 1313 to 1317, which means that there are regions different from one another in characteristic of a silicon film that is irradiated with laser light to be polycrystallized. In the method of FIG. 13, lengths "$C_1$" and "$D_1$" of the overlapping laser light irradiation regions 1313 to 1317 which are regions different from one another in film quality of the polycrystallized silicon film are determined depending c)n a pixel pitch of the active matrix circuit, dimension of a TFT of the driver circuit or the like, respectively. That is, the circuit is designed so that the overlapping laser light irradiation regions 1313 to 1317 do not form an active layer of the thin film transistor.

In FIG. 13, portions denoted by $\delta_1$ and $\epsilon_1$ are respectively the active matrix circuit region and the source driver region, and $\delta_1$ and $\epsilon_1$ denote portions including the overlapping laser light irradiation regions 1313 to 1317. FIG. 17 is an enlarged view of the portion $\delta_1$ and FIG. 18 is an enlarged view of the portion $\epsilon_1$.

Reference is made to FIG. 17. In FIG. 17, reference numeral 1701 denotes an active layer of a thin film transistor made of polycrystalline silicon, 1702 denotes first wirings and 1703 denotes second wirings. The first wirings 1702 function as the gate electrode of the active layer in the thin film transistor. Incidentally, for convenience's sake in description, a pixel electrode, interlayer insulating film or the like is omitted. $P_X$ is a pixel pitch in a direction of the X axis (row) and $P_Y$ is a pixel pitch in a direction of the Y axis (column). $S_X$ is the length of the active layer in a direction of the X axis and $S_Y$ is the length of the active layer in a direction of the Y axis.

It can be understood from FIG. 17 that the active layer of the thin film transistor does not enter into the overlapping laser light irradiation region 1313. In other words, the active layer does not present in the overlapping laser light irradiation region 1313 which is defined by the length "$C_1$" of the region where the laser light irradiation region 1311 and the laser light irradiation region 1312 overlap with each other. Therefore, it can be understood that the overlapping laser light irradiation region 1313 is not used as the active layer of the thin film transistor. The active layer of the thin film transistor thus does not employ polycrystalline silicon films different in characteristic. When expressing this condition with $P_X$, $S_X$ and $C_1$, the following is established:

$$P_X - S_X > C_1$$

Next, reference is made to FIG. 18. In the enlarged view of the portion $\epsilon_1$ shown in FIG. 13, there is shown an inverter circuit within the source driver circuit 1306. Reference numerals 1801 and 1802 denote the active layers of the thin film transistor made of polycrystalline silicon, and to the source region and drain region of each active layer, N type impurities and P type impurities are added. Reference numerals 1803 and 1804 denote first wirings and the wiring 1803 functions as a gate electrode of the active layer in the thin film transistor. A second wiring is denoted by 1805. Also in here, an interlayer insulating film or the like is omitted for convenience's sake in description. Portions painted out with black in the drawing illustrate portions in each of which the active layer and the second wiring layer, or the first wiring and the second wiring layer are brought into contact (are connected) with each other. It can be understood from FIG. 18 that the active layers 1801 and 1802 do not enter into the overlapping irradiated region 1313 with laser light. In other words, the active layers 1801 and 1802 do not present in the overlapping laser light irradiation region 1313 which is defined by the length "$C_1$" (and length "$D_1$") of the region where the laser light irradiation region 1311 and the laser light irradiation region 1312 overlap with each other. Therefore, it can be understood that the silicon film of the overlapping laser light irradiation region 1313 is not used as the active layer of the thin film transistor. The active layer of the thin film transistor thus does not use polycrystalline silicon films different in characteristics.

Next, reference is made to FIG. 14. FIG. 14 shows laser light irradiation regions when polycrystallizing an amorphous silicon film using excimer laser of large output in accordance with the present invention. FIG. 14 shows an active matrix type liquid crystal display device as an example of a semiconductor device having a thin film transistor that uses a polycrystalline silicon film manufactured by a method of the present invention.

Reference numeral 1400 denotes a substrate; 1401, An active matrix circuit; 1402 and 1403, source driver circuits; 1404 and 1405, gate driver circuits. Reference numerals 1406 to 1409 denote laser light irradiation regions, and an amorphous silicon film in the respective regions is polycrystallized with one shot or plural shots of the laser light. In the method shown in FIG. 14, as illustrated in FIG. 13, there partially exist end portions of adjacent irradiated regions, to which laser light is irradiated, overlap with each other (overlapping irradiated regions 1410 to 1414 with laser light). Lengths denoted by "$C_2$" and "$D_2$" in FIG. 14 are respectively lengths of regions where adjacent regions irradiated with laser light overlap with each other.

As a process, the amorphous silicon film is irradiated with a laser light to be polycrystallized and is patterned, and, thereafter, the active matrix circuit, source driver circuits and gate driver circuits are formed. However in FIG. 14, for convenience's sake in description as in FIG. 13, the laser light irradiation regions, and the active matrix circuit, source driver circuits and gate driver circuits are shown in the same drawing. Though the laser light irradiation regions 1406 to 1409 are shown in hatching patterns different from one another, equal laser light is irradiated on each region.

In the method shown in FIG. 14, there are overlapping laser light irradiation regions 1410 to 1414, which means that there are regions different from one another in characteristic of a silicon film that is irradiated with laser light to be polycrystallized. In the method of FIG. 14, lengths "$C_2$" and "$D_2$" of the overlapping laser light irradiation regions 1410 to 1414 which are regions different from one another in film quality of the polycrystallized silicon film are determined depending on a pixel pitch of the active matrix circuit, dimension of a pixel TFT, dimension of a TFT of the driver circuit or the like, respectively. That is, the circuit is designed so that the overlapping laser light irradiation regions 1410 to 1414 do not form an active layer of the thin film transistor.

In FIG. 14, portions denoted by $\epsilon_2$, $\delta_2$ and $\zeta_2$ are respectively the active matrix circuit, the source driver circuit and gate driver circuit, and $\epsilon_2$, $\delta_2$ and $\zeta_2$ denote portions including the overlapping laser light irradiation region 1410. FIG. 19 is an enlarged view of the portion $\zeta_2$. The portions $\epsilon_2$ and $\delta_2$ are the same as the portions $\epsilon_2$ and $\delta_2$ shown in FIGS. 17 and 18, and hence description is omitted here.

Reference is made to FIG. 19. Shown in FIG. 19 is a buffer circuit in a gate driver circuit 1404. Reference numerals 1901 and 1902 denote the active layers of the thin film transistors made of polycrystalline silicon, and to the source region and drain region of each of the active layers 1901 and 1902, impurities for giving P type and impurities for giving N type are introduced. Reference numerals 1903 and 1904 denote first wirings and 1905 denotes second wirings. The first wirings 1903 function as the gate electrodes of the thin film transistors. Also in here, an interlayer insulating film or the like is omitted for convenience's sake in description. Portions painted out with black in the drawing illustrate portions in each of which the active layer and the second wirings, or the first wirings and the second wirings are brought into contact (are connected) with each other. It can be understood from FIG. 19 that the active layers 1901 and 1902 do not enter into the overlapping laser light irradiation region 1410. In other words, the active layers 1901 and 1902 do not present in the overlapping laser light irradiation region 1410 which is defined by the length "$D_2$" of the region where the laser light irradiation region 1406 and the laser light irradiation region 1408 overlap with each other. The active layers 1901 and 1902 do not present in the overlapping laser light irradiation region 1410. Therefore, it can be understood that the silicon film of the overlapping laser light irradiation region 1410 is not used as the active layer of the thin film transistor. The active layer of the thin film transistor thus does not employ polycrystalline silicon films different in characteristic.

Now, supplementary description will be made of the portion $\epsilon_2$ in FIG. 14. In the active matrix circuit shown in FIG. 14, a pixel pitch in a direction of the X axis (row) is given as $P_X$; a pixel pitch in a direction of the Y axis (column) as $P_Y$; the length of the active layer in a direction of the X axis as $S_X$; and the length of the active layer in a direction of the Y axis as $S_Y$. In this case, when expressing conditions that fulfill the method of the present invention with $P_X$, $P_Y$, $S_X$, $S_Y$, $C_2$ and $D_2$, the following is established:

$$P_X - S_X > C_2$$

$$P_Y - S_Y > D_2$$

Next, reference is made to FIG. 15. FIG. 15 illustrates one of systems for polycrystallizing an amorphous silicon film of the present invention shown in FIG. 13. As to parts in FIG. 15 which uses the same reference numerals as in FIG. 13, see description on FIG. 13.

In FIG. 15, reference numeral 1501 denotes an amorphous silicon film formed on a substrate. Reference numeral 1502 denotes a laser light of large output, and a laser body and an optical system are omitted for convenience's sake in description of the drawing. An excimer laser of large output is suitable for the laser body. Reference numeral 1503 denotes a polycrystalline silicon film and the drawing illustrates a state in which an amorphous silicon in the region irradiated with the laser light is polycrystallized. Reference numeral 1504 denotes a stage, on which the substrate 1300 is set. The stage 1504 is moved by a control device 1505 for stage X position and a control device 1506 for stage Y position. A margin for error of stop position of the stage 1504 is about 0.04 $\mu$m. By moving the stage 1504, laser light irradiation region 1502 may be controlled with high accuracy.

Alternatively, laser light irradiation position may be arranged to be movable and the X position and Y position of laser light may be controlled since it is sufficient that the laser light 1502 and the substrate 1300 are moved relatively to each other. Further, both laser light and substrate (i.e., stage) may be movable in position.

The laser lights shown in the above FIGS. 4 to 7 may be used in this system shown in FIG. 15.

Next, reference is made to FIG. 16. FIG. 16 illustrates a method of polycrystallizing an amorphous silicon film of the present invention in the case that larger substrate is employed. Shown in FIG. 16 is a liquid crystal display device of active matrix type as an example of a semiconductor device having a thin film transistor that uses a polycrystalline silicon film manufactured by the method of the present invention. Reference numeral 1600 denotes a substrate; 1601, an active matrix circuit; 1602, a source driver circuit; 1603 and 1604, gate driver circuits. Reference numerals 1605 to 1616 denote laser light irradiation regions, and an amorphous silicon film in the respective regions is polycrystallized with one shot or plural shots of the laser light. In the drawing, lengths denoted by "$C_3$", "$C_4$" and "$C_5$", and "$D_3$" and "$D_4$" are respectively lengths of portions where adjacent laser light irradiation regions overlap with each other. In the method shown in FIG. 16, there is a portion where a laser light irradiation region overlaps with an end portion of another laser light irradiation region (overlapping laser light irradiation regions, representatively, regions denoted by 1617 to 1619). The lengths denoted by "$C_3$", "$C_4$" and "$C_5$", and "$D_3$" and "$D_4$" are respectively lengths of regions where adjacent laser light irradiation regions overlap with each other.

As a process, the amorphous silicon film is irradiated with a laser light to be polycrystallized and is patterned, end, thereafter, the active matrix circuit, source driver circuit and gate driver circuits are formed. However in FIG. 16, here for convenience's sake in description as in FIGS. 13 and 14, the laser light irradiation regions, and the active matrix circuit, source driver circuit and gate driver circuits are shown in the same drawing. Though the laser light irradiation regions 1605 to 1616 are shown in hatching patterns different from one another, equal laser light is irradiated onto each region.

Also in the method of polycrystallizing an amorphous silicon film shown in FIG. 16, respective circuits, namely, the active matrix circuit 1601, source driver circuit 1602 and gate driver circuit 1603 are designed so that the silicon films of the overlapping laser light irradiation regions representatively denoted by 1617 to 1619 are not used as the active layers of thin film transistors that constitute those circuits. The lengths "$C_3$", "$C_4$" and "$C_5$", and "$D_3$" and "$D_4$" may be equal with one another, or may be different from one another. The lengths "$C_3$", "$C_4$" and "$C_5$", and "$D_3$" and "$D_4$" may be changed depending on how the circuit is designed. That is, also in the case that such a relatively large substrate is handled, the lengths "$C_3$", "$C_4$" and "$C_5$", and "$D_3$" and "$D_4$" are determined depending on a pixel pitch of the active matrix circuit or dimension of a pixel TFT, dimension of a TFT of the driver circuit or the like, respectively. In addition, the circuit is designed so that the laser light non-irradiation region does not form the active layer of the thin film transistor. See FIGS. 17, 18 and 19, respectively, as to the positional relationship between the laser light non-irradiation region and the active matrix circuit, between the laser light non-irradiation region and the source driver circuit, and between the laser light non-irradiation region and the gate driver circuit.

Incidentally, the system for polycrystallizing an amorphous silicon film of the present invention shown in FIG. 16 is similar to one shown in FIG. 9.

Next, reference is made to FIG. 31. FIG. 31 illustrates the method of polycrystallizing an amorphous silicon film of the present invention shown in FIG. 1, in which, however, the laser light is irradiated so that a laser light irradiation region includes an end portion of the substrate. This method may be applied to methods described with reference to the accompanying figures other than FIG. 1.

Of the silicon films polycrystallized by methods shown in FIGS. 13 and 14, silicon films in laser light irradiation regions are usually not used for the active layer of the thin film transistor as described above. However, if laser light irradiation regions are shifted resulting that a silicon film of an overlapping laser light irradiation region is used for the active layer of the thin film transistor, it may in some cases operate as a thin film transistor without any trouble, though variations may be caused a little, and there is no fear of extreme decline in yield of the product.

It is needless to say that all the above described methods of polycrystallizing an amorphous silicon film may be used to improve crystallinity after thermal SPC (Solid Phase Crystallization) or SPC using catalytic elements. Namely, an "initial semiconductor film" may be irradiated with excimer laser light of large output to be crystallized to the higher extent.

The structure of the present invention will be described below.

According to a first aspect of the present invention, there is provided a method of manufacturing a thin film transistor comprising:

the first step of forming a semiconductor film on a substrate;

the second step of irradiating onto a part of the semiconductor film one shot or plural shots of laser light of 5 J or more in total energy and 100 nsec or more in pulse width to form a highly crystalized semiconductor film;

the third step of repeatedly performing the second step onto a part of the semiconductor film different from the part of the second step while shifting relative positions of the semiconductor film and the laser light to each other; and the fourth step of forming a thin film transistor having as an active layer the highly crystallized semiconductor film.

According to a second aspect of the present invention, there is provided a method of manufacturing a thin film transistor comprising:

the first step of forming an initial semiconductor film on a substrate;

the second step of irradiating onto a part of the initial semiconductor film one shot or plural shots of laser light of 5 J or more in total energy and 100 nsec or more in pulse width to form a highly crystalized semiconductor film;

the third step of repeatedly performing the second step onto a part of the initial semiconductor film different from the part of the second step while shifting relative positions of the initial semiconductor film and the laser light to each other; and the fourth step of forming a thin film transistor having as an active layer the highly crystallized semiconductor film.

According to a third aspect of the present invention, there is provided a method of manufacturing a thin film transistor comprising:

the first step of forming a semiconductor film on a substrate;

the second step of irradiating onto a part of the semiconductor film one shot or plural shots of laser light of 5 J or more in total energy and 100 nsec or more in pulse width to form a highly crystalized semiconductor film;

the third step of repeatedly performing the second step while shifting relative positions of the semiconductor film and the laser light to each other, and irradiating the laser light duplicately onto the part of the semiconductor film; and the fourth step of forming a thin film transistor having as an active layer the highly crystallized semiconductor film.

According to a fourth aspect of the present invention, there is provided a method of manufacturing a thin film transistor comprising:

the first step of forming an initial semiconductor film on a substrate;

the second step of irradiating onto a part of the initial semiconductor film one shot or plural shots of laser light of 5 J or more in total energy and 100 nsec or more in pulse width to form a highly crystalized semiconductor film;

the third step of repeatedly performing the second step while shifting relative positions of the initial semiconductor film and the laser light to each other, and irradiating the laser light duplicately onto the part of the initial semiconductor film; and the fourth step of forming a thin film transistor having as an active layer the highly crystallized semiconductor film.

According to a fifth aspect of the present inventions, there is provided a method of manufacturing a thin film transistor as set forth in the first or third aspect of the present invention, wherein the semiconductor film comprises a silicon film or a germanium film.

According to a sixth aspect of the present invention, there is provided a method of manufacturing a thin film transistor as set forth in the second or fourth aspect of the present invention, wherein the initial semiconductor film comprises a silicon film or a silicon germanium film.

According to a seventh aspect of the present invention, there is provided a method of manufacturing a thin film transistor as set forth in the first, second of fifth aspect of the present invention, wherein a gap between the highly crystallized semiconductor films is about 10 $\mu$m or less.

According to an eighth aspect of the present invention, there is provided a method of manufacturing a thin film transistor as set forth in the first or second aspect of the present invention, wherein a gap between the part of the semiconductor film and the different part thereof is about 10 $\mu$m or less.

According to a ninth aspect of the present invention, there is provided a method of manufacturing a thin film transistor as set forth in any one of the first through fourth aspects of the present invention, wherein only the highly crystallized semiconductor film is used as the active layer.

According to a tenth aspect of the present invention, there is provided a method of manufacturing a thin film transistor as set forth in any one of the first through fourth aspects of the present invention, wherein the length of the part of the semiconductor film is about 10 $\mu$m or less.

According to an eleventh aspect of the present invention, there is provided a method of manufacturing a thin film transistor as set forth in any one of the first through fourth aspects of the present invention, wherein the pulse width of the laser light is 200 nsec or more.

According to a twelfth aspect of the present invention, there is provided a method of manufacturing a thin film transistor comprising:

the first step of forming an amorphous semiconductor film on a substrate;

the second step of irradiating onto a part of the amorphous semiconductor film one shot or plural shots of laser light of 5 J or more in total energy and 100 nsec or more in pulse width;

the third step of repeatedly performing the second step onto a part of the amorphous semiconductor film different from the second step while shifting relative positions of the amorphous semiconductor film and the laser light to each other, to thereby form a polycrystalline semiconductor film; and the fourth step of forming a thin film transistor having as an active layer the polycrystalline semiconductor film.

According to a thirteenth aspect of the present invention, there is provided a method of manufacturing a thin film transistor as set forth in the twelfth aspect of the present invention, wherein the amorphous semiconductor film comprises an amorphous silicon film or an amorphous silicon germanium film.

According to a fourteenth aspect of the present invention, there is provided a method of manufacturing a thin film transistor as set forth in the twelfth aspect of the present invention, wherein a gap between the polycrystalline semiconductor films is about 10 $\mu$m or less.

According to a fifteenth aspect of the present invention, there is provided a method of manufacturing a thin film transistor as set forth in the twelfth aspect of the present invention, wherein a gap between the part of the amorphous semiconductor film and the different part thereof is about 10 $\mu$m or less.

According to a sixteenth aspect of the present invention, there is provided a method of manufacturing a thin film transistor as set forth in the twelfth aspect of the present invention, wherein the pulse width of the laser light is 200 nsec or more.

According to a seventeenth aspect of the present invention, there is provided a method of manufacturing a thin film transistor as set forth in the twelfth aspect of the present invention, wherein among the amorphous semiconductor films, only the polycrystallized region is used as the active layer.

According to an eighteenth aspect of the present invention, there is provided a method of manufacturing a thin film transistor comprising:

the first step of forming an amorphous semiconductor film on a substrate;

the second step of irradiating onto a part of the amorphous semiconductor film one shot or plural shots of laser light of 5 J or more in total energy and 100 nsec or more in pulse width;

the third step of repeatedly performing the second step by irradiating the laser light onto a region that overlaps with the part of the amorphous semiconductor film, while shifting relative positions of the amorphous semiconductor film and the laser light to each other, to thereby polycrystallize substantially the entire region of the amorphous semiconductor film; and the fourth step of forming a thin film transistor having as an active layer the polycrystalline semiconductor film.

According to a nineteenth aspect of the present invention, there is provided a method of manufacturing a thin film transistor as set forth in the eighteenth aspect of the present invention, wherein the amorphous semiconductor film comprises an amorphous silicon film or an amorphous silicon germanium film.

According to a twentieth aspect of the present invention, there is provided a method of manufacturing a thin film transistor as set forth in the eighteenth aspect of the present invention, wherein the length of the region that overlaps with the part of the amorphous semiconductor film is about 10 $\mu$m or less.

According to a twenty-first aspect of the present invention, there is provided a method of manufacturing a thin film transistor as set forth in the eighteenth aspect of the present invention, wherein the pulse width of the laser light is 200 nsec or more.

According to a twenty-second aspect of the present invention, there is provided a method of manufacturing a thin film transistor as set forth in the eighteenth aspect of the present invention, wherein among the polycrystallized silicon film, only a region excluding the part of the amorphous silicon film is used as the active layer.

According to a twenty-third aspect of the present invention, there is provided a method of manufacturing a thin film transistor as set forth in any one of the first through fourth, twelfth and eighteenth aspects of the present invention, wherein the laser light is one obtained by the use of excimer laser units coupled with one another to form two, three or four tiers.

According to a twenty-fourth aspect of the present invention, there is provided a method of manufacturing a thin film transistor comprising:

the first step of forming an amorphous silicon film on a substrate;

the second step of irradiating onto a part of the amorphous semiconductor film a single shot of laser light with a total energy of 5 J or more to polycrystallize the amorphous silicon film;

the third step of repeatedly performing the second step to polycrystallize substantially the entire region of the amorphous silicon film; and the fourth step of forming a thin film transistor having as an active layer the polycrystallized amorphous silicon film.

According to a twenty-fifth aspect of the present invention, there is provided a method of manufacturing a thin film transistor as set forth in the twenty-fourth aspect of the present invention, wherein a gap between the polycrystallized amorphous silicon films is about 10 μm or less.

According to a twenty-sixth aspect of the present invention, there is provided a method of manufacturing a thin film transistor as set forth in the twenty-fourth aspect of the present invention, wherein among the amorphous silicon films, only the polycrystallized region is used as the active layer.

According to a twenty-seventh aspect of the present invention, there is provided a thin film transistor manufactured in accordance with a method as set forth in the twenty-fourth aspect of the present invention.

BRIEF DESCRIPTION OF THE DRAWINGS

In the accompanying drawings:

FIGS. 27A to 27C are views showing a liquid crystal display device of active matrix type using a system for polycrystallizing an amorphous silicon film in accordance with the present invention, in which FIG. 27A is a perspective view thereof and FIGS. 27B and 27c are side views thereof;

DETAILED DESCRIPTION OF THE PREFERRED EMBODIMENTS

Now, details of the present invention will be described with embodiments below. It should be noted that embodiments below are merely some modes for carrying out the invention, and the present invention is not limited to those.

Embodiment 1

In this embodiment, concrete description will be made of the manufacture of an active matrix type liquid crystal display device having a TFT that is manufactured using a method of polycrystallizing an amorphous silicon film in accordance with the present invention. FIGS. 20A to 23C show an example in this embodiment, where a plurality of TFTs are formed to form a pixel matrix circuit, driver circuit, logic circuit and the like which are monolithically arranged. Incidentally, this embodiment shows a state in which one pixel of the pixel matrix circuit, and a CMOS circuit that is a basic circuit of other circuit (driver circuit, logic circuit or the like) are formed simultaneously. Although description in this embodiment is made of a manufacturing process of P channel type TFT and an N channel type TFT in the case that each of the TFTs is provided with one gate electrode, it is possible to similarly manufacture a CMOS circuit comprising a TFT that is provided with a plurality of gate electrodes, such as a double gate type or a triple gate type.

Figure 1:
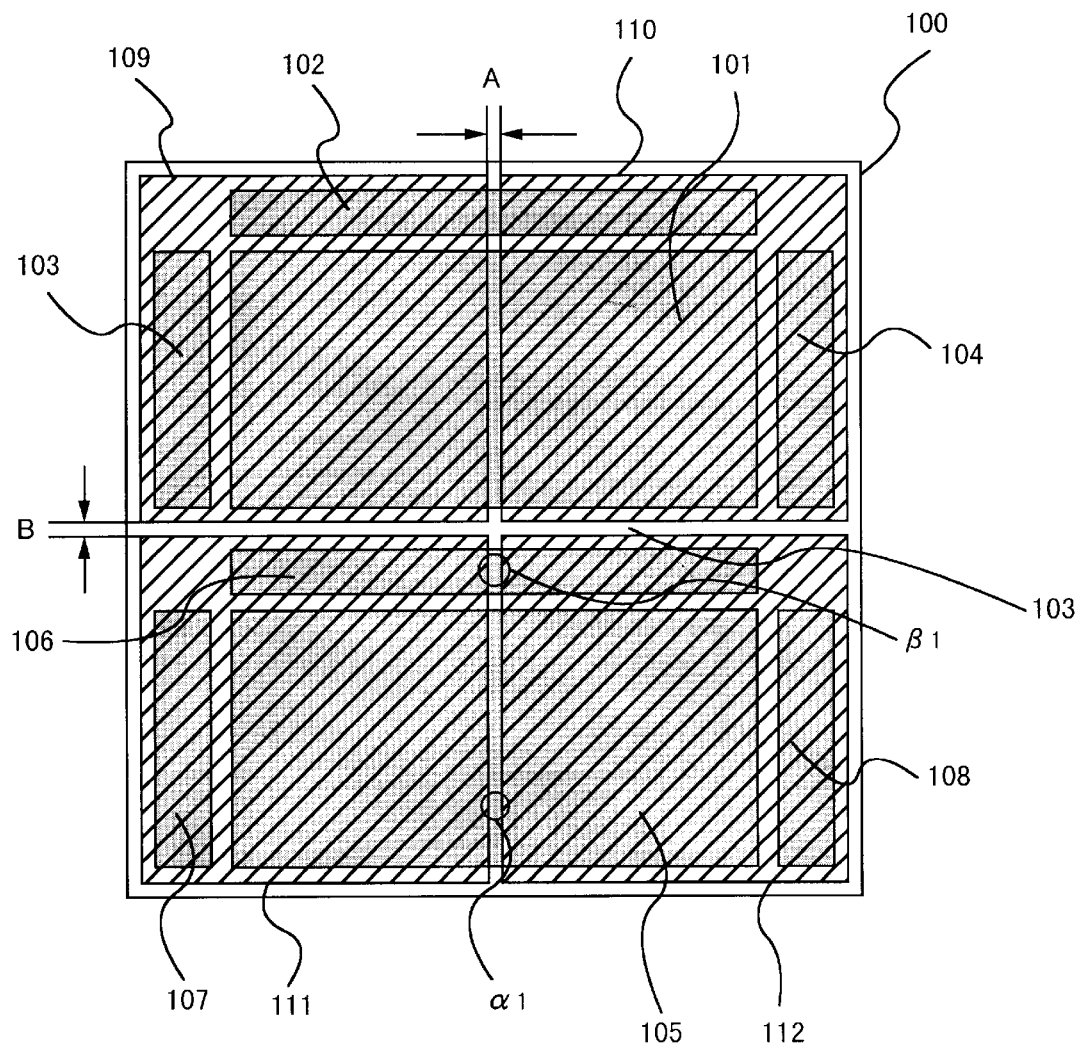
FIG. 1 is a view showing laser light irradiation regions of an amorphous silicon film polycrystallized by laser light in accordance with the present invention.
Figure 2:
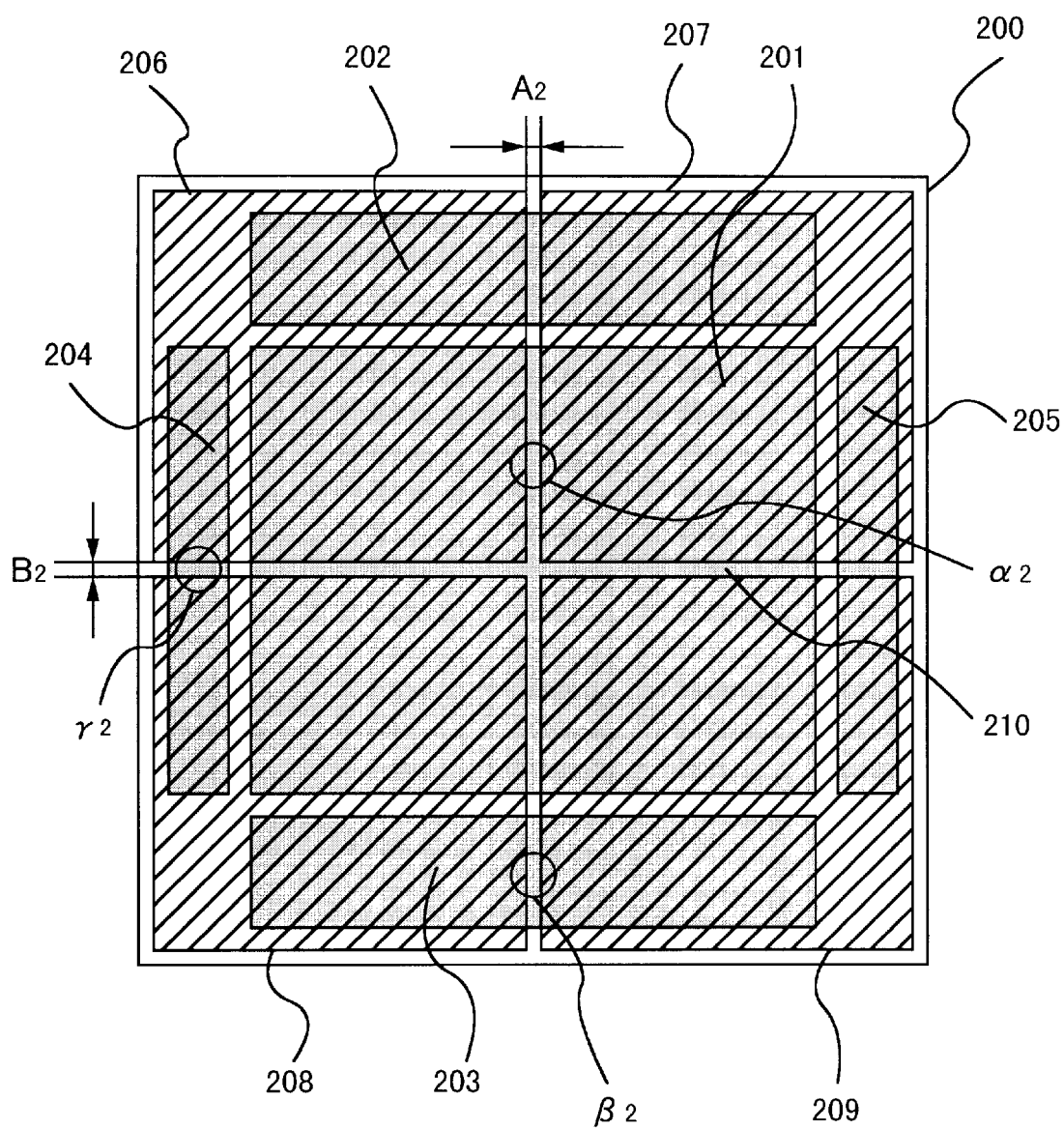
FIG. 2 is a view showing laser light irradiation regions of an amorphous silicon film polycrystallized by laser light in accordance with the present invention.
Figure 3:
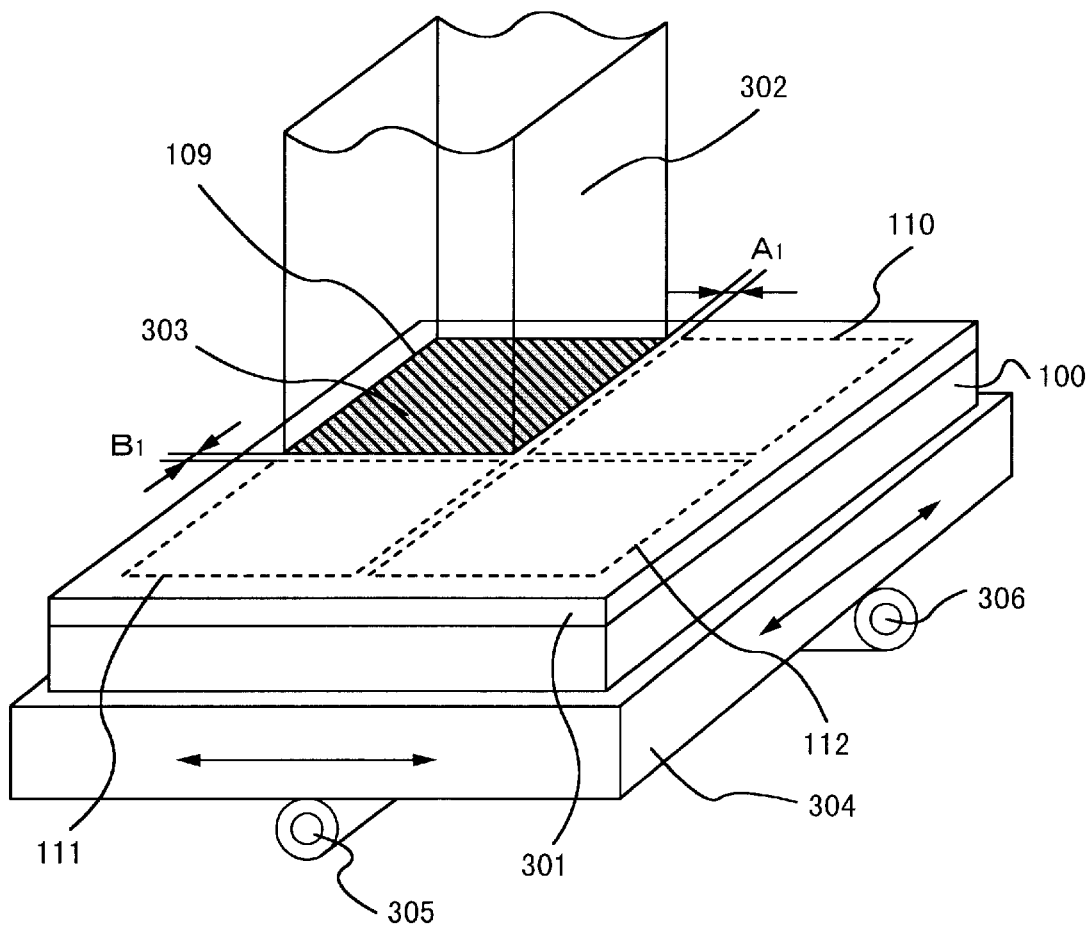
FIG. 3 is a view showing a mode of a system for polycrystallizing an amorphous silicon film in accordance with the present invention.
Figure 4:
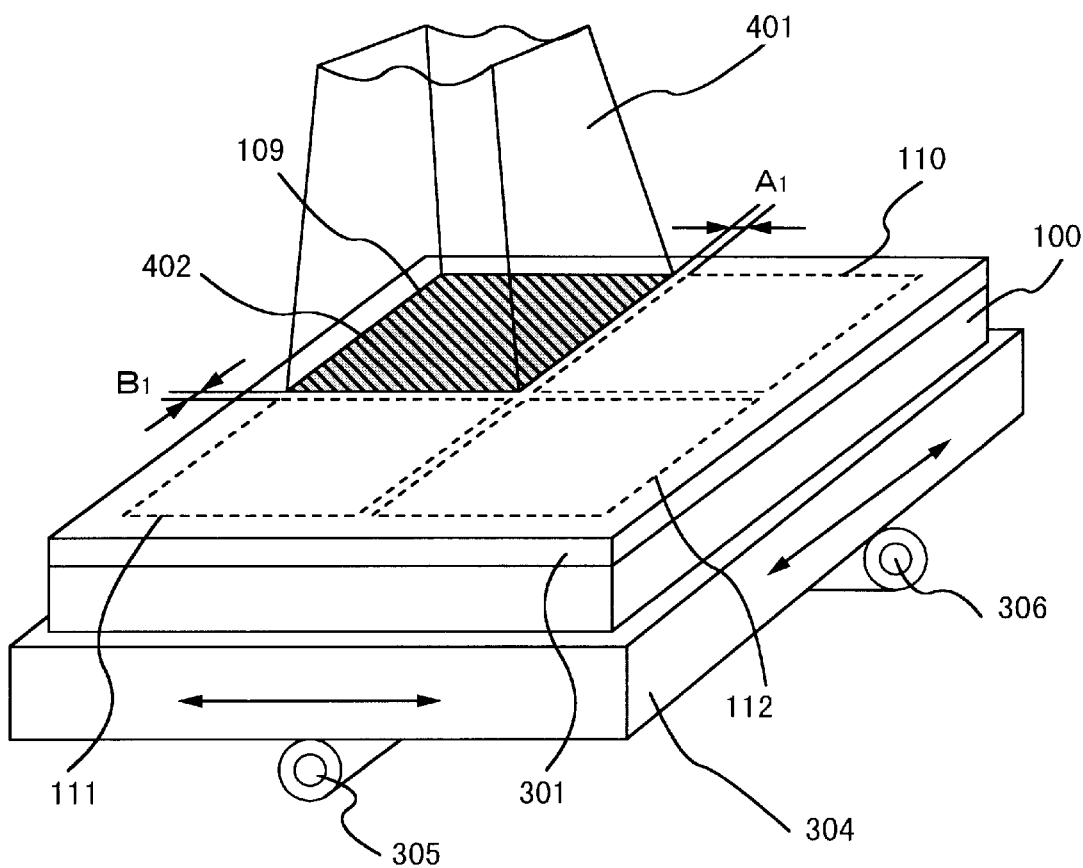
FIG. 4 is a view showing a mode of a system for polycrystallizing an amorphous silicon film in accordance with the present invention.
Figure 5:
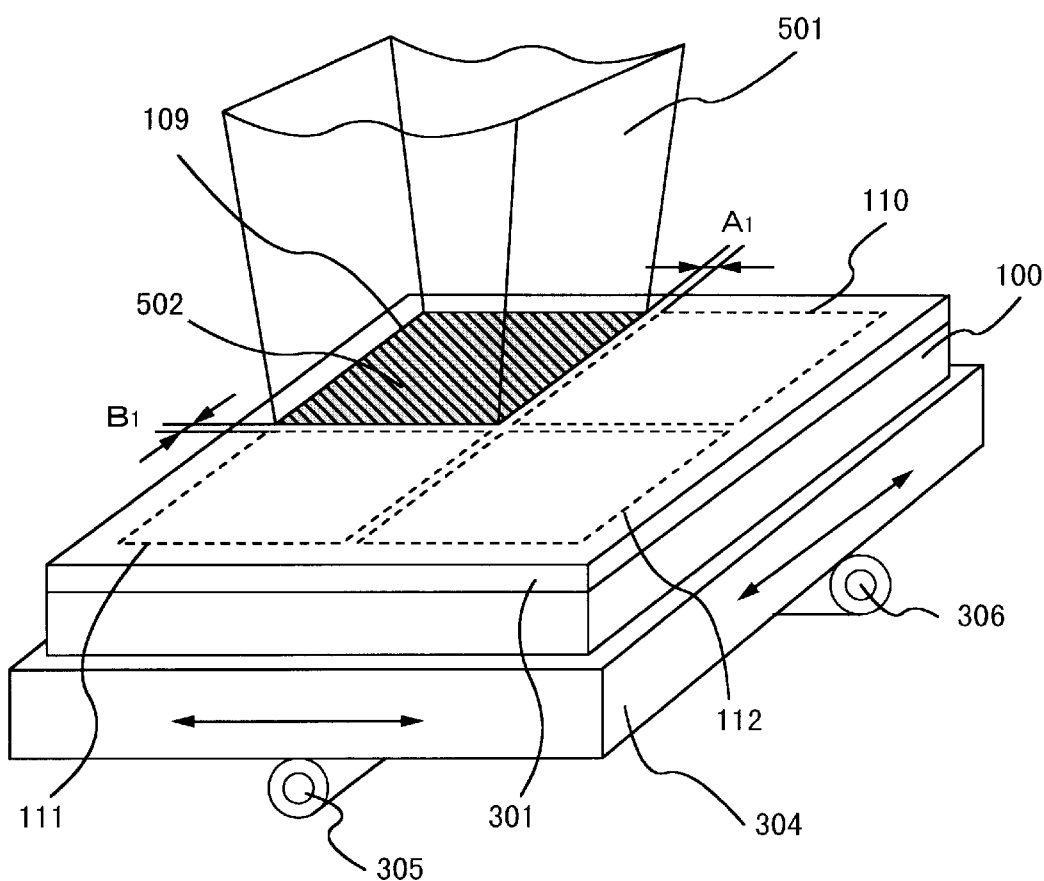
FIG. 5 is a view showing a mode of a system for polycrystallizing an amorphous silicon film in accordance with the present invention.
Figure 6:
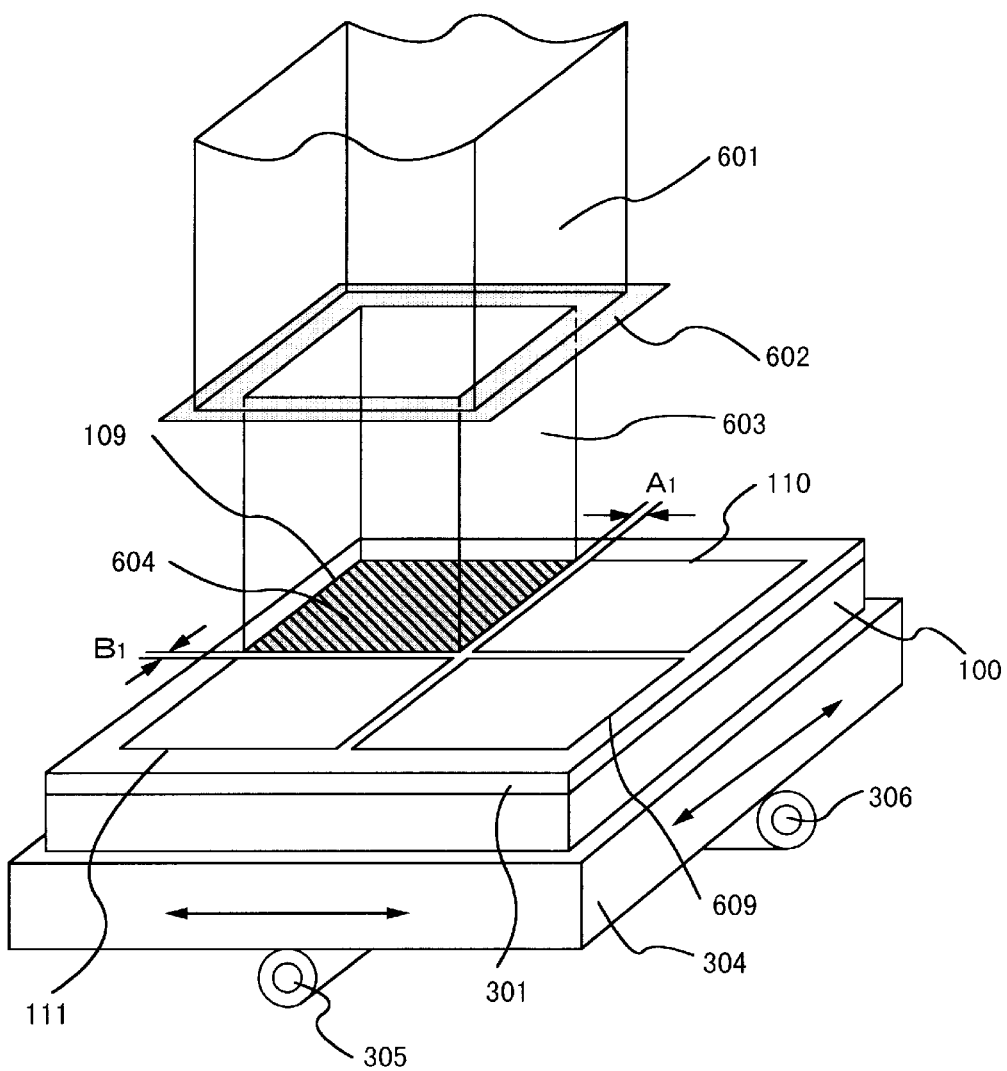
FIG. 6 is a view showing a mode of a system for polycrystallizing an amorphous silicon film in accordance with the present invention.
Figure 7:
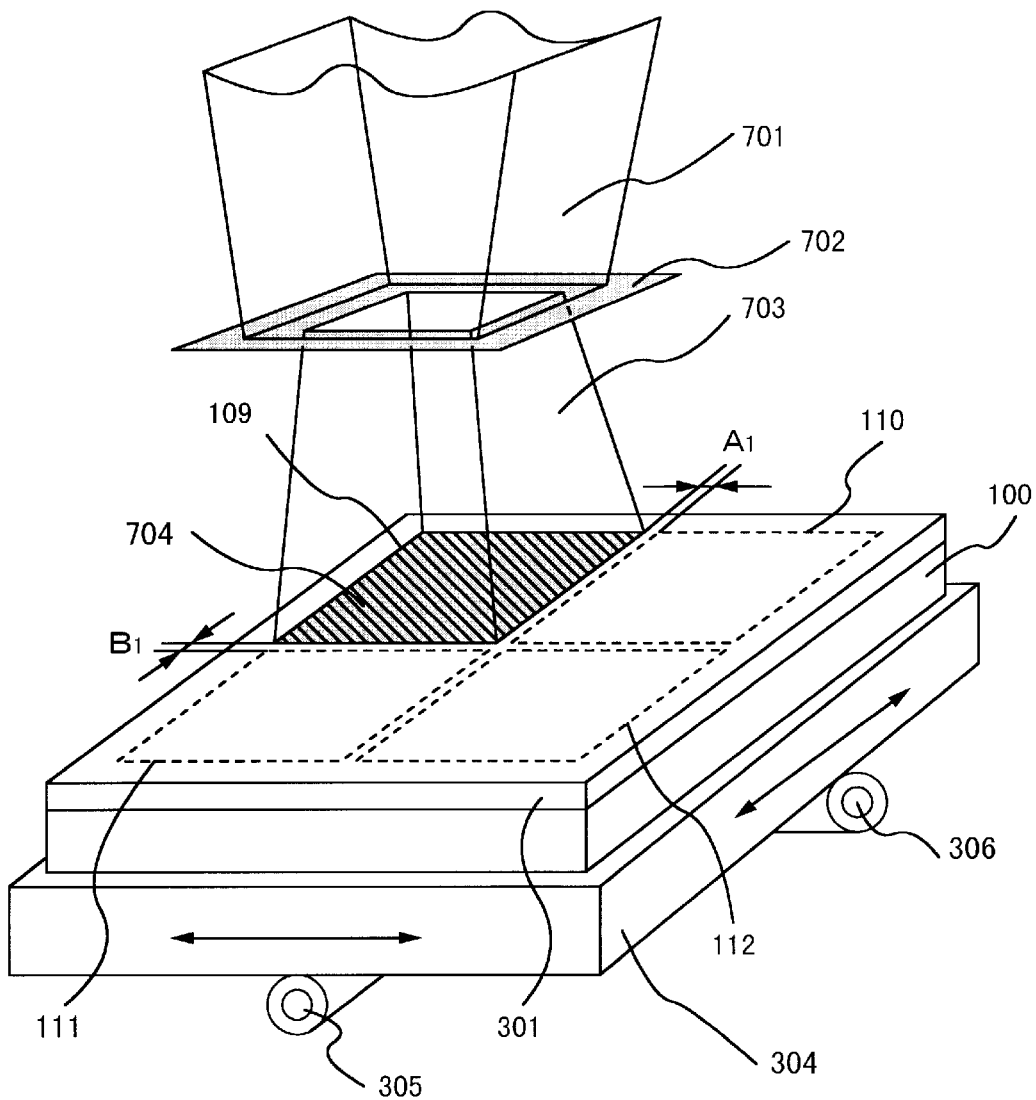
FIG. 7 is a view showing a mode of a system for polycrystallizing an amorphous silicon film in accordance with the present invention.
Figure 8:
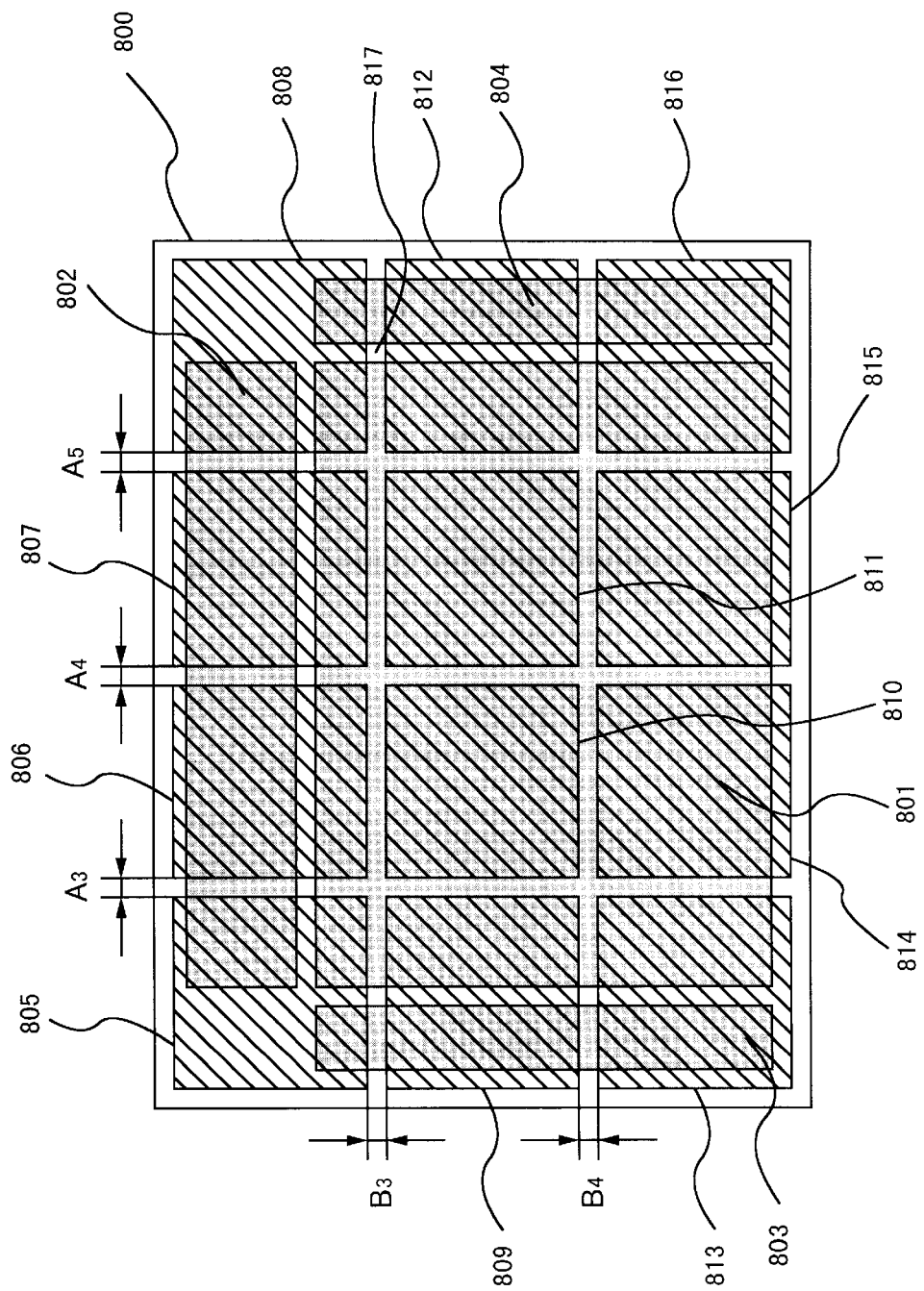
FIG. 8 is a view showing laser light irradiation regions of an amorphous silicon film polycrystallized by laser light in accordance with the present invention.
Figure 9:
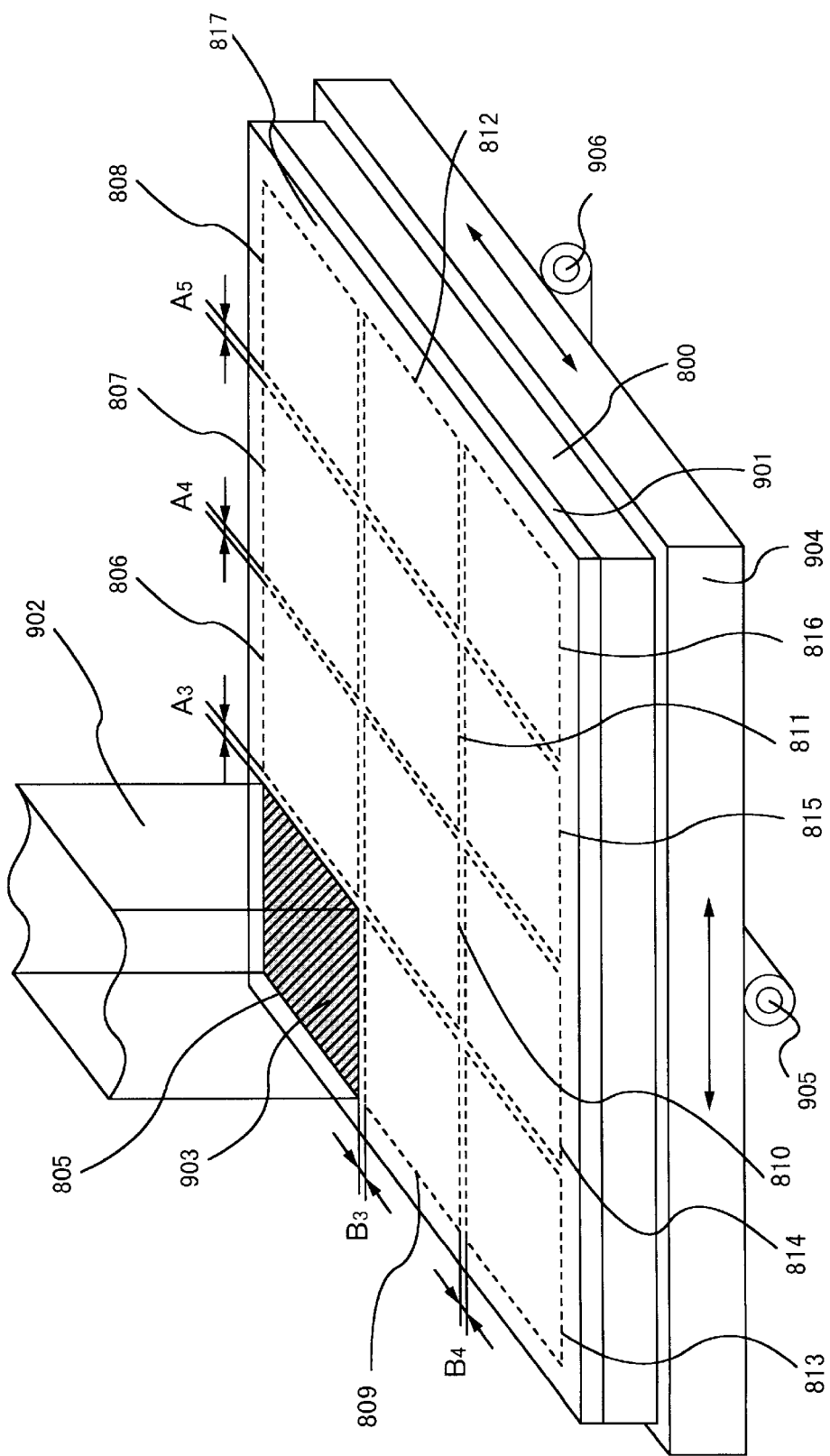
FIG. 9 is a view showing a mode of a system for polycrystallizing an amorphous silicon film in accordance with the present invention.
Figure 10:
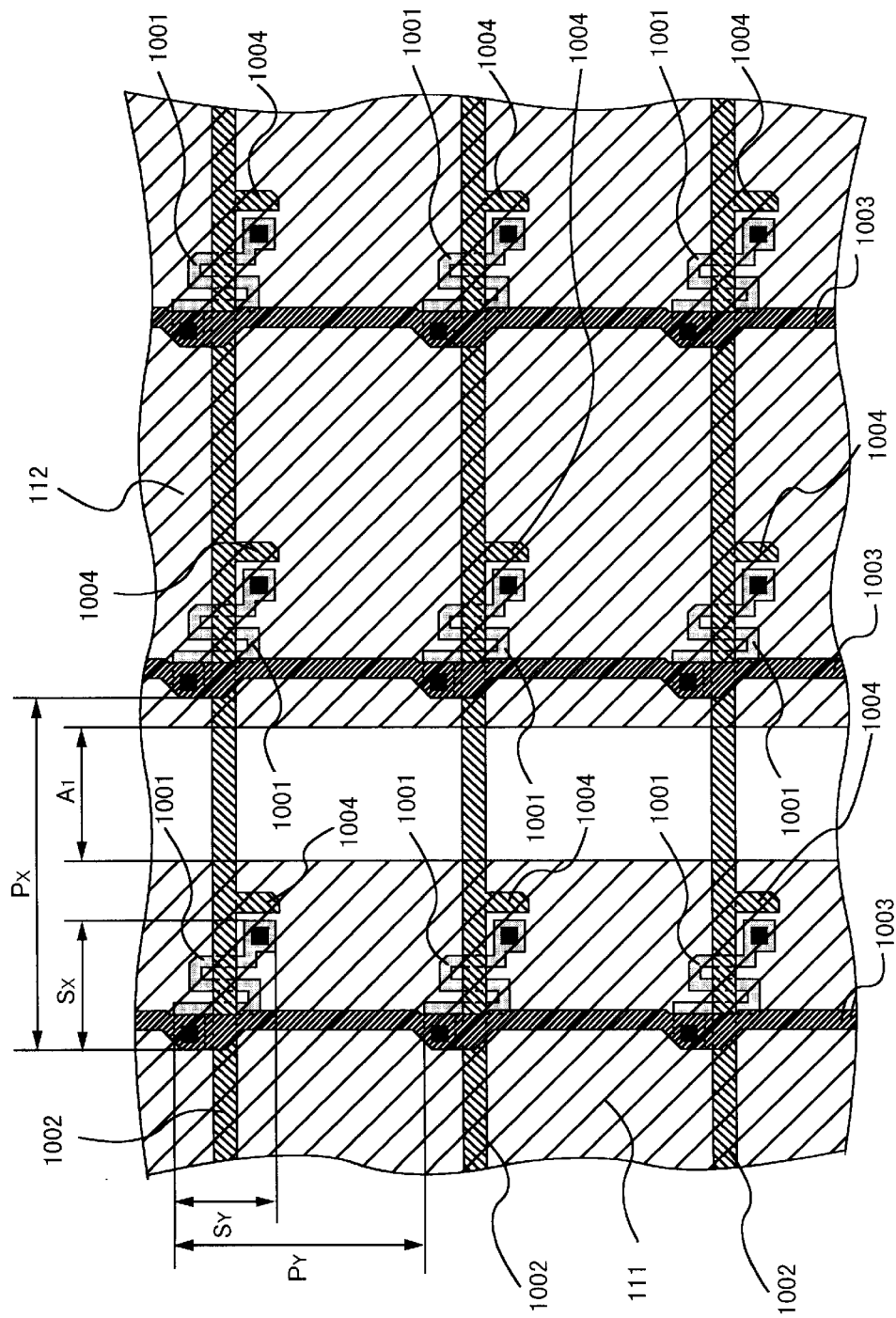
FIG. 10 is an enlarged view of the boundary between a laser light irradiation region and a laser light non-irradiation region in a system for polycrystallizing an amorphous silicon film in accordance with the present invention.
Figure 11:
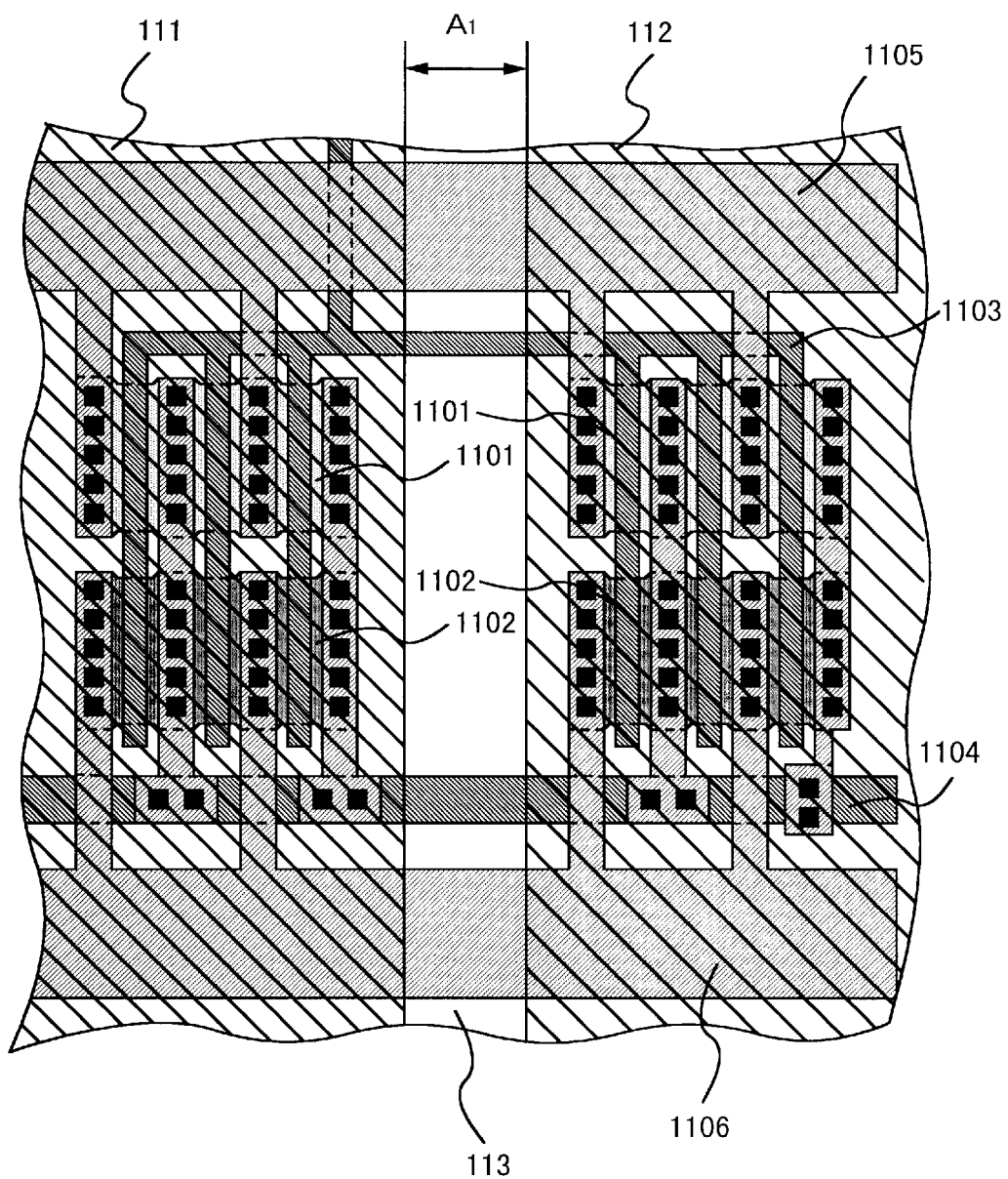
FIG. 11 is an enlarged view of the boundary between a laser light irradiation region and a laser light non-irradiation region in a system for polycrystallizing an amorphous silicon film in accordance with the present invention.
Figure 12:
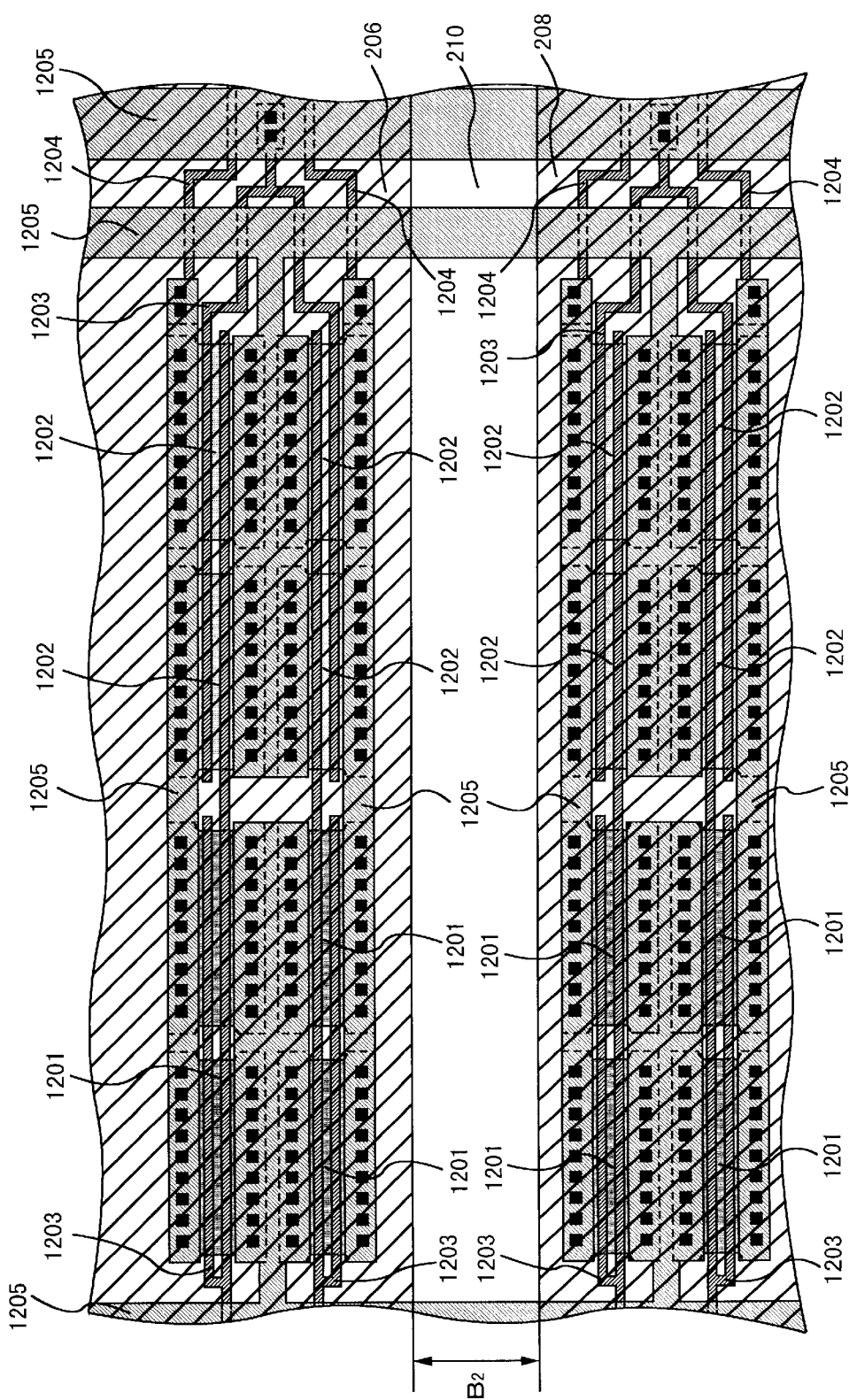
FIG. 12 is an enlarged view of the boundary between a laser light irradiation region and a laser light non-irradiation region in a system for polycrystallizing an amorphous silicon film in accordance with the present invention.
Figure 13:
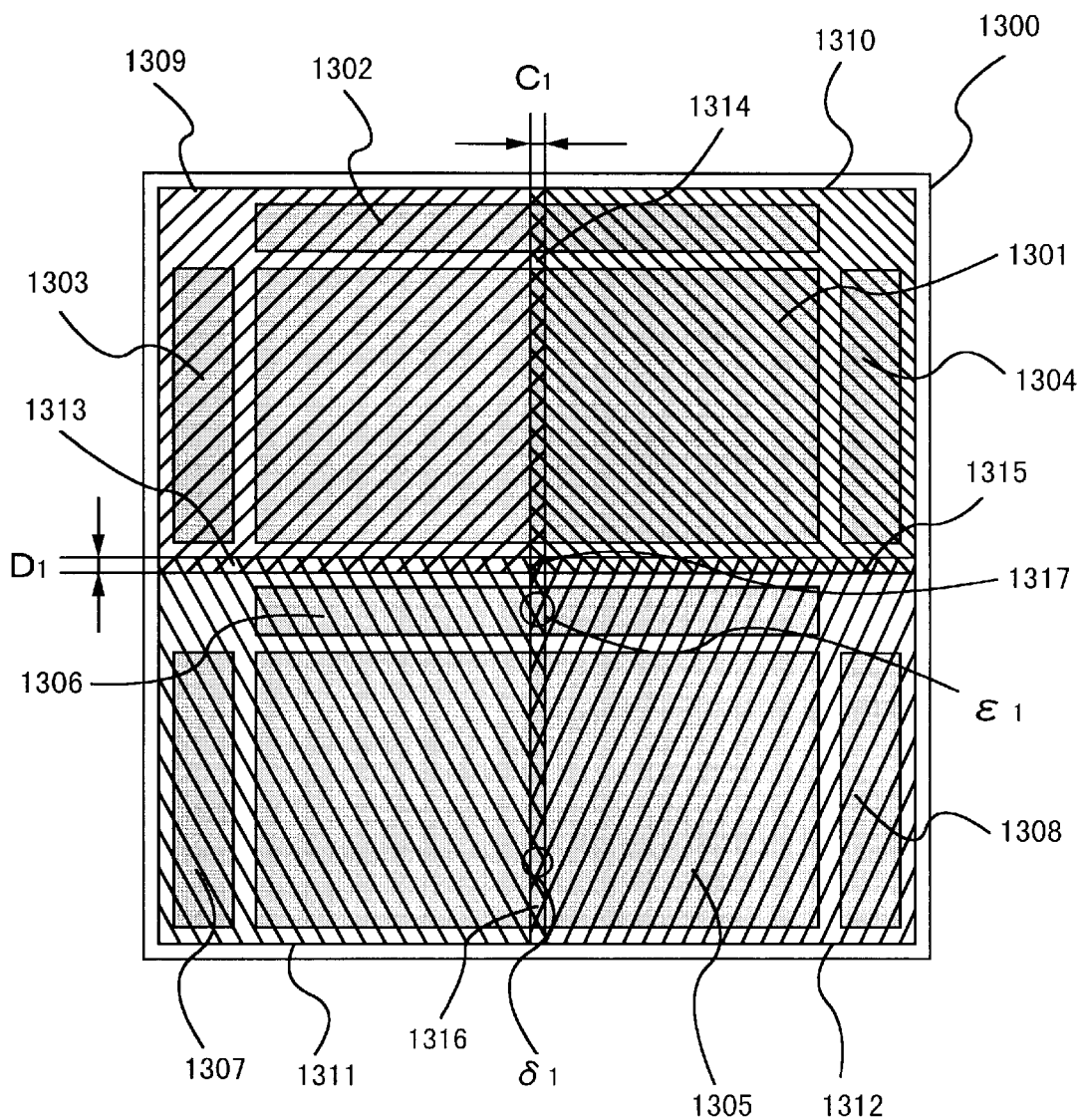
FIG. 13 is a view showing laser light irradiation regions of an amorphous silicon film polycrystallized by laser light in accordance with the present invention.
Figure 14:
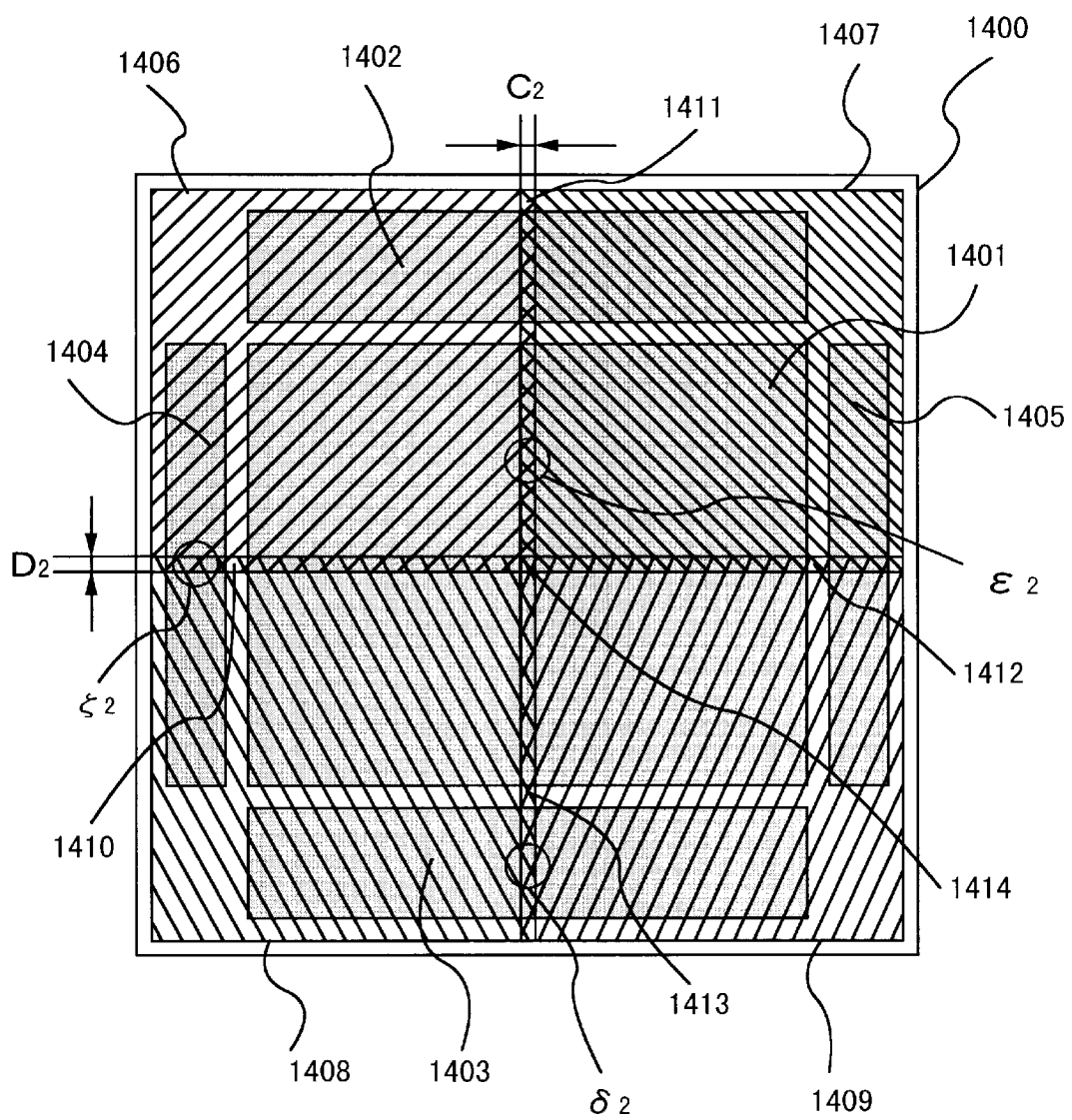
FIG. 14 is a view showing laser light irradiation regions of an amorphous silicon film polycrystallized by laser light in accordance with the present invention.
Figure 15:
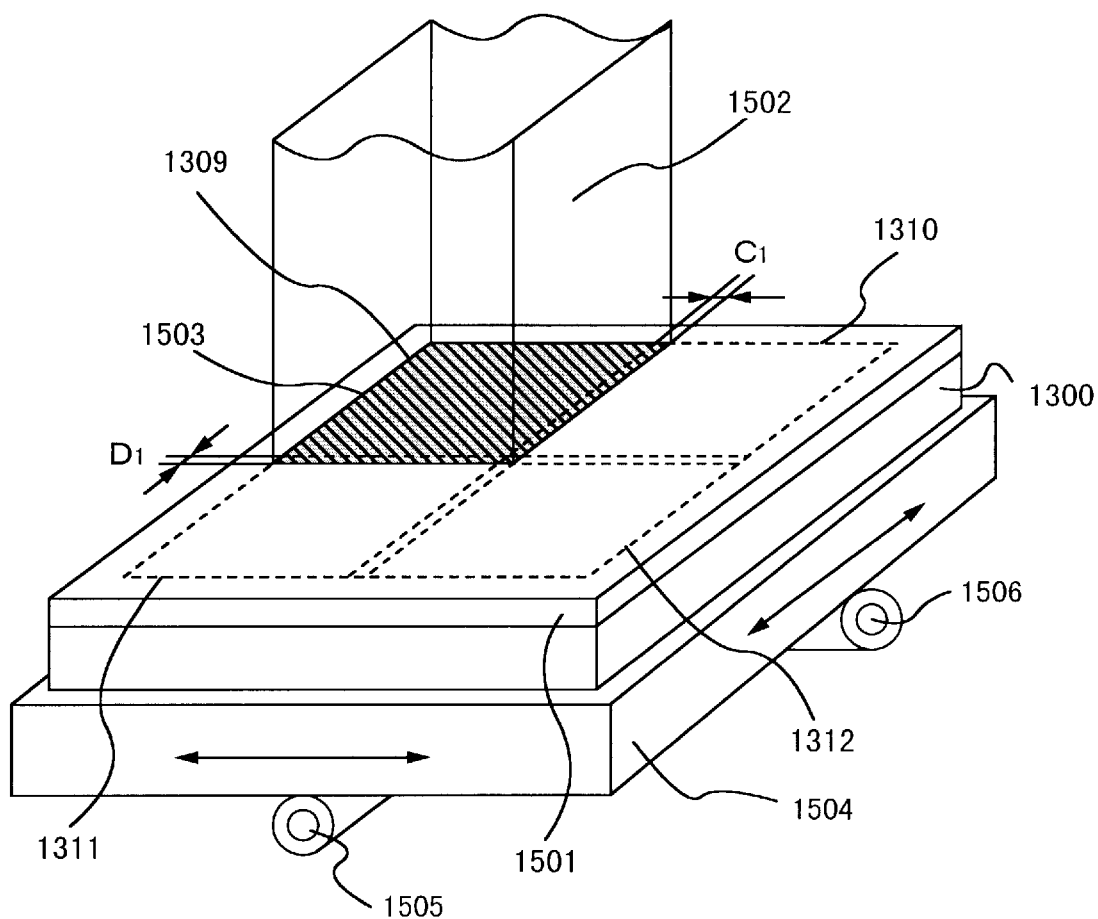
FIG. 15 is a view showing a mode of a system for polycrystallizing an amorphous silicon film in accordance with the present invention.
Figure 16:
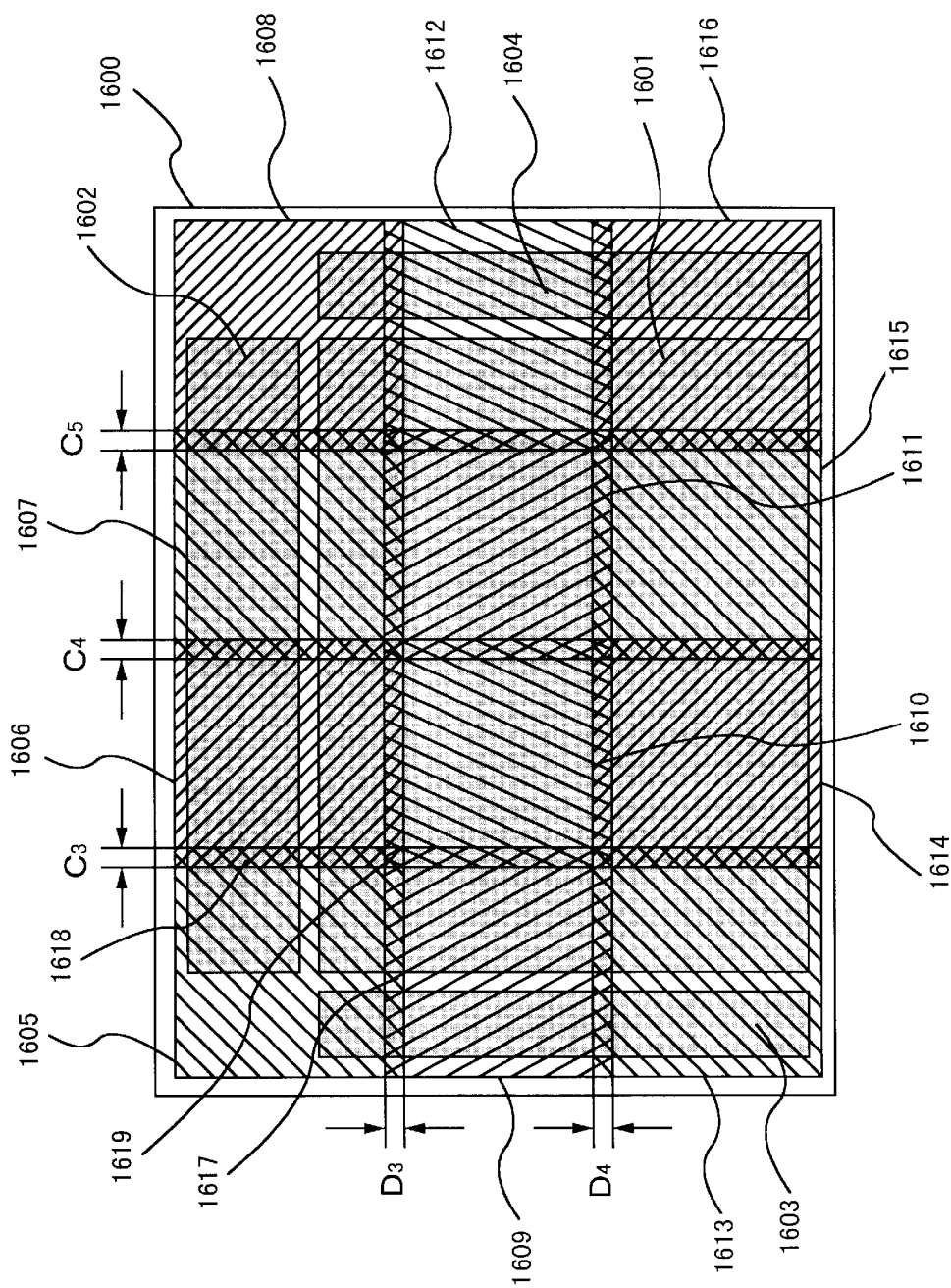
FIG. 16 is a view showing laser light irradiation regions of an amorphous silicon film polycrystallized by laser light in accordance with the present invention.
Figure 17:
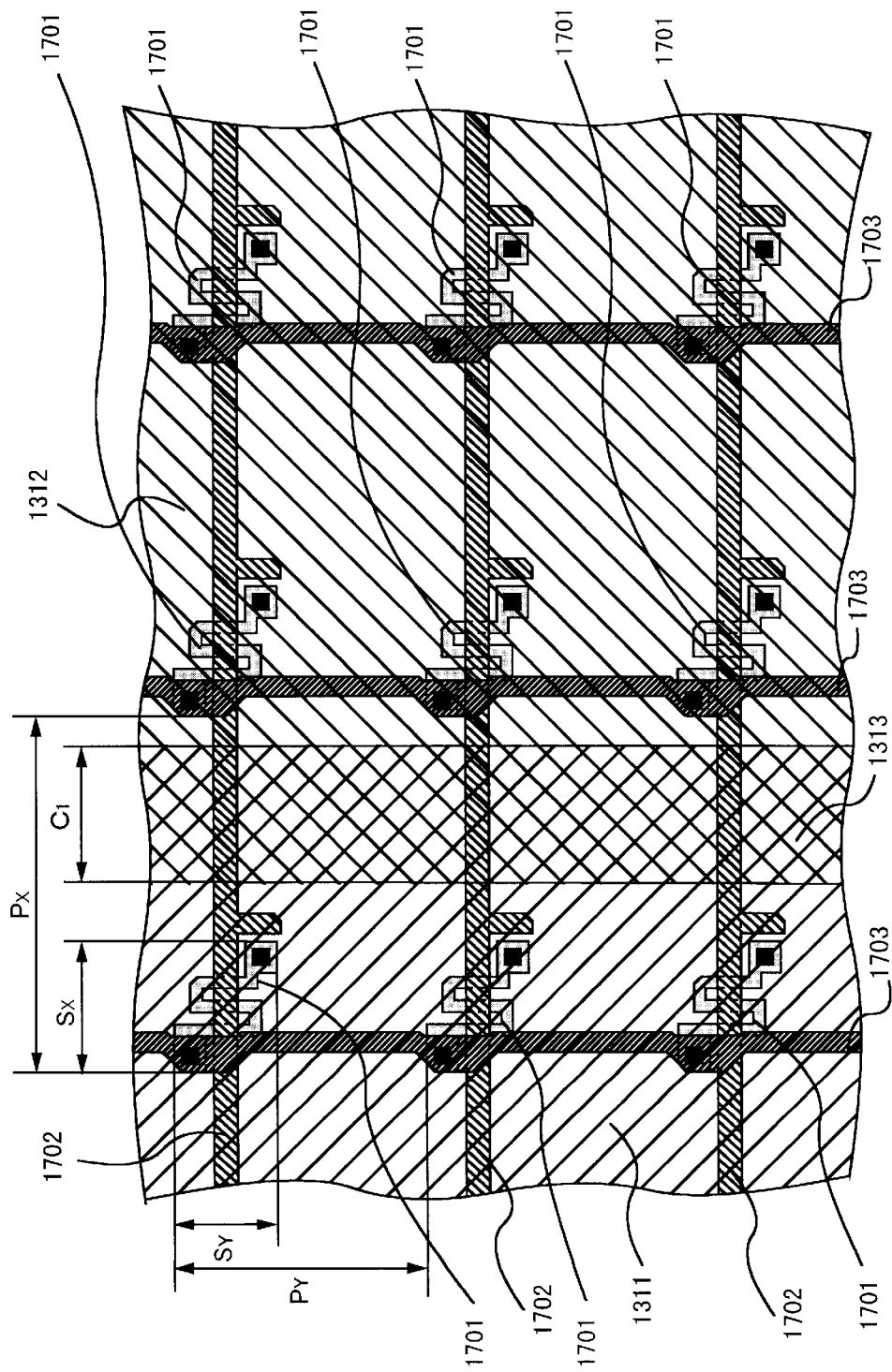
FIG. 17 is an enlarged view of an overlapping laser light irradiation region in a system for polycrystallizing an amorphous silicon film in accordance with the present invention.
Figure 18:
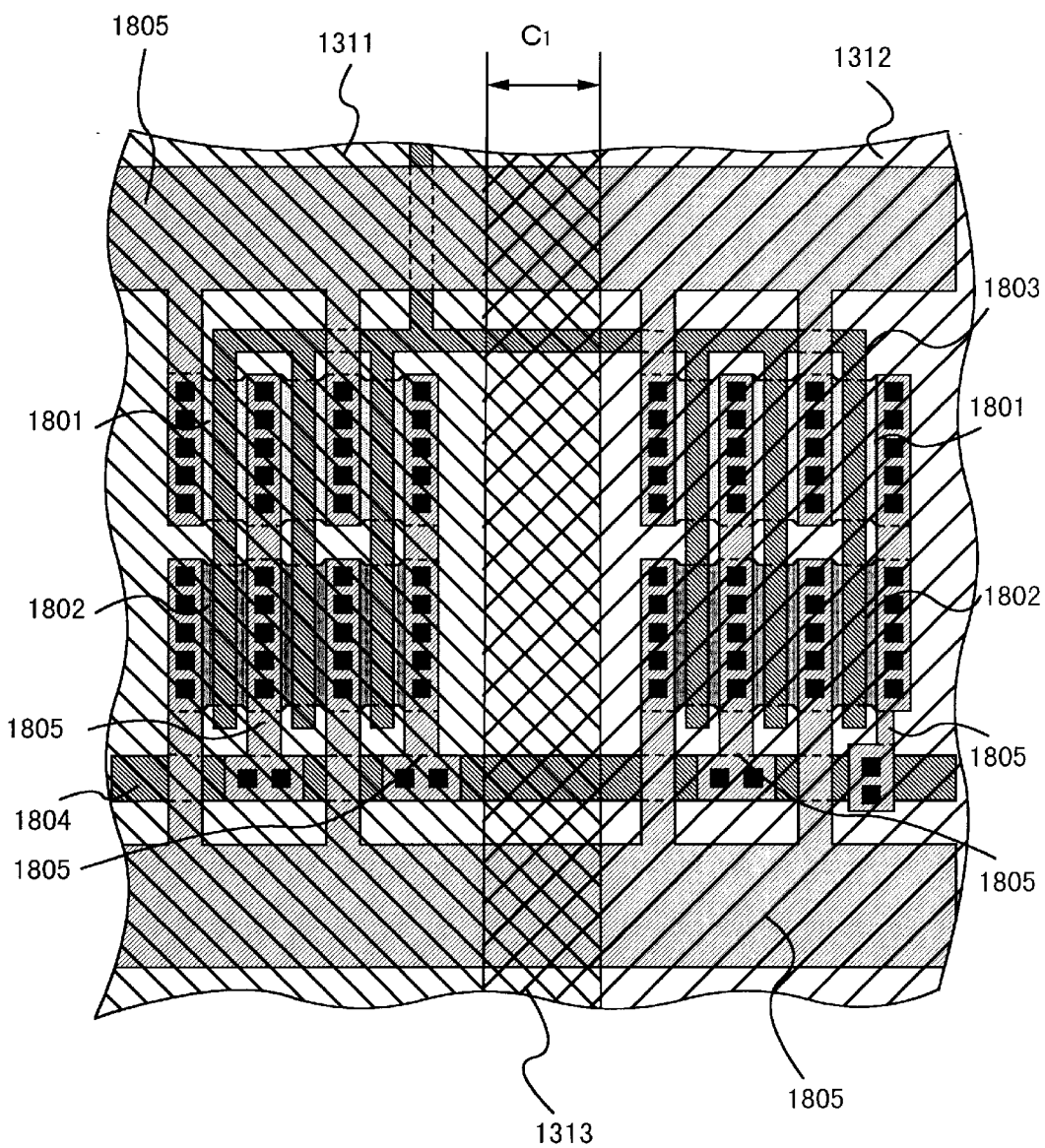
FIG. 18 is an enlarged view of an overlapping laser light irradiation region in a system for polycrystallizing an amorphous silicon film in accordance with the present invention.
Figure 19:
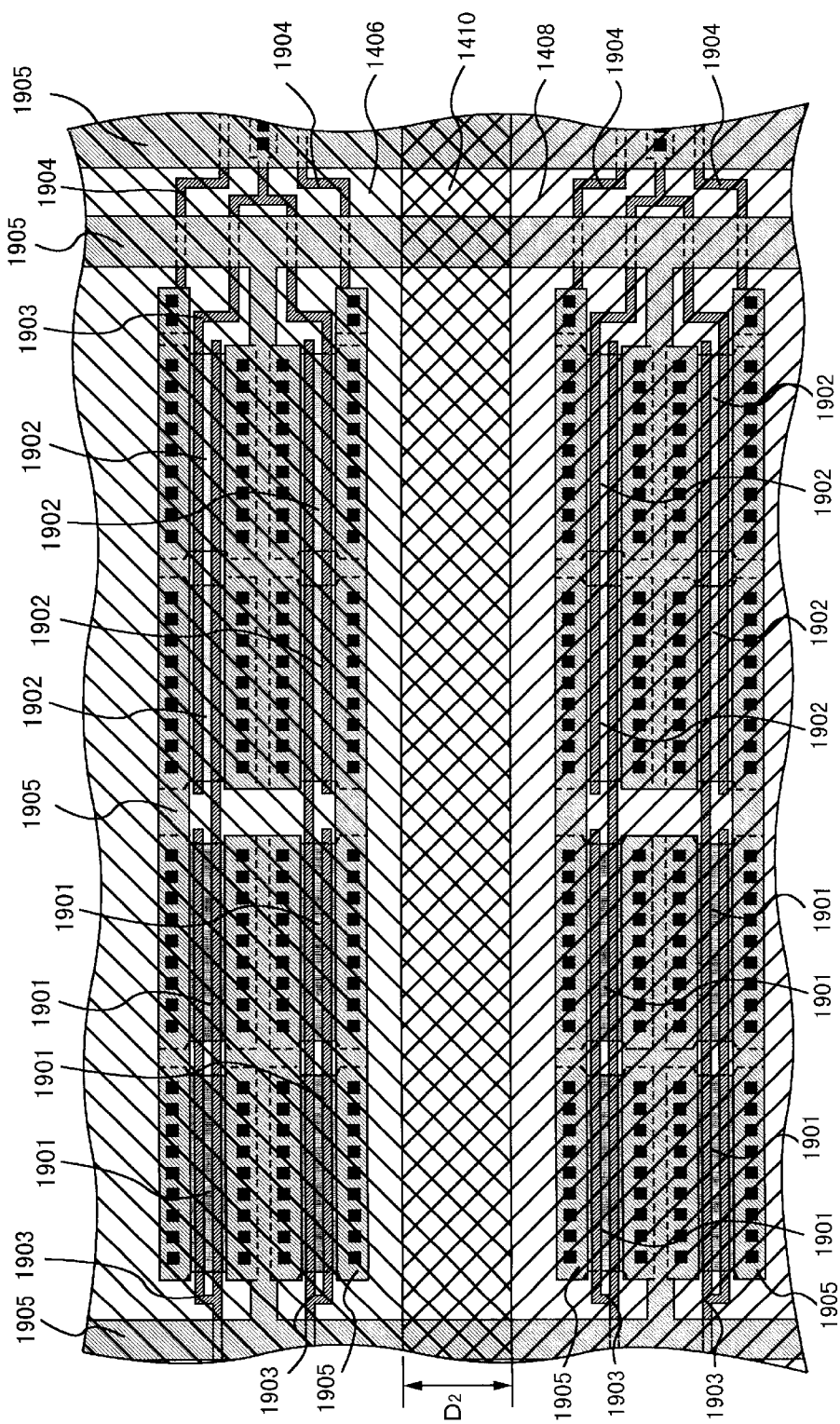
FIG. 19 is an enlarged view of an overlapping laser light irradiation region in a system for polycrystallizing an amorphous silicon film in accordance with the present invention.
Figure 20A:
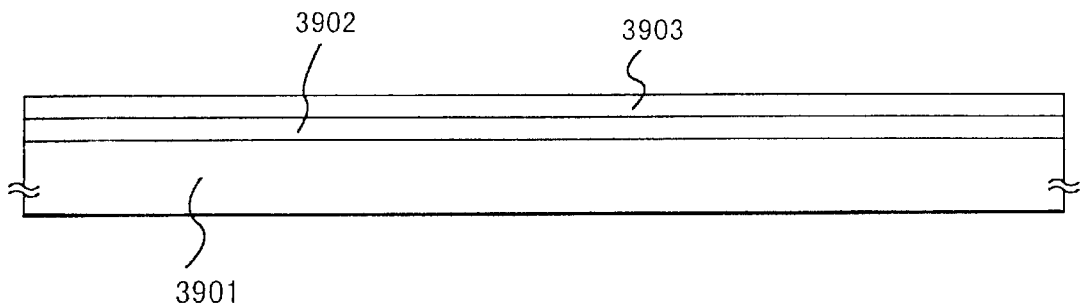
FIGS. 20A to 20C are views showing a manufacturing process of a liquid crystal display device of active matrix type using a system for polycrystallizing an amorphous silicon film in accordance with the present invention.

Referring to FIG. 20A, a glass substrate 3901 is first prepared as a substrate having an insulating surface. Instead of the glass substrate, a silicon substrate where a thermal oxide film is formed may be used, or may be used a quartz substrate. A method may be employed in which an amorphous silicon film is once formed on a glass substrate and is subjected to full thermal oxidization to form an insulating film. A glass substrate, quartz substrate, ceramics substrate or silicon substrate may be used if a silicon nitride film is formed thereon as an insulating film. Next, an under film 3902 is formed. In this embodiment, a silicon oxide film ($SiO_2$) is used. An amorphous silicon film 3903 is then formed. The amorphous silicon film 3903 is adjusted so as to have the final film thickness (a film thickness determined by taking into consideration the reduction in thickness of the film after thermal oxidization) of 10 to 75 nm (preferably 15 to 45 nm).

At the formation of the amorphous silicon film 3903, it is important to thoroughly control the concentration of impurities in the film. In the amorphous silicon film 3903 in this embodiment, the concentration of each impurity that inhibits later crystallization is controlled so that any of impurities C (carbon) and N (nitrogen) has a concentration of less than $5 \times 10^{18}$ atoms/$cm^3$ (representatively $5 \times 10^{17}$ atoms/$cm^3$ or less, and preferably $2 \times 10^{17}$ atoms/$cm^3$ or less), and impurity O (oxygen) has a concentration of less than $1.5 \times 10^{19}$ atoms/$cm^3$ (representatively $1 \times 10^{18}$ atoms/$cm^3$ or less, and preferably $5 \times 10^{17}$ atoms/$cm^3$ or less). This is because if each impurity exists with a concentration equal to or higher than the above, the impurities give adverse affect at later crystallization and cause degradation of film quality after crystallization. In the present specification, the above concentration of each impurity element is defined as the minimum value in measurement result of SIMS (Secondary Ion Mass Spectroscopy).

To obtain the above structure, a film formation chamber is desirably kept clean by regularly conducting dry cleaning of a low pressure CVD furnace that is used in this embodiment. Such dry cleaning is carried out by flowing 100 to 300 sccm of $ClF_3$ (chlorine fluoride) gas into the furnace heated up to about 200 to 400° C. to clean the film formation chamber with fluorine generated by thermal decomposition.

According to the knowledge of the present applicants, when the temperature in the furnace is 300° C. and the flow rate of the $ClF_3$ gas is 300 sccm, adhering deposit (containing silicon as a main component) with a thickness of about 2 μm can be completely removed for four hours.

The concentration of hydrogen in the amorphous silicon film 3903 is also an important parameter, and it seems that lowering hydrogen content results in obtaining a film of better crystallinity. For that reason, the amorphous silicon film 3903 is preferably formed by low pressure thermal CVD. Incidentally, plasma CVD may also be used if conditions for film formation are optimized.

Figure 20B:
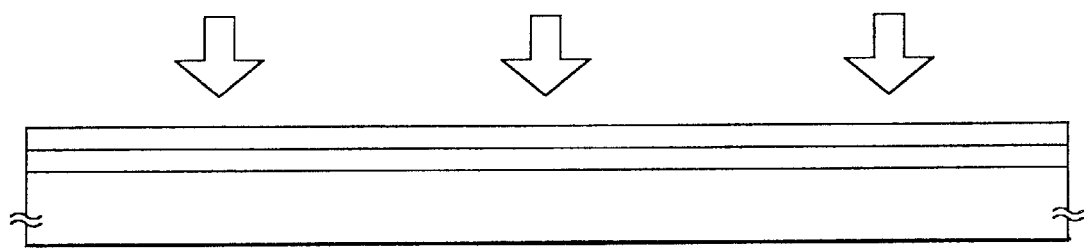
Figure 20C:
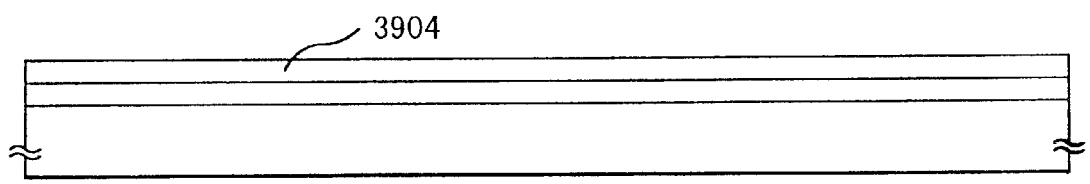

Subsequently performed is a polycrystallization step of the amorphous silicon film 3903 by irradiation of excimer laser. Reference is made to FIG. 20B, this embodiment uses an excimer laser having a large output of 15 J in one shot. Also, energy density thereof is 200 mJ/$cm^2$. A polycrystalline silicon film 3904 is thus obtained (FIG. 20C). The output of the excimer laser is desirably 5 J or more.

Figure 21A:
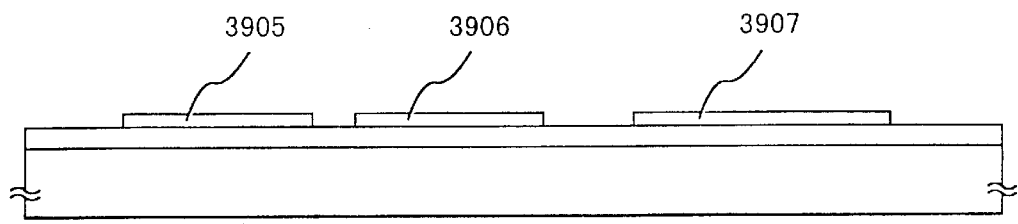
FIGS. 21A to 21C are views showing a manufacturing process of a liquid crystal display device of active matrix type using a system for polycrystallizing an amorphous silicon film in accordance with the present invention.

Next, referring to FIG. 21A, the polycrystalline silicon film 3904 is patterned to form semiconductor active layers 3905 to 3907.

Figure 21B:
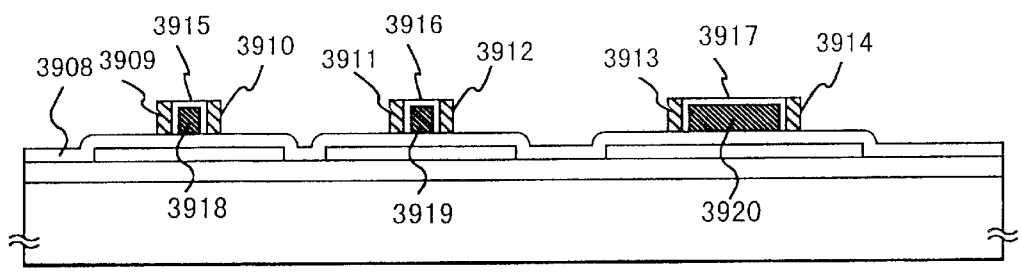
Figure 21C:
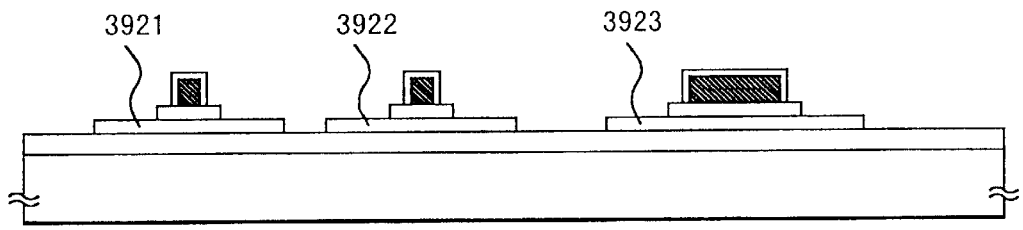

Then reference is made to FIG. 21B. After the active layers are formed by patterning, a gate insulating film 3908 is formed. Heat treatment is then applied under the oxidized atmosphere at a temperature of 800 to 1100° C. (preferably 950 to 1,050° C.) to form a thermal oxide film (not shown) at the interface between the active layers and the gate insulating film.

Follows next the formation of a not-shown metal film containing aluminum as a main component, which is patterned to form the original of what later becomes a gate electrode. In this embodiment, an aluminum film containing scandium of 2 wt % is used.

By means of a technique disclosed in Japanese Patent Application Laid-open No. Hei 7-135318, porous anodic oxidation films 3909 to 3914, not-porous anodic oxidation films 3915 to 3917 and gate electrodes 3918 to 3920 are then formed (FIG. 21B).

Figure 22A:
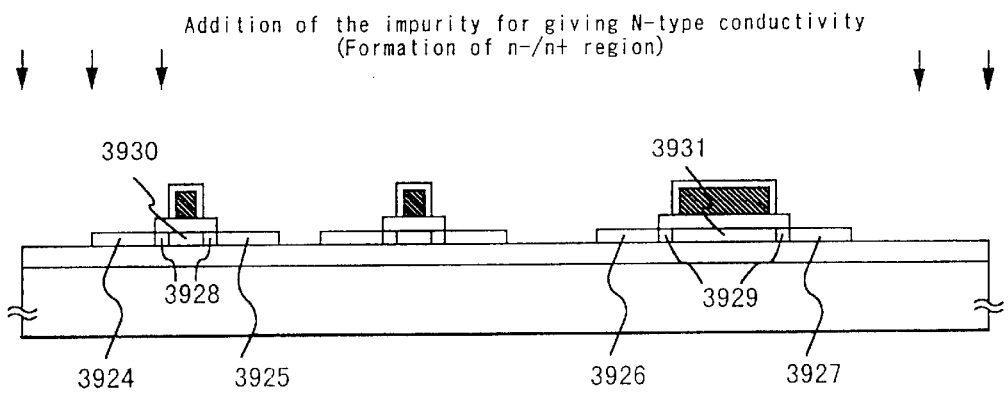
FIGS. 22A to 22C are views showing a manufacturing process of a liquid crystal display device of active matrix type using a system for polycrystallizing an amorphous silicon film in accordance with the present invention.

Upon obtaining a state shown in FIG. 21B in this way, the gate insulating film 3908 is subsequently etched using as masks the gate electrodes 3918 to 3920 and the porous anodic oxidation films 3909 to 3914. Thereafter, the porous anodic oxidation films 3909 to 3914 are removed to obtain a state shown in FIG. 21C. What denoted in FIG. 21C by reference numerals 3921 to 3923 is the gate insulating film 3908 after processing. Reference is made to FIG. 22A. The process subsequently proceeds to a step of adding an impurity element that gives monoconductivity. As the impurity element, P (phosphorus) or As (arsenic) may be used in the N channel type and B (boron) or Ga (gallium) may be used in the P channel type. In this embodiment, the impurities for forming the N channel type TFT and P channel type TFT are added twice in two steps, respectively.

Addition of the impurity for forming the N channel type TFT is first to be performed. The first addition of the impurity (P (phosphorus) is used in this embodiment) is carried out with high acceleration voltage of about 80 keV to form an n⁻ region. This n⁻ region is adjusted so as to have p ion concentration of $1\times10^{18}$ atoms/cm³ to $1\times10^{19}$ atoms/cm³.

Further, the second addition of the impurity is carried out with low acceleration voltage of about 10 keV to form an n⁺ region. At this time, the gate insulating films function as the masks because of the low acceleration voltage. This n⁺ region is adjusted so as to have a sheet resistance of 500Ω or less (preferably 300Ω or less).

Through the above steps, a source region and a drain region 3924 and 3925, lightly doped regions (LDD region) 3928 and a channel formation region 3930 of the N channel type TFT that constitutes the CMOS circuit are formed. Also, a source region and a drain region 3926 and 3927, lightly doped regions (LDD region) 3929 and a channel formation region 3931 of the N channel type TFT that constitutes the pixel TFT are determined (FIG. 22A).

In a state shown in FIG. 22A, the active layer of the P channel type TFT constituting the CMOS circuit has the same structure as that of the active layer of the N channel type TFT.

Figure 22B:
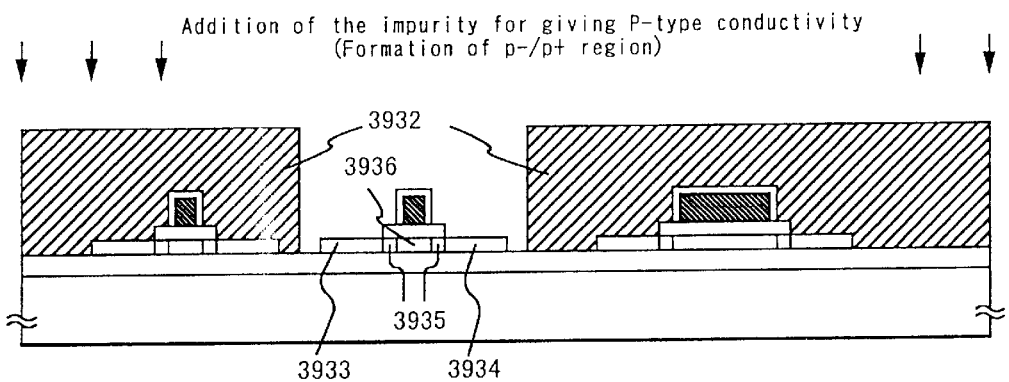

As shown in FIG. 22B, a resist mask 3932 is provided to cover the N channel type TFT so that the impurity ion for giving the P type conductivity (boron is used in this embodiment) is to be added.

This step is divided into two as in the aforementioned adding step of impurity. However, N channel type has to be reversed into P channel type, which requires addition of B (boron) ions having a concentration several times higher than the above addition concentration of P ion.

Thus, a source region and a drain region 3933 and 3934, lightly doped regions (LDD region) 3935 and a channel formation region 3936 of the P channel type TFT that constitutes the CMOS circuit are formed (FIG. 22B).

Subsequently, the impurity ions are to be activated using in combination the furnace annealing, laser annealing and lamp annealing. Damages made in the addition step is to be repaired at the same time.

Figure 22C:
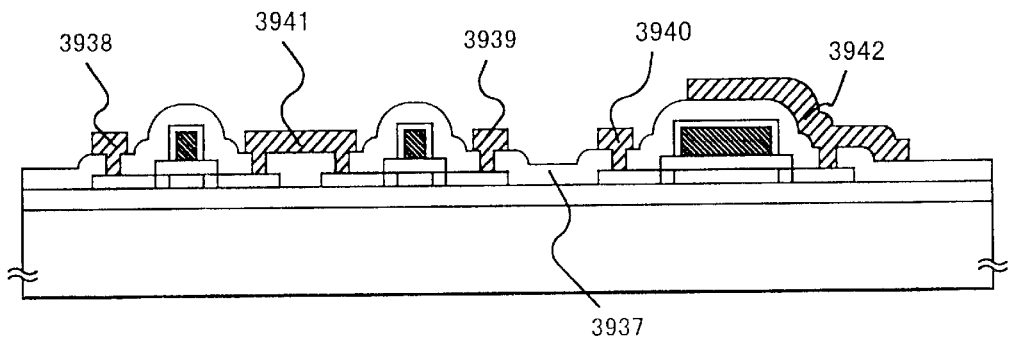

Reference is made to FIG. 22C. A lamination film in which a silicon oxide film and a silicon nitride film is laminated is formed as a first interlayer insulating film 3937, a contact hole is formed and, thereafter, source electrodes end drain electrodes 3938 to 3942 are formed to obtain a state shown in FIG. 22C. An organic resin film may be used for the interlayer insulating film 3937.

When the state shown in FIG. 22C is obtained, a second interlayer insulating film 3943 made of an organic resin is formed in a thickness of 0.5 to 3 μm. As the organic resin film, polyimide, acrylic resin, polyimideamide and the like may be used. The advantage of the organic resin film includes a simple film formation method, film thickness easy to be thicken, parasitic capacity reducible owing to low relative permittivity and excellent flatness. Incidentally, an organic resin film other than the films mentioned above may also be used.

Then, a black matrix 3944 made of a film capable of shielding light is formed on the second interlayer insulating film 3943. In this embodiment, titanium is used for the black matrix 3944. A resin film containing black pigment, or like films may also be used for the black matrix 3944.

A third interlayer insulating film 3945 made of an organic resin film is next formed by a thickness of 0.5 to 3 μm. As the organic resin film, polyimide, acrylic resin, polyimideamide and the like may be used. Incidentally, an organic resin film other than the films mentioned above may also be used.

A contact hole is then formed in the second interlayer insulating film 3943 and the third interlayer insulating film 3945, and a transparent pixel electrode 3946 with a thickness of 120 nm is formed. Since this embodiment takes up an example of an active matrix liquid crystal display device of transmission type, a transparent conductive film such as ITO is used as a conductive film constituting the transparent pixel electrode 3946.

Subsequently, the entire substrate is heated at a temperature of 350° C. in the hydrogen atmosphere for 1 to 2 hours so that the entire device is hydrogenated to compensate dangling bonds (unpaired bonds) in the film (particularly in the active layer). Through the above steps, the CMOS circuit and the pixel matrix circuit are formed on the same substrate.

Next, a process will be described of manufacturing an active matrix type liquid crystal display device by utilizing the active matrix substrate that is fabricated through the above process.

Figure 23A:
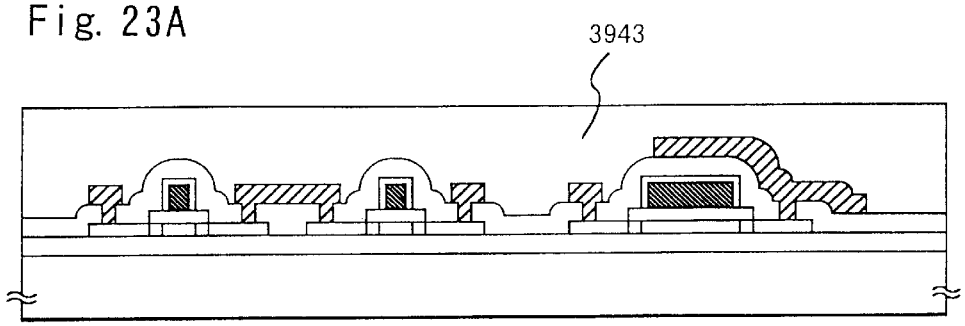
FIGS. 23A to 23C are views showing a manufacturing process of a liquid crystal display device of active matrix type using a system for polycrystallizing an amorphous silicon film in accordance with the present invention.
Figure 23B:
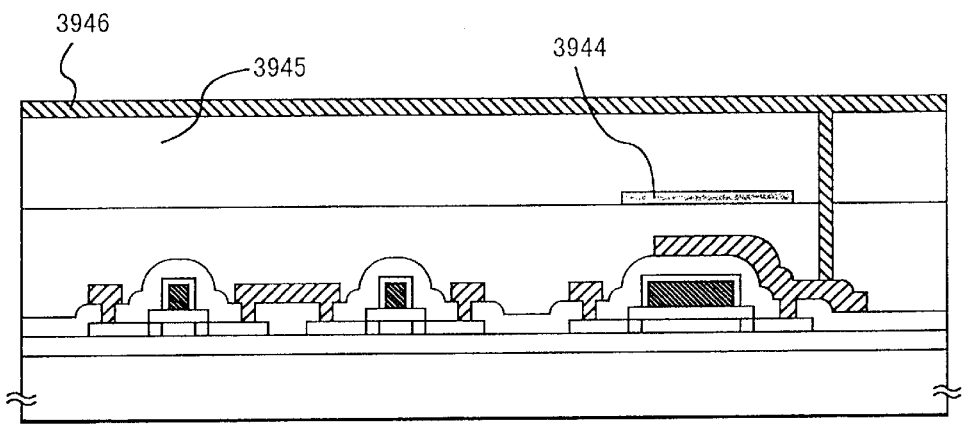

On the active matrix substrate in the state of FIG. 23B, an orientated film 3947 is formed. Polyimide is used for the orientated film 3947 in this embodiment. An opposite substrate is next prepared. The opposite substrate is comprised of a glass substrate 3948, an opposite electrode 3949 and another orientated film 3950.

In this embodiment, a polyimide film is used for the orientated film. After the orientated film is formed, rubbing treatment is applied. The polyimide film used in this embodiment is one that has a relatively small pre-tilt angle.

Then, the active matrix substrate through the above steps is bonded to the opposite substrate by a known cell assembling method through a sealing material or a spacer (both of them are not shown). Thereafter, liquid crystal 3951 is injected between the two substrate, and the substrates are completely sealed by an end-sealing material (not shown). In this embodiment, nematic liquid crystal is used for the liquid crystal 3951.

Figure 23C:
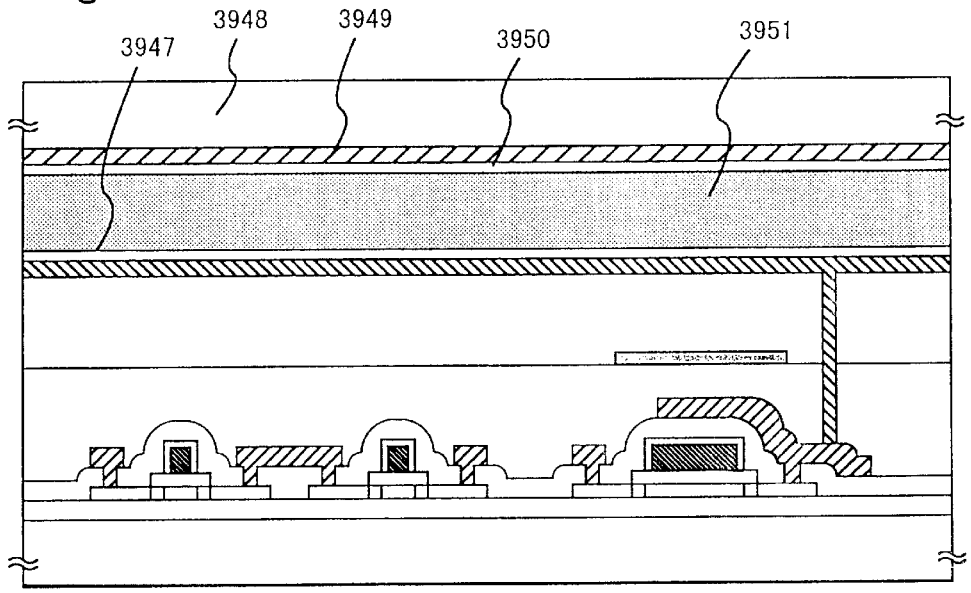

Thus is completed an active matrix liquid crystal display device of transmission type shown in FIG. 23C.

Embodiment 2

In this embodiment, concrete description will be made of the manufacture of an active matrix type liquid crystal display device having a TFT that is manufactured using a method of polycrystallizing an amorphous silicon film in accordance with the present invention. FIGS. 20A to 20C and 24A to 26C show an example in this embodiment, where a plurality of TFTs are formed to form a pixel matrix circuit, driver circuit, logic circuit and the like which are monolithically arranged. Incidentally, this embodiment shows a state in which one pixel of the pixel matrix circuit, and a CMOS circuit that is a basic circuit of other circuit (driver circuit, logic circuit or the like) are formed simultaneously. Although description in this embodiment is made of a manufacturing process of P channel type TFT and an N channel type TFT when each of the TFTs is provided with one gate electrode (two gate electrodes, in the case of a pixel TFT), it is possible to similarly manufacture a CMOS circuit comprising a TFT that is provided with a plurality of gate electrodes, such as a double gate type or a triple gate type.

Referring to FIG. 20A, a glass substrate 3901 is first prepared as a substrate having an insulating surface. Instead of the glass substrate, a silicon substrate where a thermal oxide film is formed may be used, or may be used a quartz substrate. A method may be employed in which an amorphous silicon film is once formed on a glass substrate or plastic substrate and is completely thermal-oxidized to form an insulating film. A glass substrate, quartz substrate, ceramics substrate, plastic substrate or silicon substrate may be used if a silicon nitride film is formed thereon as an insulating film.

Next, an under film 3902 is formed. In this embodiment, a silicon oxide film ($SiO_2$) is used. An amorphous silicon film 3903 is next to be formed. In this embodiment, the amorphous silicon film 3903 is formed by using $Si_2H_6$ as the raw material gas and through LPCVD method. The amorphous silicon film 3903 is adjusted so as to have the final film thickness (a film thickness determined by taking into consideration the reduction in thickness of the film after thermal oxidization) of 10 to 75 nm (preferably 15 to 45 nm).

At the formation of the amorphous silicon film 3903, it is important to thoroughly control the concentration of impurities in the film. In the amorphous silicon film 3903 in this embodiment, the concentration of each impurity that inhibits later crystallization is controlled so that any of impurities C (carbon) and N (nitrogen) has a concentration of less than $5 \times 10^{18}$ atoms/$cm^3$ (representatively $5 \times 10^{17}$ atoms/$cm^3$ or less, and preferably $2 \times 10^{17}$ atoms/$cm^3$ or less), and impurity O (oxygen) has a concentration of less than $1.5 \times 10^{19}$ atoms/$cm^3$ (representatively $1 \times 10^{18}$ atoms/$cm^3$ or less, and preferably $5 \times 10^{17}$ atoms/$cm^3$ or less). This is because if each impurity exists with a concentration equal to or higher than the above, the impurities give adverse affect at later crystallization and cause degradation of film quality after crystallization. In the present specification, the above concentration of each impurity element is defined as the minimum value in measurement result of SIMS (Secondary Ion Mass Spectroscopy).

To obtain the above structure, a film formation chamber is desirably kept clean by regularly conducting dry cleaning of a LPCVD furnace that is used in this embodiment. Such dry cleaning is carried out by flowing 100 to 300 sccm of $ClF_3$ (chlorine-fluoride) gas into the furnace heated up to about 200 to 400° C. to clean the film formation chamber with fluorine generated by thermal decomposition.

According to the knowledge of the present applicants, when the temperature in the furnace is 300° C. and the flow rate of the $ClF_3$ gas is 300 sccm, adhering deposit (containing silicon as a main component) with a thickness of about 2 $\mu$m can be completely removed for four hours.

The concentration of hydrogen in the amorphous silicon film 3903 is also an important parameter, and it seems that lowering hydrogen content results in obtaining a film of better crystallinity. For that reason, the amorphous silicon film 3903 is preferably formed by LPCVD method. Incidentally, plasma CVD method may also be used if conditions for film formation are optimized.

Subsequently performed is a polycrystallization step of the amorphous silicon film 3903 by irradiation of excimer laser of large output. In this step, as described on pages above concerning "Summary of the Invention", an irradiated region by the excimer laser is controlled depending on a design of a circuit.

Reference is made to FIG. 20B. In this embodiment, light from an excimer laser apparatus that has a large output of 15 J in one shot and has pulse width of 100 nsec is irradiated onto the amorphous silicon film 3903 to crystallize the amorphous silicon film. Also, energy density thereof is 200 mJ/$cm^2$. A polycrystalline silicon film 3904 is thus obtained (FIG. 20C). The excimer laser desirably has an output of 5 J or more and a pulse width of 100 nsec or more (preferably 200 nsec or more). Incidentally, the amorphous silicon film may be polycrystallized by being irradiated with a plurality of shots from the above excimer laser.

At this time, the device may be annealed in $N_2$ atmosphere or $H_2$ atmosphere at a temperature of 600° C. for about 20 hours.

Alternatively, the amorphous silicon film may be polycrystallized by continuously forming the silicon oxide film 3902 and the amorphous silicon film 3903 without exposing them to the air, further forming a silicon oxide film without exposing it to the air and, thereafter, irradiating with a laser light. Also, the amorphous silicon film may be polycrystallized by thermally annealing the amorphous silicon film 3903, forming a silicon oxide film on the top surface of the amorphous silicon film and, thereafter, irradiating with a laser light.

Figure 24A:
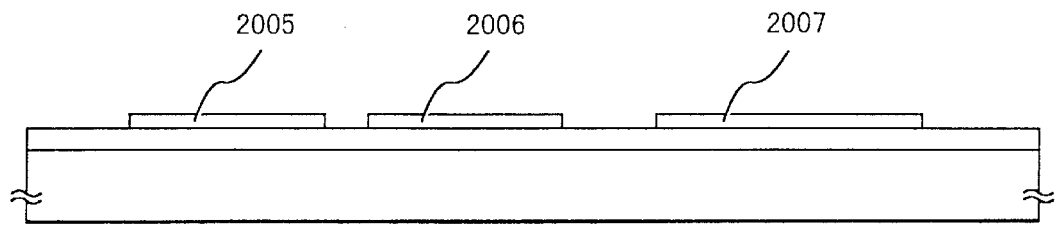
FIGS. 24A to 24C are views showing a manufacturing process of a liquid crystal display device of active matrix type using a system for polycrystallizing an amorphous silicon film in accordance with the present invention.

Next, referring to FIG. 24A, the polycrystalline silicon film 3904 is patterned to form active layers 2005 to 2007 of a thin film transistor. The above annealing may be performed after the patterning of the polycrystalline silicon film.

Figure 24B:
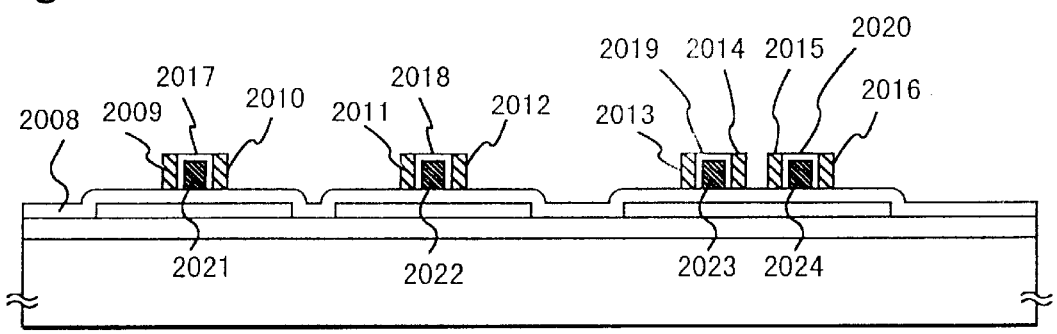
Figure 24C:
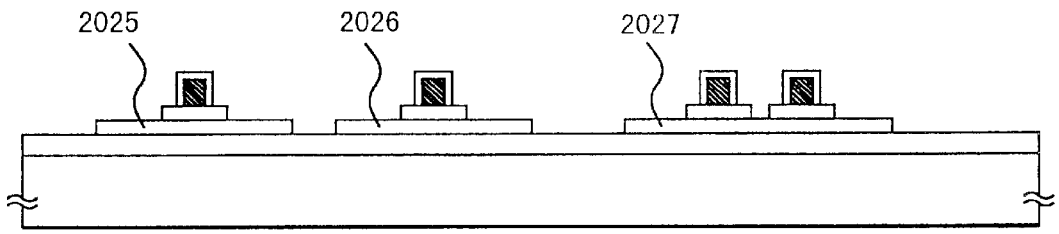

Then reference is made to FIG. 24B. After the active layers are formed, a gate insulating film 2008 is formed.

Follows next the formation of a not-shown metal film containing aluminum as a main component, which is patterned to form the original of what later becomes a gate electrode. In this embodiment, an aluminum film containing scandium of 2 wt % is used.

By means of a technique disclosed in Japanese Patent Application Laid-open No. Hei 7-135318, porous anodic oxidation films 2009 to 2016, not-porous anodic oxidation films 2017 to 2020 and gate electrodes 2021 to 2024 are then formed (FIG. 24B).

Upon obtaining a state shown in FIG. 24B in this way, the gate insulating film 2008 is subsequently etched using as masks the gate electrodes 2021 to 2024 and the porous anodic oxidation films 2009 to 2016. Thereafter, the porous anodic oxidation films 2009 to 2016 are removed to obtain a state shown in FIG. 24C. What denoted in FIG. 24C by reference numerals 2025 to 2027 are the gate insulating films 2008 after processing.

Figure 25A:
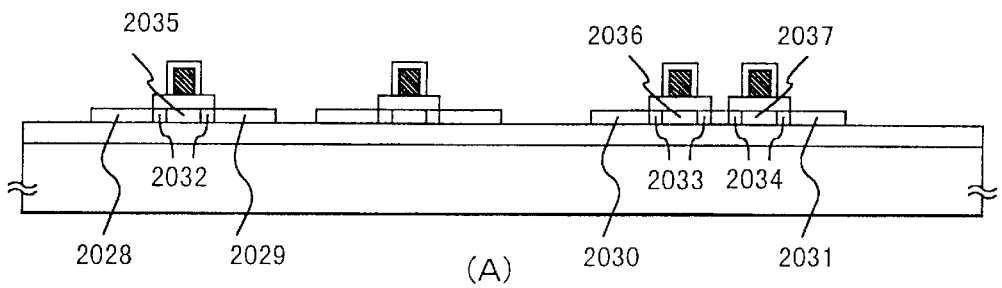
FIGS. 25A to 25C are views showing a manufacturing process of a liquid crystal display device of active matrix type using a system for polycrystallizing an amorphous silicon film in accordance with the present invention.

Reference is made to FIG. 25A. The process subsequently proceeds to a step of adding an impurity element that gives monoconductivity. As the impurity element, P (phosphorus) or As (arsenic) may be used in the N channel type and B (boron) or Ga (gallium) may be used in the P channel type. In this embodiment, the impurities for forming the N channel type TFT and P channel type TFT are added twice in two steps, respectively.

Addition of the impurity for forming the N channel type TFT is first to be performed. The first addition of the impurity (P (phosphorus) is used in this embodiment) is carried out with high acceleration voltage of about 80 keV to form an n− region. This n− region is adjusted so as to have p ion concentration of $1\times10^{18}$ atoms/cm$^3$ to $1\times10^{19}$ atoms/cm$^3$.

Further, the second addition of the impurity is carried out with low acceleration voltage of about 10 keV to form an n$^+$ region. At this time, the gate insulating films function as the masks because of the low acceleration voltage. This n$^+$ region is adjusted so as to have a sheet resistance of 500Ω or less (preferably 300Ω or less).

Through the above steps, a source region and a drain region 2028 and 2029, lightly doped regions (LDD region) 2032 and a channel formation region 2035 of the N channel type TFT that constitutes the CMOS circuit are formed. Also, a source region and a drain region 2030 and 2031, lightly doped regions (LDD region) 2033 and 2034 and channel formation regions 2036 and 2037 of the N channel type TFT that constitutes the pixel TFT are determined (FIG. 25A).

In a state shown in FIG. 25A, the active layer of the P channel type TFT constituting the CMOS circuit has the same structure as that of the active layer of the N channel type TFT.

Figure 25B:
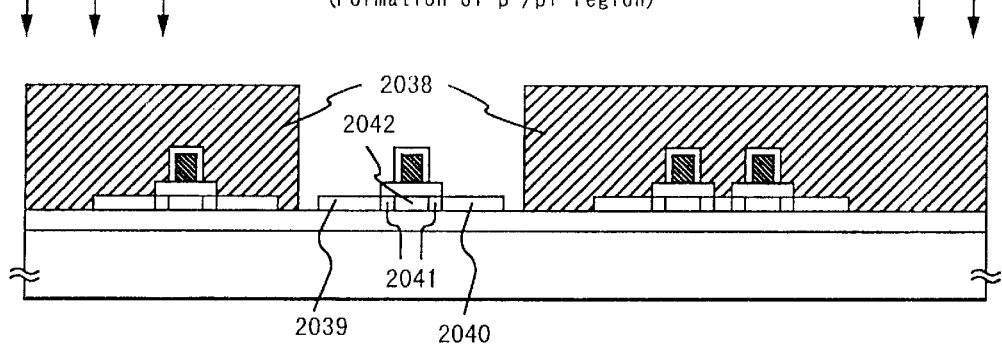

As shown in FIG. 25B, a resist mask 2038 is provided to cover the N channel type TFT so that the impurity ion for giving the P type conductivity (boron is used in this embodiment) is to be added.

This step is divided into two as in the aforementioned adding step of impurity. However, N channel type has to be reversed into P channel type, which requires addition of B (boron) ions having a concentration several times higher than the above addition concentration of P ion.

Thus, a source region and a drain region 2039 and 2040, lightly doped regions (LDD region) 2041 and a channel formation region 2042 of the P channel type TFT that constitutes the CMOS circuit are formed (FIG. 25B).

Though the gate electrodes are formed using an aluminum film containing 2 wt % of scandium in this embodiment, they may be formed using a polycrystalline silicon film. In that case, the LDD regions are formed using a side wall made of SiO$_2$, SiN or the like.

Subsequently, the impurity ions are to be activated using in combination the furnace annealing, laser annealing and lamp annealing. Damages made in the addition step is to be repaired at the same time.

Figure 25C:
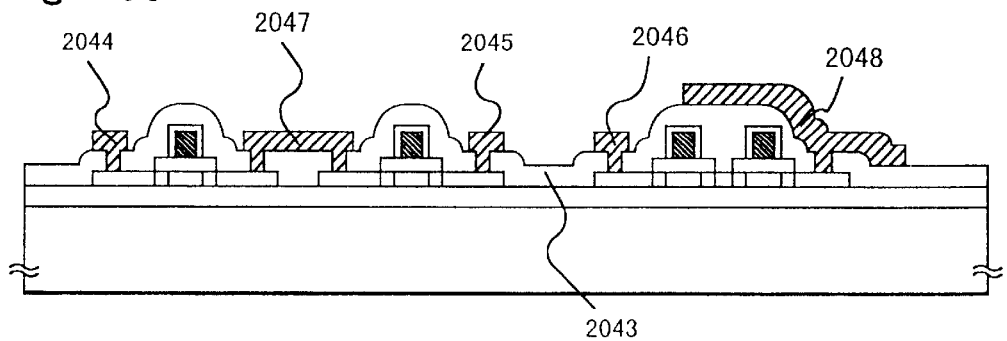

Reference is made to FIG. 25C. A lamination film in which a silicon oxide film and a silicon nitride film is laminated is formed as a first interlayer insulating film 2043, a contact hole is formed and, thereafter, source electrodes and drain electrodes 2044 to 2048 are formed to obtain a state shown in FIG. 25C. An organic resin film may be used for the first interlayer insulating film 2043.

Figure 26A:
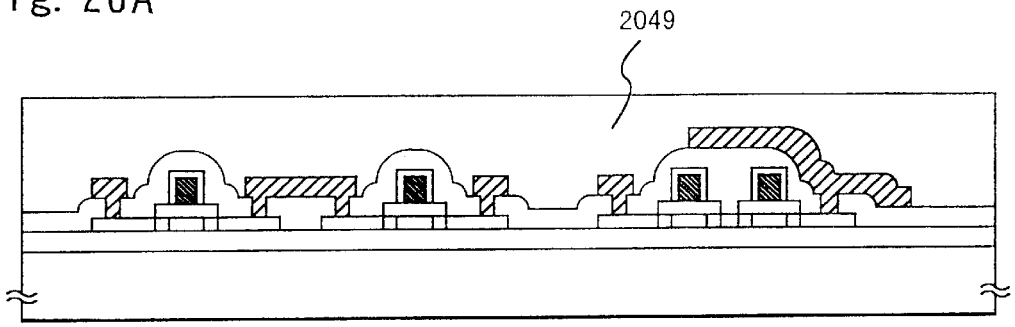
FIGS. 26A to 26C are views showing a manufacturing process of a liquid crystal display device of active matrix type using a system for polycrystallizing an amorphous silicon film in accordance with the present invention.

When the state shown in FIG. 25C is obtained, a second interlayer insulating film 2049 made of an organic resin is formed in a thickness of 0.5 to 3 μm (FIG. 26A). As the organic resin film, polyimide, acrylic resin, polyimideamide and the like may be used. The advantage of the organic resin film includes a simple film formation method, film thickness easy to be thicken, parasitic capacity reducible owing to low relative permittivity and excellent flatness. Incidentally, an organic resin film other than the films mentioned above may also be used.

Then, a part of the second interlayer insulating film 2049 is removed to form a black matrix 2050 made of a film capable of shielding light. In this embodiment, titanium is used for the black matrix 2050, and an auxiliary capacitance is provided between the drain electrode 2048 of the pixel TFT and the black matrix 2050. A resin film containing black pigment, or like films may also be used for the black matrix 2050.

A third interlayer insulating film 2051 made of an organic resin film is next formed by a thickness of 0.5 to 3 μm. As the organic resin film, polyimide, acrylic resin, polyimideamide and the like may be used. Incidentally, an organic resin film other than the films mentioned above may also be used.

A contact hole is then formed in the second interlayer insulating film 2049 and the third interlayer insulating film 2051, and a transparent pixel electrode 2052 with a thickness of 120 nm is formed. Since this embodiment takes up an example of an active matrix liquid crystal display device of transmission type, a transparent conductive film such as ITO is used as a conductive film constituting the transparent pixel electrode 2052.

Subsequently, the entire substrate is heated at a temperature of 350° C. in the hydrogen atmosphere for 1 to 2 hours so that the entire device is hydrogenated to compensate dangling bonds (unpaired bonds) in the film (particularly in the active layer). Through the above steps, the CMOS circuit and the pixel matrix circuit are formed on the same substrate.

Next, a process will be described of manufacturing an active matrix type liquid crystal display device by utilizing the active matrix substrate that is fabricated through the above process.

Figure 26B:
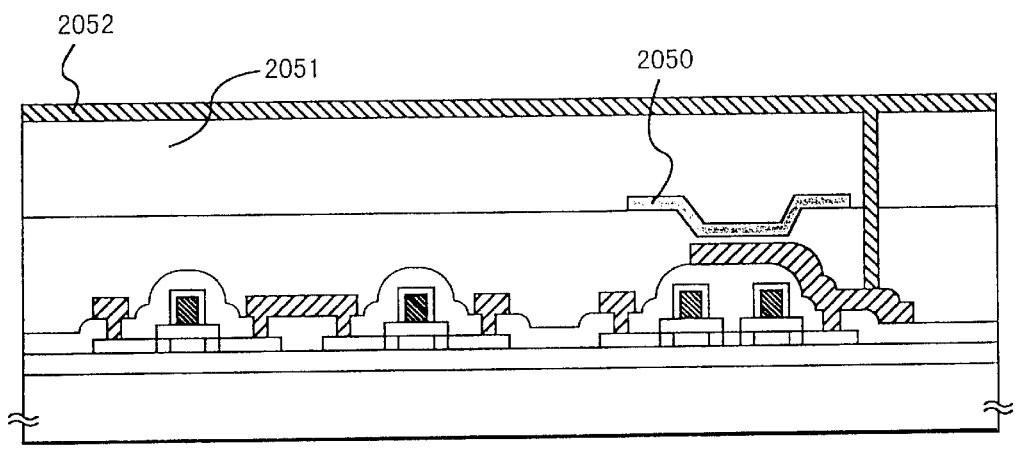

On the active matrix substrate in the state of FIG. 26B, an orientated film 2053 is formed. Polyimide is used for the orientated film 2053 in this embodiment. An opposing substrate is next prepared. The opposing substrate is comprised of a glass substrate 2054, a counter electrode 2055 and another orientated film 2056.

In this embodiment, a polyimide film is used for the orientated film. After the orientated film is formed, rubbing treatment is applied. The polyimide film used in this embodiment is one that has a relatively small pre-tilt angle.

Then, the active matrix substrate through the above steps is bonded to the opposing substrate by a known cell assembling method through a sealing material or a spacer (both of them are not shown). Thereafter, liquid crystal 2057 is injected between the two substrate, and the substrates are completely sealed by an end-sealing material (not shown). In this embodiment, nematic liquid crystal is used for the liquid crystal 2057.

Figure 26C:
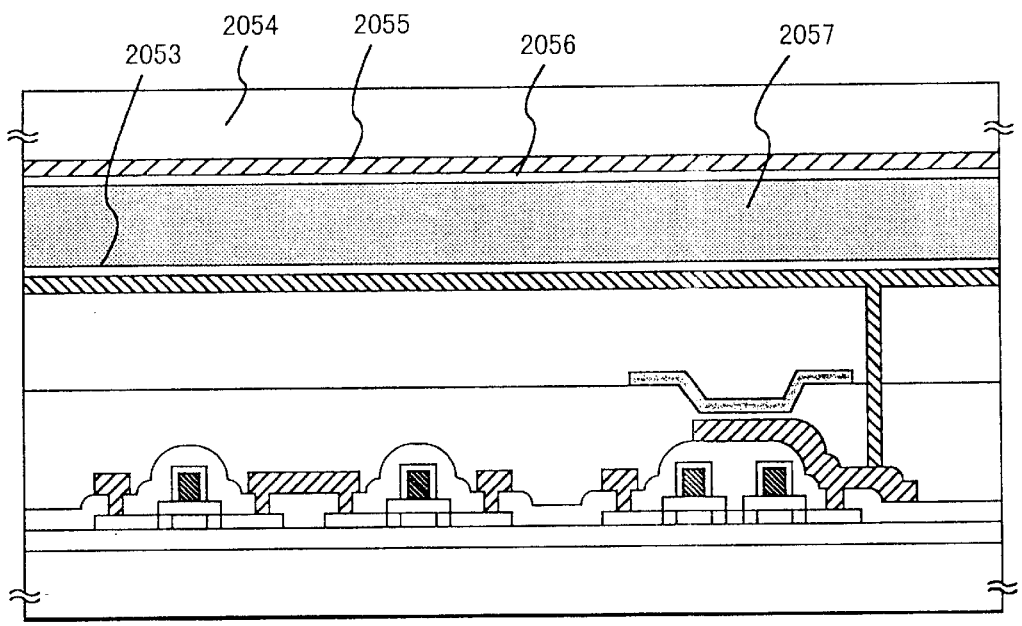

Thus is completed an active matrix liquid crystal display device of transmission type shown in FIG. 26C.

Figure 27A:
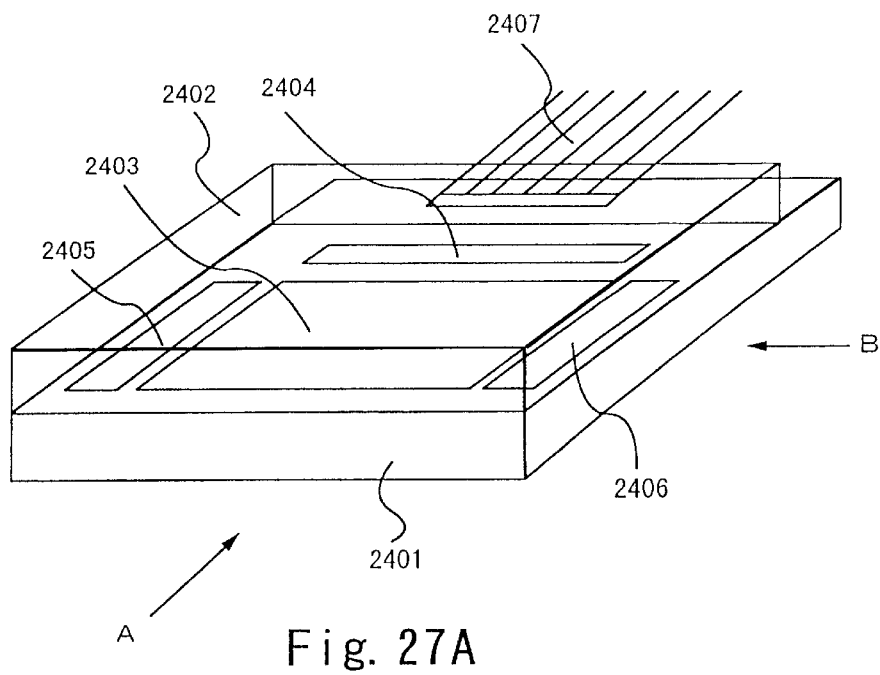
Figure 27B:
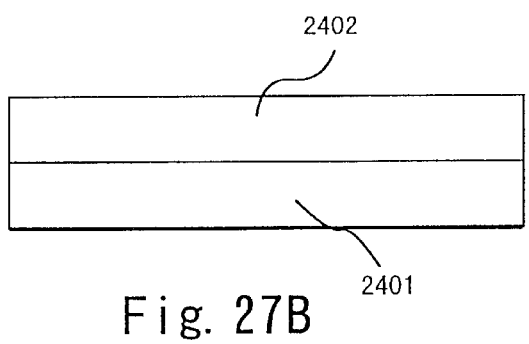
Figure 27C:
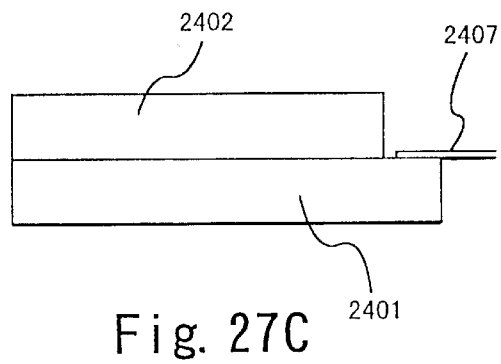

Here, reference is made to FIG. 27A. FIGS. 27A to 27C show an active matrix type liquid crystal display device manufactured in accordance with this embodiment. FIG. 27A is a perspective view showing the active matrix type liquid crystal display device. Reference numeral 2401 denotes an active matrix substrate; 2402, an opposing substrate; 2403, active matrix circuit; 2404, a source driver circuit; 2405 and 2406, gate driver circuits; and 2407, an FPC (Flexible Print Circuit).

FIG. 27B is a view showing the active matrix type liquid crystal display device observed from the direction A in FIG. 27A. FIG. 27C is a view showing the active matrix type liquid crystal display device observed from the direction B in FIG. 27A. Thus, three of the end faces, except a portion to which an FPC (Flexible Print Circuit) 2407 is connected, of the active matrix type liquid crystal display device according to the present invention are flush with one another.

Embodiment 3

In this embodiment, an active matrix type liquid crystal display device in the case where the film thickness of gate insulating film of The TFT constituting a driver circuit and other peripheral circuits is thinner than the film thickness of a gate insulating film of a pixel TFT constituting an active matrix circuit in Embodiment 2 will be described.

Figure 28:
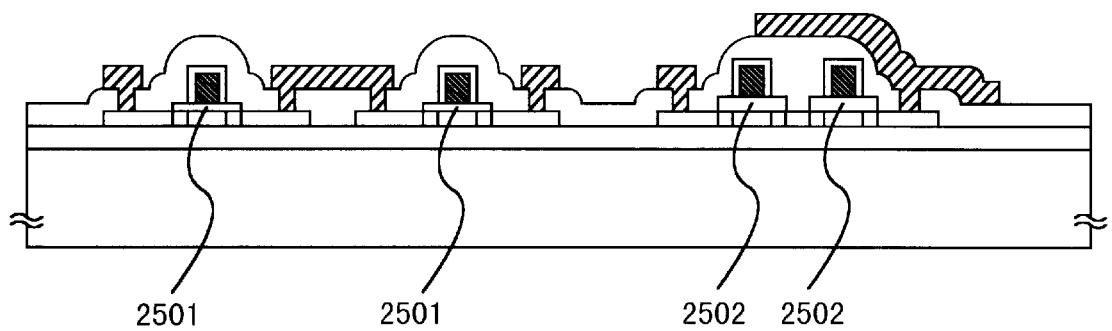
FIG. 28 is a view showing another embodiment of a liquid crystal display device of active matrix type using a system for polycrystallizing an amorphous silicon film in accordance with the present invention.

Reference is made to FIG. 28. In FIG. 28, an active matrix substrate of the active matrix type liquid crystal display device according to this embodiment is shown. Reference numeral 2501 denotes a gate insulating film of The TFT constituting a CMOS circuit which constitutes the driver circuit and other peripheral circuits. Reference 2502 denotes a gate insulating film of a pixel TFT constituting an active matrix circuit.

In this embodiment, the gate insulating film 2501 is 2 to 50 nm in film thickness (representatively, 30 nm), and the gate insulating film 2502 is 100 to 150 nm in film thickness (representatively, 120 nm). With this film thickness, the CMOS circuit constituting the driver circuit and other peripheral circuits can be operated with low voltage and high frequency.

The method of manufacturing the active matrix type liquid crystal display device according to this embodiment can be referred to Embodiment 2. However, this embodiment is different from Embodiment 2 in point that the gate insulating film of The TFT constituting a CMOS circuit which constitutes the driver circuit and other peripheral circuits is etched to make it thinner after forming the gate insulating film. Also, by further forming the gate insulating film only to the pixel TFT after forming the gate insulating film, it is possible to make a difference in film thickness between the gate insulating film of TFT constituting the CMOS circuit and the gate insulating film constituting the active matrix circuit.

Embodiment 4

In this embodiment, a case in which a polycrystallization system of amorphous silicon film according to the present invention is used for manufacturing a TFT of inverted stagger type will be described.

Figure 29:
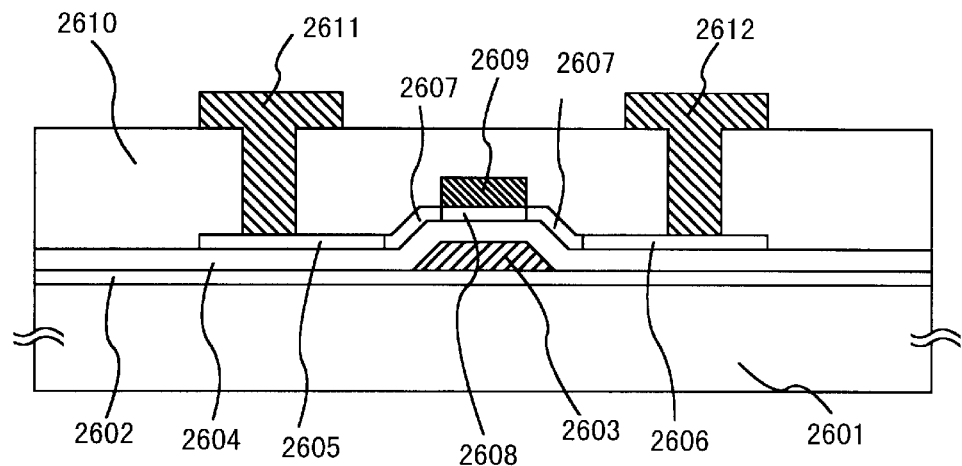
FIG. 29 is a view showing another embodiment of a liquid crystal display device of active matrix type using a system for polycrystallizing an amorphous silicon film in accordance with the present invention.

Reference is made to FIG. 29. In FIG. 29, a sectional view of the TFT of inverted stagger type according this embodiment is shown. Reference numeral 2601 denotes a substrate, and which is described in Embodiment 2 is used. Reference numeral 2602 denotes an oxide silicon film. Reference numeral 2603 denotes a gate electrode. Reference numeral 2604 denotes a gate insulating film. Reference numerals 2605, 2606, 2607, and 2608 denote active layers formed of polycrystalline silicon film. Upon manufacturing this active layer, a method similar to the polycrystallization of amorphous silicon film described in Embodiment 2 is employed. It should be noted that reference numeral 2605 denotes a source region, reference numeral 2606 denotes a drain region, reference numeral 2607 denotes a lightly doped region (LDD region), and reference numeral 2608 denotes a channel formation region. Reference numeral 2609 denotes a channel protective film, and reference numeral 2610 denotes a interlayer insulating film. Reference numerals 2611 and 2612 denote a source electrode and a drain electrode, respectively.

Embodiment 5

In this embodiment, a case in which a polycrystallization method of amorphous silicon film according to the present invention is used for manufacturing a TFT of inverted stagger type with different structure from that of Embodiment 4 will be described.

Figure 30:
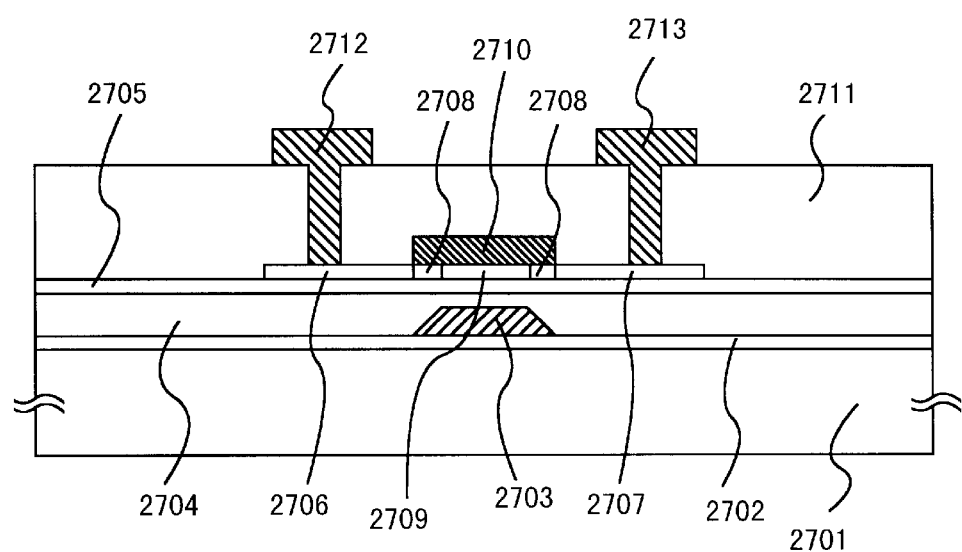
FIG. 30 is a view showing another embodiment of a liquid crystal display device of active matrix type using a system for polycrystallizing an amorphous silicon film in accordance with the present invention.
Figure 31:
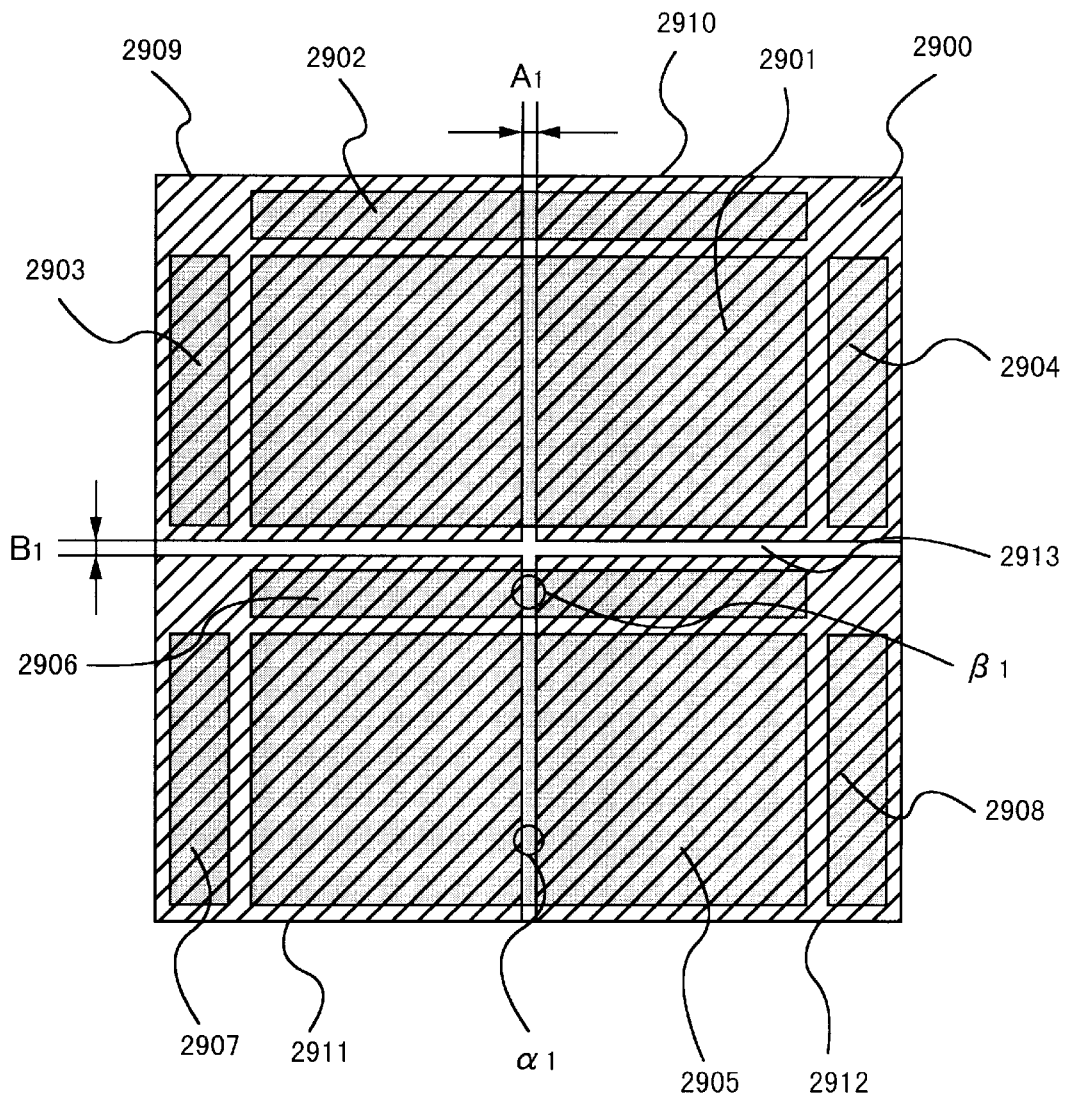
FIG. 31 is a view showing laser light irradiation regions of an amorphous silicon film polycrystallized by laser light in accordance with the present invention.

Reference is made to FIG. 30. In FIG. 30, a sectional view of the TFT of inverted stagger type according this embodiment is shown. Reference numeral 2701 denotes a substrate, and which is described in Embodiment 2 is used. Reference numeral 2702 denotes an oxide silicon film. Reference numeral 2703 denotes a gate electrode. Reference numeral 2704 denotes a benzocyclobutene (BCB) film, and an upper surface thereof is flattened. Reference numeral 2705 denotes a silicon nitride film. A gate insulating film is formed of the BCB film and the silicon nitride film. Reference numerals 2706, 2707, 2708, and 2709 denote active layers formed of polycrystalline silicon film. Upon manufacturing this active layer, a method similar to the polycrystallization of amorphous silicon film described in Embodiment 2 is employed. It should be noted that reference numeral 2706 denotes a source region, reference numeral 2707 denotes a drain region, reference numeral 2708 denotes a lightly doped region (LDD region), and reference numeral 2709 denotes a channel formation region. Reference numeral 2710 denotes a channel protective film, and reference numeral 2711 denotes a interlayer insulating film. Reference numerals 2712 and 2713 denote a source electrode and a drain electrode, respectively.

According to this embodiment, since the gate insulating film formed of the BCB film and the silicon nitride film is flattened, an amorphous silicon film formed thereon is also a flat one. Therefore, when the amorphous silicon is polycrystallized, a more uniform polycrystalline silicon film can be obtained than from the conventional TFT of inverted stagger type.

Embodiment 6

In this embodiment, a method of manufacturing a TFT with different structure from that of Embodiment 2 will be described with reference to FIG. 32 and FIG. 33. It should be noted since a process up to the formation of the gate insulating film shown in FIG. 24B of Embodiment 2 is identical with Embodiment 2, the description thereof will be omitted. Incidentally, in this embodiment, a silicon germanium film represented by $Si_xGe_{1-x}$ (0<X<1) may be used in place of the amorphous silicon film.

Reference is made to FIG. 32. A tantalum film (Ta film) 3003 of 20 nm in film thickness and an aluminum film (Al film) 3004 of 40 nm in film thickness containing 2 wt % of scandium are laminated and formed on a gate insulating film 3002 in a sputtering system. Then, the Al film 3004 is contacted to a probe P of an anodic oxidation system to flow a current, thus a thin barrier type alumina film (not shown) is formed on the surface of the Al film 3004. This anodic oxidation process is to enhance the adhesion of a resist mask 3005. As the condition, ethylene glycol solution containing 3% of tartaric acid is used for electrolytic solution, the electrolytic solution temperature is 30° C., the ultimate voltage is 10 V, the voltage apply time is 15 minutes, and the supply current is 10 mA/substrate. Thus, the resist mask 3005 is formed. (FIG. 32B)

The not-shown alumina film is etched by chrome mixed acid, and then the aluminum film is etched by aluminum mixed acid to form an aluminum layer (Al layer) 3006 as a second wiring layer. The Al layer 3006 constitutes the upper layer of a gate wiring. The Al layer 3006 on the left is finally formed on an active layer 3001, and serves as a gate electrode of a TFT. Also, the Al layer 3006 on the right serves as a contact portion for connecting with an external terminal later on.

Figure 32A:
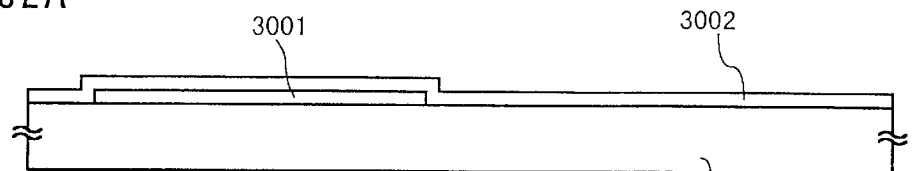
FIGS. 32A to 32F are views showing another manufacturing process of a liquid crystal display device of active matrix type using a system for polycrystallizing an amorphous silicon film in accordance with the present invention.
Figure 32B:
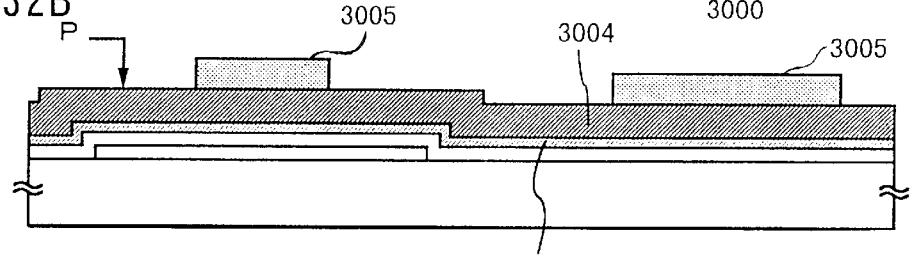
Figure 32C:
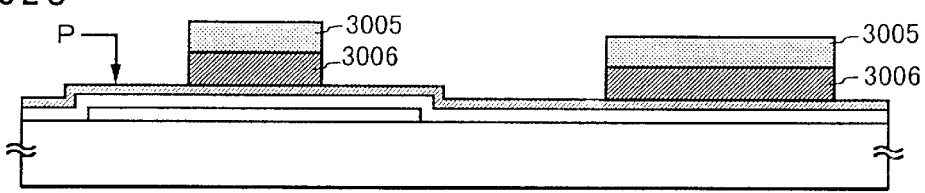
Figure 32D:
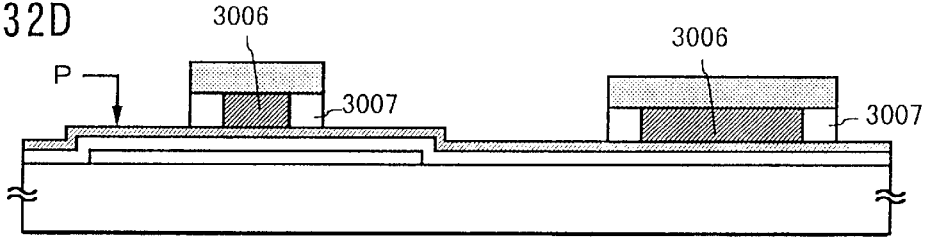

Next, remaining the resist mask 3005, in the anodic oxidation system, the probe P is contacted to the tantalum film 3003 to conduct the anodic oxidation. As the condition, 3% of oxalic acid aqueous solution (temperature 10° C.) is used for electrolytic solution, the ultimate voltage is 8 V, the voltage apply time is 40 minutes, and the supply current is 20 mA/substrate. In this anodic oxidation condition, a porous anodic oxidation film 3007 (hereinafter referred to as a porous A.O. film 3007) is formed on the side surface of the Al layer 3006. The A.O. film 3007 is a porous alumina film. (FIG. 32D)

After removing the resist mask 3005, a voltage is applied again to the Ta film 3003 in the anodic oxidation system to conduct the anodic oxidation. As the condition, ethylene glycol solution containing 3% of tartaric acid is used for electrolytic solution, the electrolytic solution temperature is 10° C., the ultimate voltage is 8 V, the voltage apply time is 30 minutes, and the supply current is 30 mA/substrate.

Figure 32E:
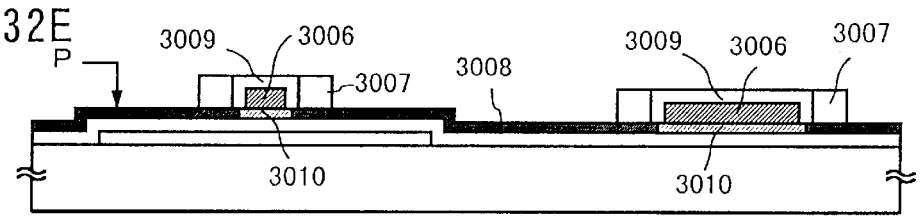

Tartaric acid permeates through the porous A.O. film 3007, the surface of the Al film 3006 is anodic oxidized, therefore a barrier type anodic oxidation film (referred to as a barrier A.O. film) 3009 is formed. The barrier A.O. film 3009 is a non-porous alumina film. Also, in the Ta film 3003, an exposed part and a part in which the porous A.O. film 3007 exists are anodic oxidized to be metamorphose into a tantalum oxide film (hereinafter referred to as a TaOx film) 3008. A remaining tantalum film (Ta film) 3010 is determined as a first wiring layer. It should be noted although the TaOx film 3008 film becomes thicker than the Ta film 3003, for the purpose of simplification, identical thickness is shown in FIG. 32. (FIG. 32E)

Figure 32F:
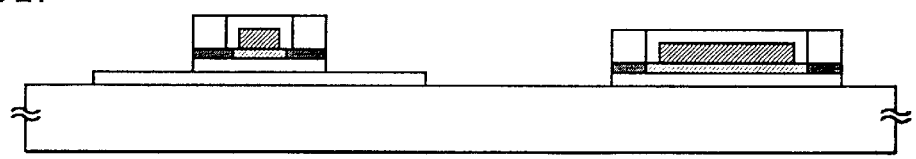

Then, the TaOx film 3008 and the gate insulating film 3002 are etched using the A.O. films 3007 and 3009 as a mask. The etching is carried out by a dry etching method using $CHF_3$ gas. (FIG. 32F)

Figure 33A:
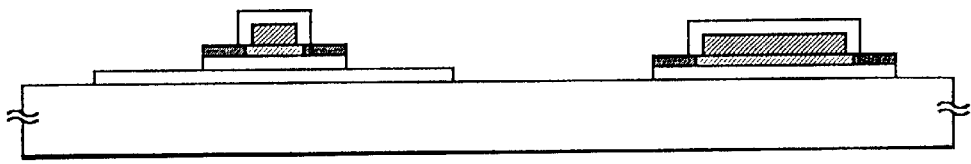
FIGS. 33A to 33D are views showing another manufacturing process of a liquid crystal display device of active matrix type using a system for polycrystallizing an amorphous silicon film in accordance with the present invention.

Then, the A.O. film 3007 is etched by aluminum mixed acid to be removed. With this process, a gate wiring which the Ta film 3010 and the Al film 3006 are laminated is completed. (FIG. 33A)

Further, the entire side surface of the gate wiring has a structure coated with the TaOx film 3008 and the barrier A.O. film 3009. The TaOx film 3008 extends more externally than the side surface of the barrier A.O. film 3009.

Then, an impurity ion having monoconductivity is added to the active layer 3001. To manufacture an N channel type TFT, phosphorus or arsenic is added, and to manufacture a P channel type TFT, boron or gallium is added. For the addition of these impurity ions, any one means of the ion implantation method, plasma doping method, and laser doping method may be employed. Further, in the case where a CMOS circuit is formed, the impurity ion may be divided by using a resist mask.

This process is carried out by applying two different acceleration voltages. At the first time, the acceleration voltage is set to a high level about 80 keV, and at the second time, the acceleration voltage is set to a low level about 30 keV. Accordingly, at the first time, the impurity ion is also added below the TaOx film 3008 and the insulating film 3002, and at the second time, the TaOx film 3008 and the insulating film 3002 serve as the mask and the impurity ion is not added below thereof.

Figure 33B:
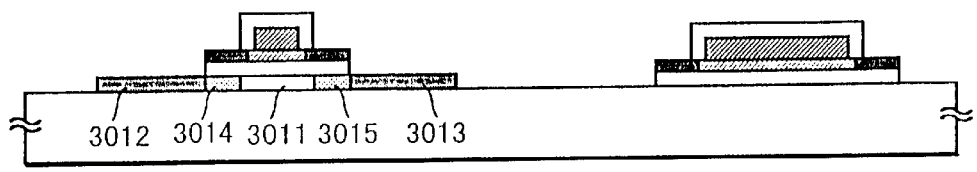

By such addition process of impurity ion, a channel formation region, a source region 3012, a drain region 3013, a lightly doped regions (LDD regions) 3014 and 3015 of TFT are formed in a self-aligning manner. A region 3011 is a region in which the impurity is not added, and the channel formation region and an offset region are formed. It should be noted the concentration of the impurity ion added to the respective impurity regions may be set appropriately by an applicant. (FIG. 33B)

After completion of the addition process of the impurity ion, the heat treatment is carried out by using furnace anneal, lamp anneal, or laser anneal, or combination thereof. It should be noted in the case where the tantalum layer is remained on the tantalum oxide 3008 film projecting from the side surface of the alumina film 3009, a voltage is applied to the lightly doped regions 3014 and 3015 by the gate wiring, and this is inconvenient. For this reason, after completion of the addition process, the remained tantalum film may be oxidized by heat oxidizing at the temperature about 400 to 600° C.

Then, an interlayer insulating film 3016 made of an oxide silicon film is formed in a film thickness of 1 $\mu$m. Subsequently, the interlayer film 3016 is patterned to form a contact hole. These contact holes 3017 to 3019 are formed as follows.

First, the interlayer film 3016 is etched by using an etchant which is called an LAL 500 manufactured by Hashimoto Chemical Co.,Ltd. The LAL 500 is the etchant which a surface-active agent of several % is added to a buffered hydrofluoric acid which is a mixture of ammonium fluoride, hydrofluoric acid, and water. Of course, other a buffered hydrofluoric acid may be applicable.

Here, the a buffered hydrofluoric acid which can etch an oxide silicon film with relatively high speed is preferable. Since the interlayer insulating film 3016 is thick having 1 $\mu$m in film thickness, faster etching rate results in enhancement of throughput.

At a time point that the interlayer insulating film 3016 is thus etched, the source region 3012 and the drain region 3013 are exposed in a TFT section, and the contact holes 3017 arid 3018 are completed. In a gate contact section, the barrier A.O. film 3009 is exposed. Then, etching is performed by using light a buffered hydrofluoric acid which mixed ammonium fluoride, hydrofluoric acid, and water at 2:3:150 (volume %).

In this a buffered hydrofluoric acid, a silicon film, that is the source region 3012 and the drain region 3018 is hardly etched. However, the barrier A.O. film 3009 of the gate contact section is etched, and the Al layer 3006 below thereof is also etched. Finally, at a time point that the etching reaches the Ta layer 3010, the etching stops, and the contact hole 3019 is formed. (FIG. 33C)

Figure 33C:
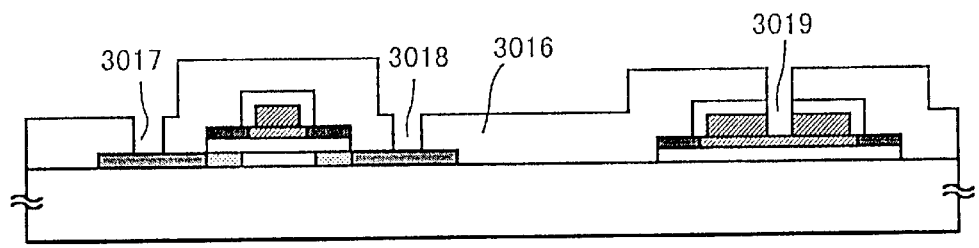
Figure 33D:
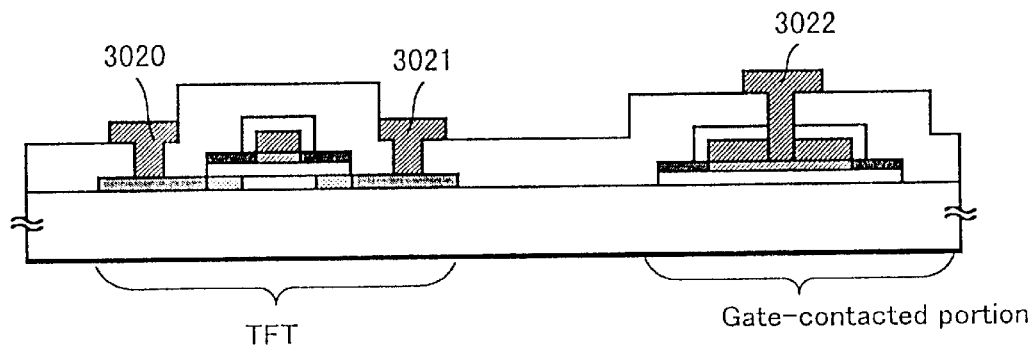

If the state as shown in FIG. 33C is thus obtained, a source wiring 3020 and a drain wiring 3021 made of a conductive film are formed, and a takeoff wiring 3022 which is made of the same material and electrically connected to the gate wiring is formed. (FIG. 33D)

As described above, a TFT is completed. In case of manufacturing an active matrix type liquid crystal display device, the processes of Embodiment 2 can be referred.

Embodiment 7

In this embodiment, at the crystallization of amorphous silicon film in Embodiment 2, two to four excimer laser of large output (products of Sopura Inc., type SAELC 15) are coupled in tiers to compose an excimer laser of still larger output. An amorphous silicon film is irradiated with the laser so as to be polycrystallized.

Embodiment 8

In this embodiment, a method will be described of polycrystallizing an amorphous silicon film in the case that laser light intensity distribution slightly varies at an end portion of an irradiated region by excimer laser of large output. Incidentally, the method of this embodiment may be applied to an initial semiconductor film.

Figure 34A:
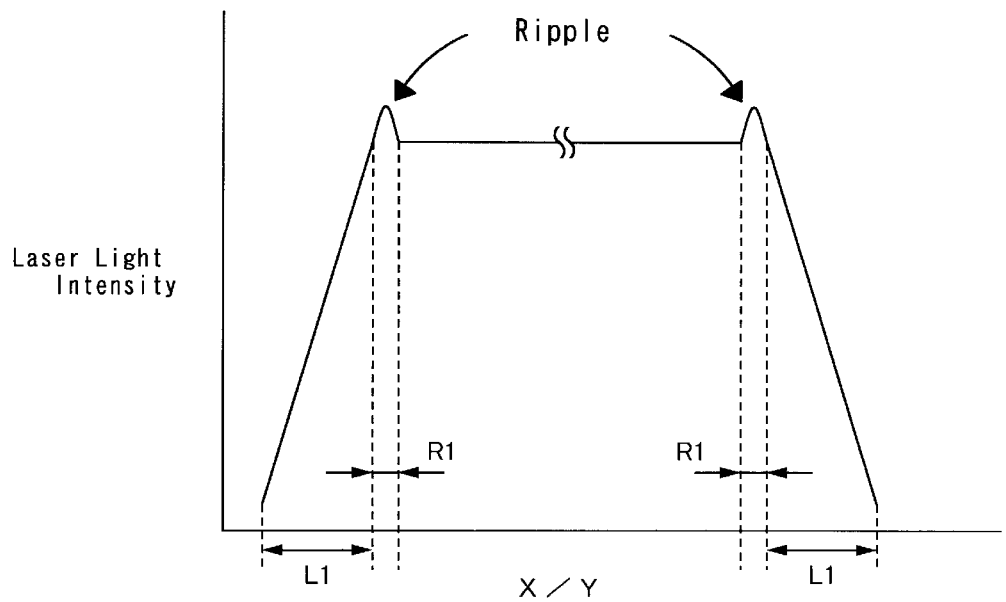
FIGS. 34A and 34B are views respectively showing laser light irradiation regions of an amorphous silicon film polycrystallized by laser light in accordance with the present invention, and laser light intensity.
Figure 34B:
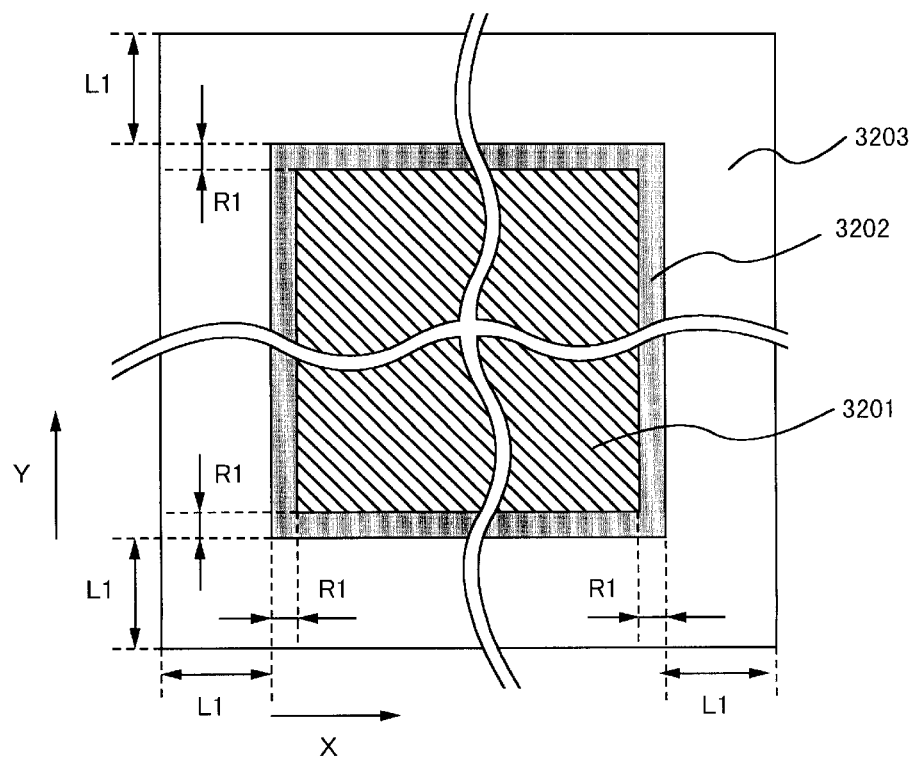

See FIGS. 34A and 34B. FIG. 34A is an intensity distribution graph of laser light intensity. In FIG. 34A, the axis of ordinates indicates laser light intensity and the axis of abscissas indicates the x-axis and the y-axis of the irradiated region with laser light. In a laser light as shown in FIG. 34A, a region denoted by L1 where laser light intensity is varied (referred here as an wing portion), a region where laser light intensity is constant and a region denoted by R1 where laser light intensity is locally high (referred here as a ripple portion) are mixedly existed. This laser light irradiation region seen from the above is shown in FIG. 34B. Reference numeral 3201 denotes a region to which a laser light having a constant intensity is irradiated; 3202, a region to which a laser light for the ripple portion is irradiated; and 3203, a region to which a laser light for the wing portion is irradiated.

When a laser light having such laser light intensity distribution, with which the L1 and R1 are increased is used, a circuit has to be designed carefully. That is, an amorphous silicon film situated in the region to which a laser light for the wing portion is irradiated has a possibility of not completely being polycrystallized, and an amorphous silicon film situated in the region to which a laser light for the ripple portion is irradiated has a possibility of being crystallized into fine crystal due to too high laser light intensity. Here, the term "fine crystal" designates polycrystal of small crystal grains. Therefore, in the case that, for example, L1 is 100 μm and R1 is 10 μm, film quality of a silicon film polycrystallized by being irradiated with laser lights for the wing portion and for the ripple portion differs from that of a silicon film polycrystallized by a laser light having a constant intensity. Thus a uniform film quality cannot be obtained. It is therefore desirable not to use for an active layer of a thin film transistor this silicon film polycrystallized by being irradiated with laser lights for the wing portion and for the ripple portion. However, sizes of the wing portion and ripple portion can be changed by adjusting an optical system of laser.

Embodiment 9

In this embodiment, description will be made of the case of using a laser light described in Embodiment 8, in which the ripple portion and the wing portion of the laser light are different from each other.

Figure 35A:
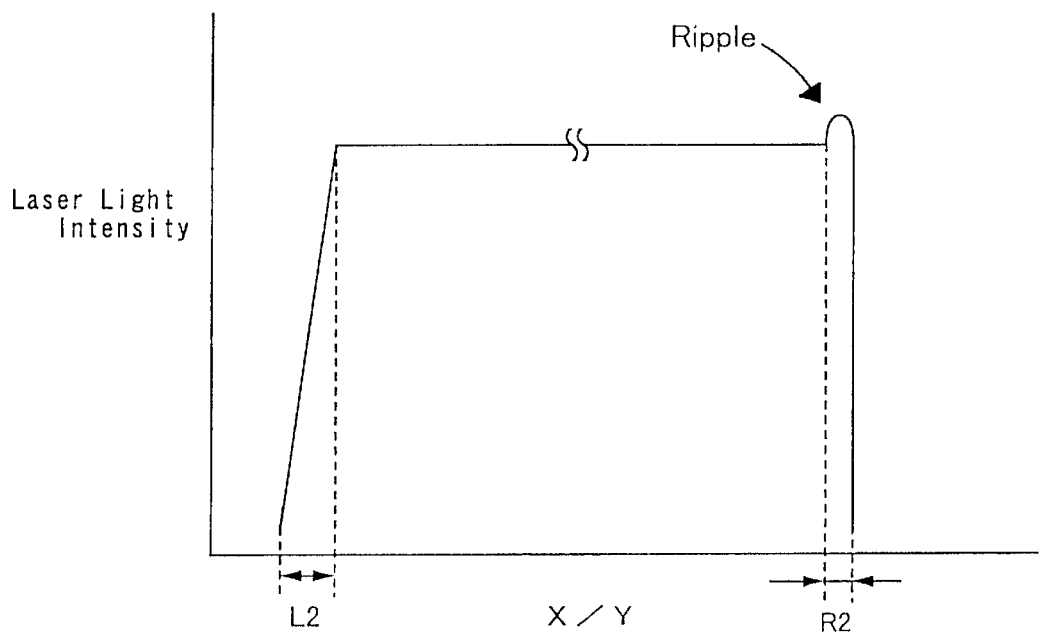
FIGS. 35A and 35B are views respectively showing laser light irradiation regions of an amorphous silicon film polycrystallized by laser light in accordance with the present invention, and laser light intensity.
Figure 35B:
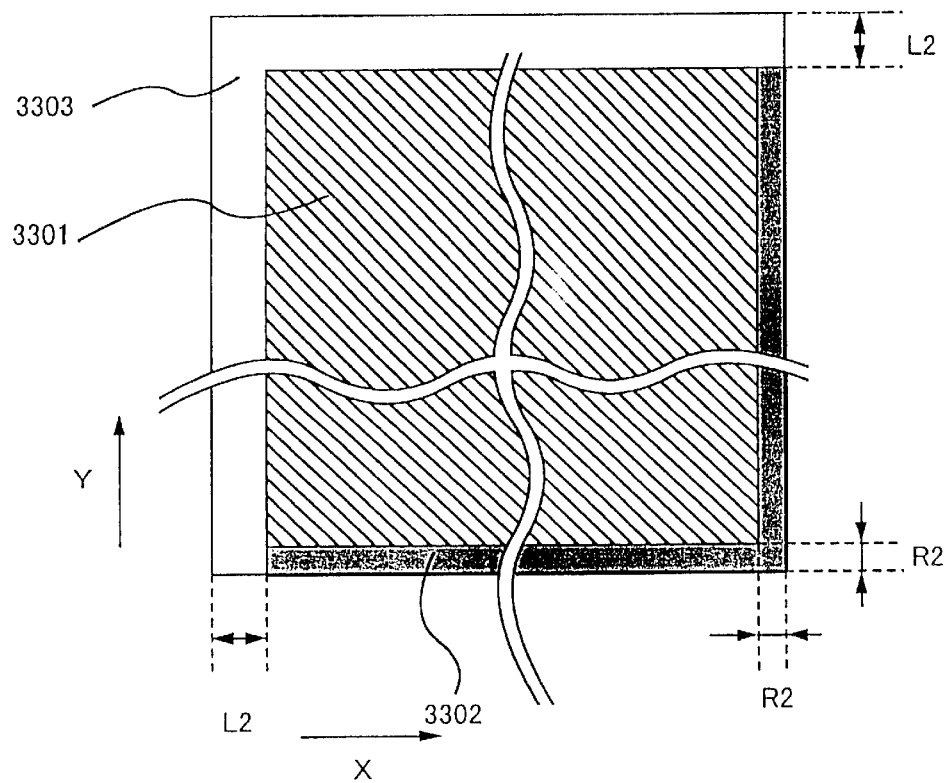

See FIGS. 35A and 35B. FIG. 35A is an intensity distribution graph of laser light intensity. In FIG. 35A, the axis of ordinates indicates laser light intensity and the axis of abscissas indicates the x-axis and the y-axis of the laser light irradiation region. In a laser light as shown in FIG. 35A, an wing portion denoted by L2, a region where laser light intensity is constant and a ripple portion denoted by R2 are mixedly existed. As illustrated in FIG. 35A, a laser light of this embodiment causes each of the wing portion and ripple portion to exist only on one side with respect to each of the x-axis and the y-axis. This laser light irradiation region seen from the above is shown in FIG. 35B. Reference numeral 3301 denotes a region to which a laser light having a constant intensity is irradiated; 3302, a region to which a laser light for the ripple portion is irradiated; and 3303, a region to which a laser light for the wing portion is irradiated. In this embodiment, L2 is set to about 50 μm and R2 is set to about 30 μm.

When the laser light having such intensity distribution is used for polycrystallization of an amorphous silicon film, fine crystallization of the silicon film takes place by the laser light for the ripple portion. It has been proved that the fine-crystallized silicon film can be polycrystallized by again irradiating thereon the laser light for the wing portion.

Figure 36:
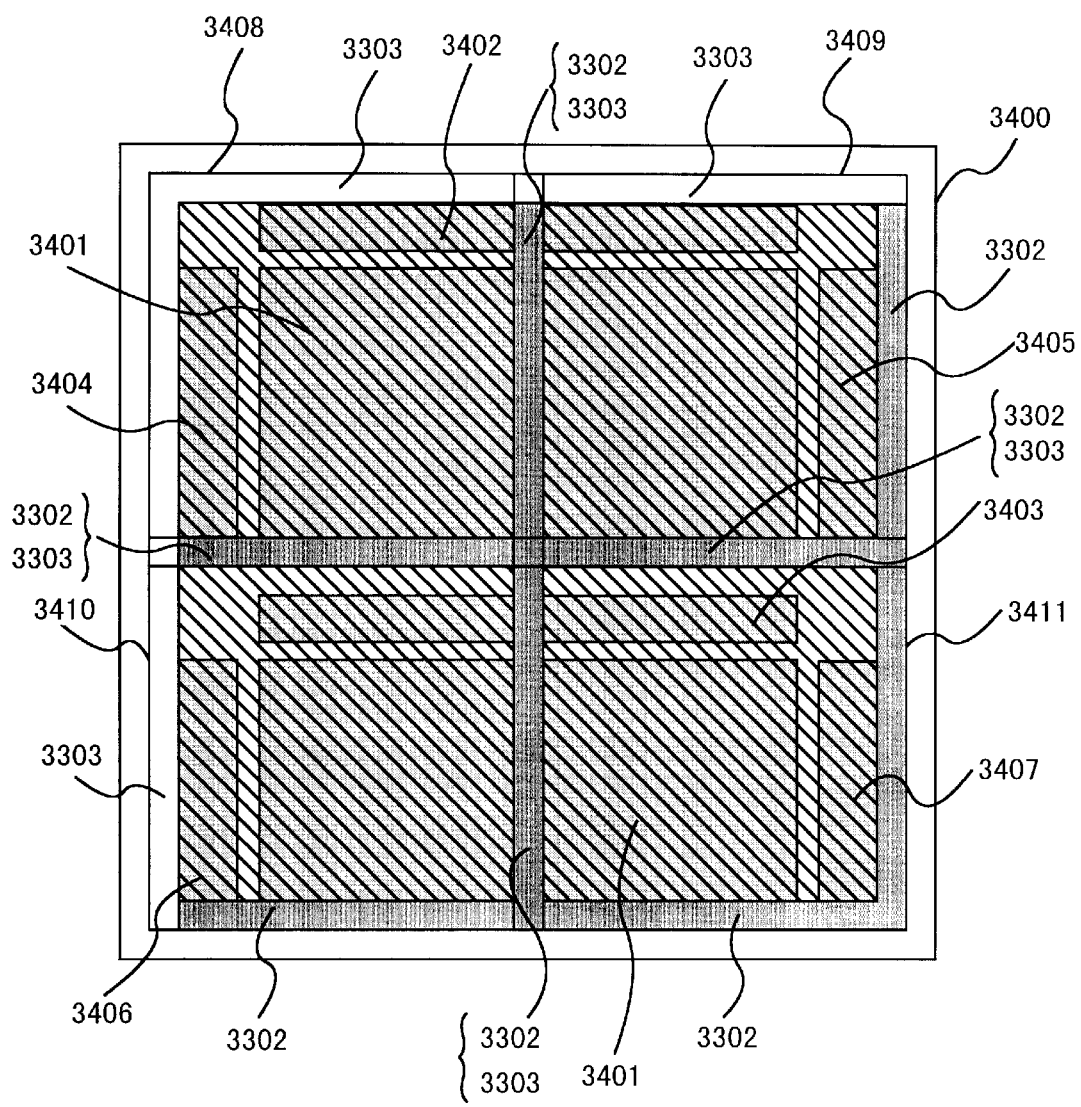
FIG. 36 is a view showing laser light irradiation regions of an amorphous silicon film polycrystallized by laser light in accordance with the present invention.

See FIG. 36. FIG. 36 illustrates a method of polycrystallizing an amorphous silicon film according to this embodiment. Reference numeral 3400 denotes a substrate; 3402 and 3403, source driver circuits; and 3404 to 3407, gate driver circuits. Reference numerals 3408 to 3411 denote laser light irradiation regions to which the laser light shown in FIG. 35A is irradiated. Among these laser light irradiation regions, regions to which the laser light for the wing portion is irradiated and regions to which the laser light for the ripple portion is irradiated are denoted by the same reference numerals as shown in FIGS. 35A and 35B. Incidentally, on an overlapped region between the regions to which the laser light for the wing portion is irradiated and the regions to which the laser light for the ripple portion is irradiated, the reference numerals of the both are put down.

As shown in FIG. 36, in a method of this embodiment, the position of the laser light is moved three times to polycrystallize substantially the entire substrate. Then, a silicon film fine-crystallized by irradiation of laser light for the ripple portion is polycrystallized by being irradiated with the laser light, of the moving laser light, for the wing portion.

Thus, the silicon film fine-crystallized by irradiation of laser light for the ripple portion is polycrystallized by being irradiated with the laser light, of the moving laser light, for the wing portion, so that the polycrystallized semiconductor film may be used as an active layer of a thin film transistor. Incidentally, sizes of the wing portion and ripple portion can be changed by adjusting an optical system of laser.

Embodiment 10

The CMOS circuit or the pixel matrix circuit which have been formed by implementing the present invention may be employed for various electro-optical devices such as an active matrix type liquid crystal display device, an active matrix type EL (Electroluminescence) display, or an active matrix type EC (Electrochromic) display. In other words, the present invention can be applied to all the electronic devices in which such electro-optical devices are incorporated as the display media.

As such electric devices, a video camera, a digital camera, a projector (rear-type projector or front-type projector), a head-mount display (goggle-type display), a navigation system for vehicle, a personal computer, and a portable information terminal (a mobile computer, a cellular phone, or an electronic book) may be enumerated. Examples of those are shown in FIGS. 37A to 38D.

Figure 37A:
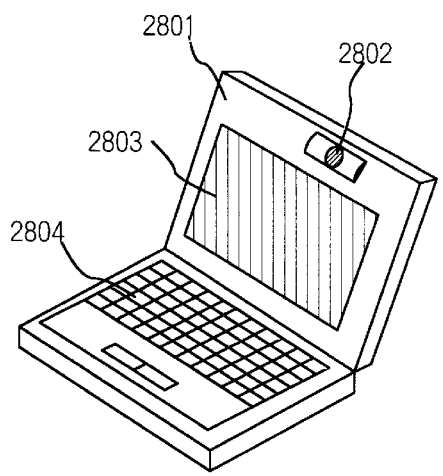
FIGS. 37A to 37F are views each showing an example of a semiconductor device manufactured by using a system for polycrystallizing an amorphous silicon film in accordance with the present invention.

FIG. 37A shows a personal computer comprising a main body 2801, an image inputting unit 2802, a display device 2803, and a key board 2804. The present invention is applicable to the image inputting unit 2802, the display device 2803, and other signal control circuits.

Figure 37B:
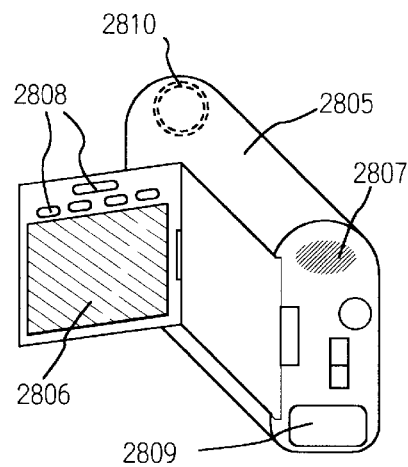

FIG. 37B shows a video camera comprising a main body 2805, a display device 2806, a voice input unit 2807, an operation switch 2808, a battery 2809, and an image receiving unit 2810. The present invention is applicable to the display device 2806, the voice input unit 2807, and other signal control circuits.

Figure 37C:
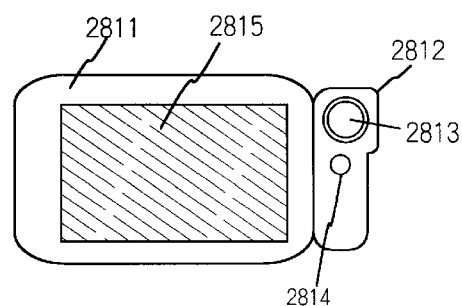

FIG. 37C shows a mobile computer comprising a main body 2811, a camera unit 2812, an image receiving unit 2813, an operation switch 2814, and a display device 2815. The present invention is applicable to the display device 2815 and other signal control circuits.

Figure 37D:
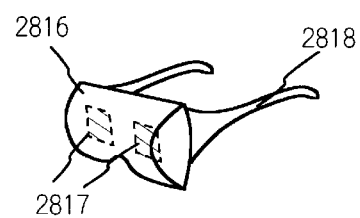

FIG. 37D shows a goggle-type display comprising a main body 2816, a display device 2817 and an arm portion 2818. The present invention is applicable to the display device 2817 and other signal control circuits.

Figure 37E:
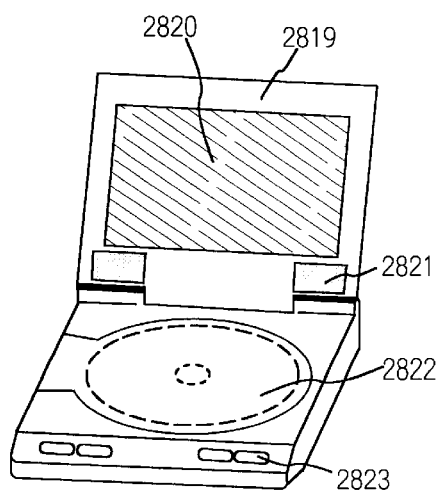

FIG. 37E shows a player that employs a recording medium on which programs are recorded (hereinafter referred to as recording medium), and comprises a main body 2819, a display device 2820, a speaker unit 2821, a recording medium 2822, and an operation switch 2823. Incidentally, this player has an function to enjoy music or movies and to conduct an Internet employing as the recording medium DVD (digital versatile disc), CD and the like. The present invention is applicable to the display device 2820 and other signal control circuits.

Figure 37F:
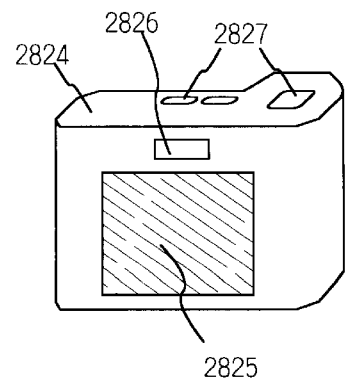

FIG. 37F shows a digital camera comprising a main body 2824, a display device 2825, an eye piece section 2826, an operation switch 2827, and an image receiving unit (not shown). The present invention is applicable to the display device 2825 and other signal control circuits.

Figure 38A:
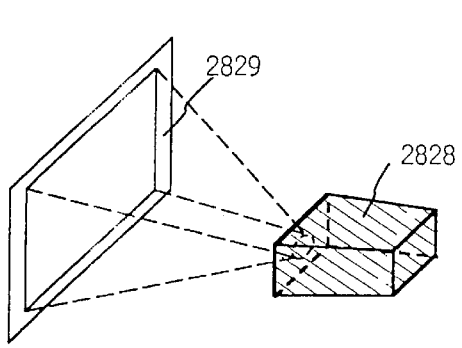
FIGS. 38A to 38D are views each showing an example of a semiconductor device manufactured by using a system for polycrystallizing an amorphous silicon film in accordance with the present invention.

FIG. 38A shows a front-type projector comprising a light source optical system and display device 2828 and a screen 2829. The present invention is applicable to the display device, and other signal control circuits.

Figure 38B:
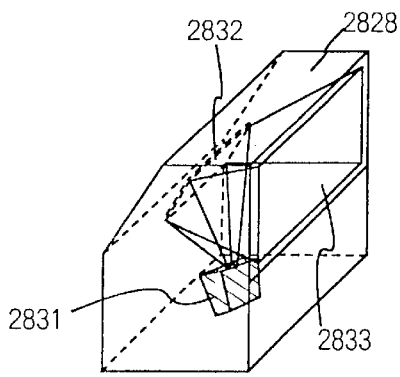

FIG. 38B shows a rear-type projector comprising a main body 2828, a light source optical system and display device 2831, a mirror 2832, and a screen 2833. The present invention is applicable to the display device and other signal control circuits.

Figure 38C:
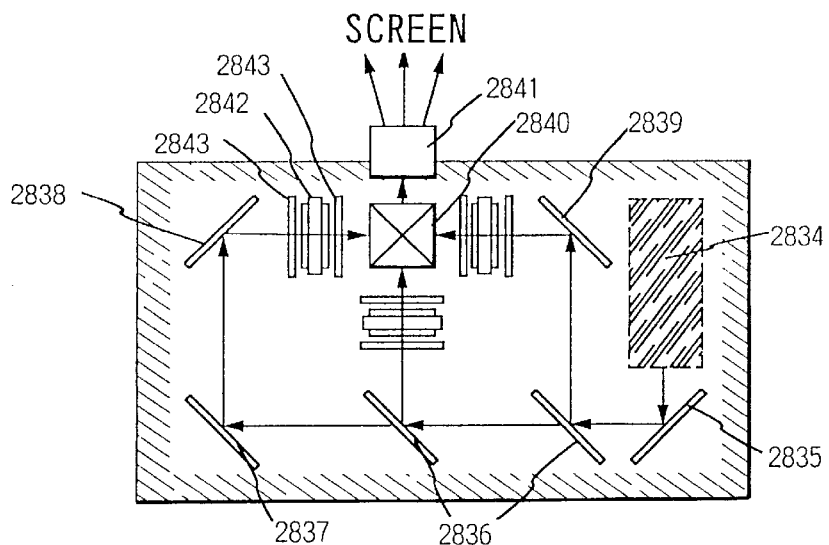

FIG. 38C is a diagram showing an example of the structure of the light source optical system and display devices 2828 and 2831 in FIGS. 38A and 38B. The light source optical system and display device 2828 or 2831 comprises a light source optical system 2834, mirrors 2835 and 2837 to 2839, dichroic mirrors 2836, an optical system 2840, display devices 2842, phase difference plates 2843, and a projection optical system 2841. The projection optical system 2841 consists of a plurality of optical lenses provided with a projection lens. The present embodiment shows an example of "three plate type" where three display devices 2842 are used, but not particularly limited thereto. For instance, "a single plate type" may be employed. Further, an implementor may appropriately provide an optical lens, a film having a polarization function, a film for adjusting a phase difference, an IR film, etc. in the light path indicated by an arrow in FIG. 38C.

Figure 38D:
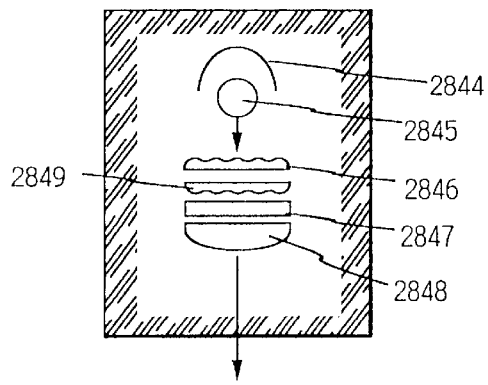
Figure 39:
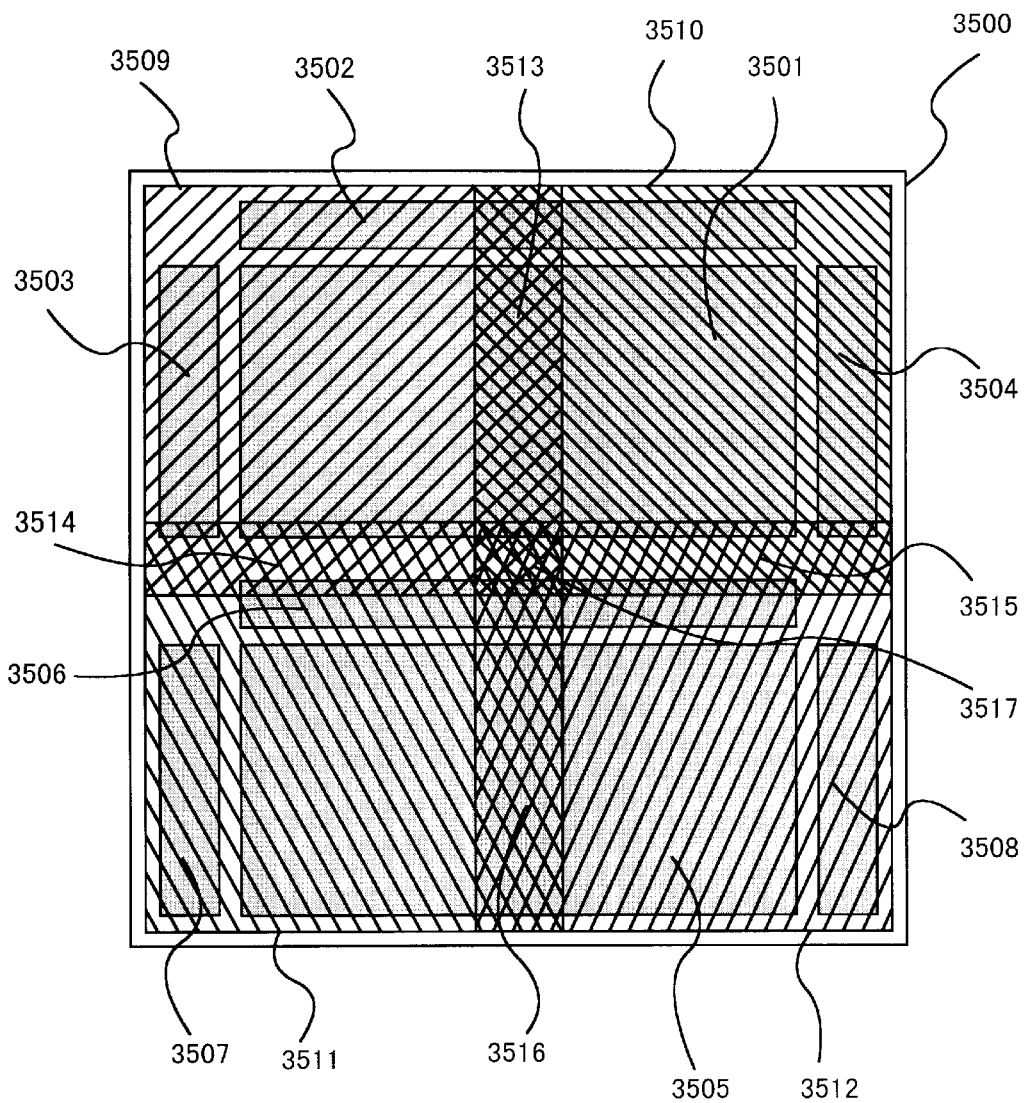
FIG. 39 is a view showing laser light irradiation regions of an amorphous silicon film polycrystallized by laser light of large output in accordance with a conventional art.

FIG. 38D is a diagram showing an example of the structure of the light source optical system 2834 in FIG. 38C. In the present embodiment, the light source optical system 2834 comprises a reflector 2844, a light source 2845, lens arrays 2846 and 2849, a polarization conversion element 2847, and a condenser lens 2848. The light source optical system shown in FIG. 38D is an example thereof, therefore not particularly limited thereto. For instance, an implementor may appropriately provide an optical lens, a film having a polarization function, a film for adjusting a phase difference, and an IR film in the light source optical system.

As described above, the present invention has wide application range so that it is applicable to electronic devices in any fields. In addition, the electronic devices according to the present embodiment can be realized by employing a structure consisting of any combination of Embodiments 1 to 9.

According to a method of polycrystallizing an amorphous silicon film of the present invention, a region irradiated with laser light of large output is controlled with high accuracy. In addition, a circuit is designed so that a region not irradiated with laser light or a region to which laser light is repeatedly irradiated does not form an active layer of a thin film into transistor. These arrangements make it possible to manufacture a thin film transistor using as an active layer a polycrystalline semiconductor film of uniform characteristic.

A method of the present invention may also be used in crystallizing an initial semiconductor film and in improving crystallinity to manufacture a thin film transistor using as an active layer a polycrystalline semiconductor film of uniform characteristic.

What is claimed is:

1. A method of manufacturing a thin film transistor comprising:

forming a semiconductor film over a substrate;

irradiating one shot or plural shots of laser light of 5 J or more in total energy and 100 nsec or more in pulse width onto a first part of said semiconductor film to form a first highly crystallized semiconductor film;

irradiating one shot or plural shots of said laser light onto a second part of said semiconductor film which is apart from said first part of said semiconductor film to form the crystallized semiconductor film while shifting relative positions of said semiconductor film and the laser light to each other; and forming a thin film transistor having as an active layer said highly crystallized semiconductor films, wherein said active layer is not formed in said semiconductor film to which said laser light is not irradiated.

2. A method according to claim 1 wherein said semiconductor film comprises a silicon film or a silicon germanium film.

3. A method according to claim 1 wherein a gap between said highly crystallized semiconductor films is about 10 μm or less.

4. A method according to claim 1 wherein a gap between said first part and said second part of said semiconductor film is about 10 μm or less.

5. A method according to claim 1 wherein only said highly crystallized semiconductor film is used as the active layer.

6. A method according to claim 1 wherein said pulse width of the laser light is 200 nsec or more.

7. A method according to claim 1 wherein said thin film transistor constitutes an electro-optical device selected from the group consisting of a liquid crystal display device, an electroluminescence display device and an electrochromic display device.

8. A method according to claim 7 wherein said electro-optical device constitutes an electronic device selected from the group consisting of a personal computer, a video camera, a mobile computer, a goggle-type display, a player that employs a recording medium, a front-type projector and a rear-type projector.

9. A method of manufacturing a thin film transistor comprising:

forming an initial semiconductor film over a substrate;

irradiating one shot or plural shots of laser light of 5 J or more in total energy and 100 nsec or more in pulse width onto a first part of said initial semiconductor film to form a highly crystallized semiconductor film;

irradiating one shot or plural shots of said laser light onto a second part of said initial semiconductor film which is apart from said first part of said initial semiconductor film to form the crystallized semiconductor film while shifting relative positions of said initial semiconductor film and the laser light to each other; and forming a thin film transistor having as an active layer said highly crystallized semiconductor film, wherein said active layer is not formed in said initial semiconductor film to which said laser light is not irradiated.

10. A method according to claim 9 wherein said initial semiconductor film comprises a silicon film or a silicon germanium film.

11. A method according to claim 9 wherein a gap between said highly crystallized semiconductor films is about 10 μm or less.

12. A method according to claim 9 wherein a gap between said first part and second part of said initial semiconductor film is about 10 μm or less.

13. A method according to claim 9 wherein only said highly crystallized semiconductor film is used as the active layer.

14. A method according to claim 9 wherein said pulse width of the laser light is 200 nsec or more.

15. A method according to claim 9 wherein said thin film transistor constitutes an electro-optical device selected from the group consisting of a liquid crystal display device, an electroluminescence display device and an electrochromic display device.

16. A method according to claim 15 wherein said electro-optical device constitutes an electronic device selected from the group consisting of a personal computer, a video camera, a mobile computer, a goggle-type display, a player that employs a recording medium, a front-type projector and a rear-type projector.

17. A method of manufacturing a thin film transistor comprising the steps of:

forming a semiconductor film over a substrate;

irradiating one shot or plural shots of laser light of 5 J or more in total energy and 100 nsec or more in pulse width onto a part of said semiconductor film to form a highly crystallized semiconductor film;

performing repeatedly the irradiating step duplicately onto said part of said semiconductor film while shifting relative positions of said semiconductor film and the laser light to each other, and irradiating the laser light; and forming a thin film transistor having as an active layer said highly crystallized semiconductor film, wherein said active layer is not formed in said semiconductor film to which said laser light is irradiated duplicately.

18. A method according to claim 17 wherein said semiconductor film comprises a silicon film or a silicon germanium film.

19. A method according to claim 17 wherein only said highly crystallized semiconductor film is used as the active layer.

20. A method according to claim 17 wherein said pulse width of the laser light is 200 nsec or more.

21. A method according to claim 17 wherein said thin film transistor constitutes an electro-optical device selected from the group consisting of a liquid crystal display device, an electroluminescence display device and an electrochromic display device.

22. A method according to claim 21 wherein said electro-optical device constitutes an electronic device selected from the group consisting of a personal computer, a video camera, a mobile computer, a goggle-type display, a player that employs a recording medium, a front-type projector and a rear-type projector.

23. A method of manufacturing a thin film transistor comprising the steps of:

forming an initial semiconductor film over a substrate;

irradiating one shot or plural shots of laser light of 5 J or more in total energy and 100 nsec or more in pulse width onto a part of said initial semiconductor film to form a highly crystallized semiconductor film;

performing repeatedly the irradiating step duplicately onto said part of said initial semiconductor film while shifting relative positions of said initial semiconductor film and the laser light to each other; and forming a thin film transistor having as an active layer said highly crystallized semiconductor film, wherein said active layer is not formed in said initial semiconductor film to which said laser light is irradiated duplicately.

24. A method according to claim 23 wherein said initial semiconductor film comprises a silicon film or a silicon germanium film.

25. A method according to claim 23 wherein only said highly crystallized semiconductor film is used as the active layer.

26. A method according to claim 23 wherein said pulse width of the laser light is 200 nsec or more.

27. A method according to claim 23 wherein said thin film transistor constitutes an electro-optical device selected from the group consisting of a liquid crystal display device, an electroluminescence display device and an electrochromic display device.

28. A method according to claim 27 wherein said electro-optical device constitutes an electronic device selected from the group consisting of a personal computer, a video camera, a mobile computer, a goggle-type display, a player that employs a recording medium, a front-type projector and a rear-type projector.

29. A method of manufacturing a thin film transistor comprising:

forming an amorphous semiconductor film over a substrate;

irradiating one shot or plural shots of laser light of 5 J or more in total energy and 100 nsec or more in pulse width onto a part of said amorphous semiconductor film;

performing repeatedly the irradiating step onto a region not overlapping with said part of said amorphous semiconductor film while shifting relative positions of said amorphous semiconductor film and the laser light to each other, to thereby form a polycrystalline semiconductor film; and forming a thin film transistor having as an active layer said polycrystalline semiconductor film, wherein said active layer is not formed in said amorphous semiconductor film to which said laser light is not irradiated.

30. A method according to claim 29 wherein said amorphous semiconductor film comprises an amorphous silicon film or an amorphous silicon germanium film.

31. A method according to claim 29 wherein a gap between said polycrystalline semiconductor films is about 10 μm or less.

32. A method according to claim 29 wherein a gap between said part of said amorphous semiconductor film and said region not overlapping with said part is about 10 μm or less.

33. A method according to claim 29 wherein said pulse width of the laser light is 200 nsec or more.

34. A method according to claim 29 wherein among said amorphous semiconductor films, only the polycrystallized region is used as the active layer.

35. A method according to claim 29 wherein said thin film transistor constitutes an electro-optical device selected from the group consisting of a liquid crystal display device, an electroluminescence display device and an electrochromic display device.

36. A method according to claim 35 wherein said electro-optical device constitutes an electronic device selected from the group consisting of a personal computer, a video camera, a mobile computer, a goggle-type display, a player that employs a recording medium, a front-type projector and a rear-type projector.

37. A method of manufacturing a thin film transistor comprising:

forming an amorphous semiconductor film over a substrate;

irradiating one shot or plural shots of laser light of 5 J or more in total energy and 100 nsec or more in pulse width onto a part of said amorphous semiconductor film;

performing repeatedly the irradiating step onto a region overlapping with said part of said amorphous semiconductor film, while shifting relative positions of said amorphous semiconductor film and the laser light to each other, to thereby polycrystallize substantially the entire region of said amorphous semiconductor film; and forming a thin film transistor having as an active layer said polycrystalline semiconductor film, wherein said active layer is not formed in said amorphous semiconductor film to which said laser light is irradiated duplicately.

38. A method according to claim 37 wherein said amorphous semiconductor film comprises an amorphous silicon film or an amorphous silicon germanium film.

39. A method according to claim 37 wherein said pulse width of the laser light is 200 nsec or more.

40. A method according to claim 37 wherein the length of the region that overlaps with said part of said amorphous semiconductor film is about 10 μm or less.

41. A method according to claim 37 wherein among said polycrystallized silicon film, only a region excluding said part of said amorphous silicon film is used as the active layer.

42. A method according to claim 37 wherein said thin film transistor constitutes an electro-optical device selected from the group consisting of a liquid crystal display device, an electroluminescence display device and an electrochromic display device.

43. A method according to claim 42 wherein said electro-optical device constitutes an electronic device selected from the group consisting of a personal computer, a video camera, a mobile computer, a goggle-type display, a player that employs a recording medium, a front-type projector and a rear-type projector.

44. A method of manufacturing a thin film transistor comprising the steps of:

forming an amorphous silicon film over a substrate;

first irradiating a single shot of laser light with a total energy of 5 J or more onto a first region of said amorphous silicon film to form a first polycrystallized amorphous silicon film;

second irradiating a single shot of laser light with a total energy of 5 J or more onto a second region of said amorphous silicon film to form a second polycrystallized amorphous silicon film;

forming thin film transistors having as active layers said first and second polycrystallized amorphous silicon films, wherein a third region of said amorphous silicon film is formed between said first and second regions after said first and second irradiating, and wherein said active layer is not formed in said third region.

45. A method according to claim 44 wherein a gap between said first and second polycrystallized amorphous silicon films is about 10 μm or less.

46. A method according to claim 44 wherein a pulse width of said laser light is 200 nsec or more.

47. A method according to claim 44 wherein said thin film transistor constitutes an electro-optical device selected from the group consisting of a liquid crystal display device, an electroluminescence display device and an electrochromic display device.

48. A method according to claim 47 wherein said electro-optical device constitutes an electronic device selected from the group consisting of a personal computer, a video camera, a mobile computer, a goggle-type display, a player that employs a recording medium, a front-type projector and a rear-type projector.

49. A method of manufacturing a thin film transistor comprising the steps of:

forming a semiconductor film over a substrate;

first irradiating one shot or plural shots of laser light onto a first region of said semiconductor film to form a first highly crystallized semiconductor film;

second irradiating one shot or plural shots of said laser light onto a second region of said semiconductor film to form a second highly crystallized semiconductor film; and forming at least one thin film transistor having an active layer consist of said first or second highly crystallized semiconductor film;

wherein said first region is different from said second region, wherein said laser light has total energy at 5 J or more and pulse width at 100 nsec or more, and wherein said active layer is not formed between said first region and said second region.

50. A method according to claim 49 wherein said semiconductor film comprises a silicon film or a silicon germanium film.

51. A method according to claim 49 wherein a gap between said first and second highly crystallized semiconductor films is about 10 μm or less.

52. A method according to claim 49 wherein a gap between said first and second regions is about 10 μm or less.

53. A method according to claim 49 wherein said pulse width of the laser light is 200 nsec or more.

54. A method according to claim 49 wherein said thin film transistor constitutes an electro-optical device selected from the group consisting of a liquid crystal display device, an electroluminescence display device and an electrochromic display device.

55. A method according to claim 54 wherein said electro-optical device constitutes an electric device selected from the group consisting of a personal computer, a video camera, a mobile computer, a goggle-type display, a player that employs a recording medium, a front-type projector and a rear-type projector.

56. A method of manufacturing a thin film transistor comprising the steps of:

forming a semiconductor film over a substrate;

first irradiating one shot or plural shots of laser light onto a first region of said semiconductor film to form a first highly crystallized semiconductor film;

second irradiating one shot or plural shots of said laser light onto a second region of said semiconductor to form a second highly crystallized semiconductor film, said second region overlapping with a part of said first region of said semiconductor film; and forming at least one thin film transistor having an active layer consist of said first or second highly crystallized semiconductor film, wherein said laser light has total energy at 5 J or more and pulse width at 100 nsec or more, wherein said active layer is not formed in a region where said first region and said second region partly overlap.

57. A method according to claim 56 wherein said semiconductor film comprises a silicon film or a silicon germanium film.

58. A method according to claim 56 wherein said pulse width of the laser light is 200 nsec or more.

59. A method according to claim 56 wherein said thin film transistor constitutes an electro-optical device selected from the group consisting of a liquid crystal display device, an electroluminescence display device and an electrochromic display device.

60. A method according to claim 59 wherein said electro-optical device constitutes an electronic device selected from the group consisting of a personal computer, a video camera, a mobile computer, a goggle-type display, a player that employs a recording medium, a front-type projector and a rear-type projector.

* * * * *